(12) United States Patent
Shibahara et al.

(10) Patent No.: US 10,761,139 B2
(45) Date of Patent: *Sep. 1, 2020

(54) SEMICONDUCTOR APPARATUS AND DIAGNOSTIC TEST METHOD

(71) Applicant: Renesas Electronics Corporation, Tokyo (JP)

(72) Inventors: Shinichi Shibahara, Tokyo (JP); Daisuke Kawakami, Tokyo (JP); Yutaka Igaku, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 19 days.

This patent is subject to a terminal disclaimer.

(21) Appl. No.: 16/180,111

(22) Filed: Nov. 5, 2018

(65) Prior Publication Data

US 2019/0072611 A1 Mar. 7, 2019

Related U.S. Application Data

(63) Continuation of application No. 15/093,988, filed on Apr. 8, 2016, now Pat. No. 10,151,796.

(30) Foreign Application Priority Data

May 27, 2015 (JP) .................................. 2015-107472

(51) Int. Cl.
*G06F 11/00* (2006.01)
*G01R 31/3177* (2006.01)
(Continued)

(52) U.S. Cl.
CPC ... *G01R 31/3177* (2013.01); *G01R 31/31724* (2013.01); *G06F 11/27* (2013.01)

(58) Field of Classification Search
CPC ...... G06F 11/00; G06F 11/22; G06F 11/1441; G06F 11/1068; G06F 11/1666; G06F 11/1417; G06F 11/1438; G06F 11/2284
(Continued)

(56) References Cited

U.S. PATENT DOCUMENTS 6,934,884 B1 * 8/2005 Wakabayashi .............................. G01R 31/318335
714/30
7,118,285 B2 * 10/2006 Fenwick .............. G02B 6/3885
385/57
(Continued)

FOREIGN PATENT DOCUMENTS

JP 2010-128627 A 6/2010
JP 2010-140219 A 6/2010

OTHER PUBLICATIONS

Office Action dated Nov. 13, 2018, in European Patent Application No. 16170216.2.
(Continued)

*Primary Examiner* — Sarai E Butler
(74) *Attorney, Agent, or Firm* — SGPatents PLLC

(57) ABSTRACT

A semiconductor apparatus includes a storage circuit, a processing circuit that performs processing using data stored in the storage circuit and writes data into the storage circuit as the processing is performed, a scan test circuit that executes a scan test on the processing circuit when the processing circuit does not perform processing, and an inhibit circuit that inhibits writing of data from the processing circuit to the storage circuit when the scan test on the processing circuit is executed.

20 Claims, 28 Drawing Sheets

(51) Int. Cl.
*G01R 31/317* (2006.01)
*G06F 11/27* (2006.01)

(58) Field of Classification Search
USPC .......................................................... 714/25
See application file for complete search history.

(56) References Cited

U.S. PATENT DOCUMENTS

| | | | |
|---|---|---|---|
| 7,200,761 B1* | 4/2007 | Freeman | G06F 11/2284 |
| | | | 709/223 |
| 2003/0197520 A1* | 10/2003 | Rearick | G01R 31/31715 |
| | | | 324/750.3 |
| 2003/0204805 A1* | 10/2003 | Prabhu | G06F 11/2236 |
| | | | 714/756 |
| 2005/0138481 A1* | 6/2005 | Taniguchi | G06F 21/85 |
| | | | 714/38.1 |
| 2005/0204239 A1* | 9/2005 | Miyaji | G11C 29/12 |
| | | | 714/738 |
| 2009/0006915 A1* | 1/2009 | Gomez | G01R 31/318533 |
| | | | 714/727 |
| 2010/0088446 A1 | 4/2010 | Greb et al. | |
| 2010/0262879 A1 | 10/2010 | Floyd et al. | |
| 2011/0176530 A1 | 7/2011 | Vikberg et al. | |
| 2012/0110396 A1 | 5/2012 | Jaubert et al. | |
| 2012/0120006 A1 | 5/2012 | Liu | |
| 2012/0226942 A1 | 9/2012 | Gangasani et al. | |
| 2013/0311843 A1* | 11/2013 | Tekumalla | G01R 31/318555 |
| | | | 714/729 |

OTHER PUBLICATIONS

Extended European search report for European Patent Application No. 16170216.2, dated Dec. 7, 2016.
Office Action dated Aug. 14, 2018, in Japanese Patent Application No. 2015-107472.

* cited by examiner

SEMICONDUCTOR APPARATUS AND DIAGNOSTIC TEST METHOD

CROSS-REFERENCE TO RELATED APPLICATIONS

This application is based upon and claims the benefit of priority from Japanese patent application No. 2015-107472, filed on May 27, 2015, the disclosure of which is incorporated herein in its entirety by reference.

BACKGROUND

The present invention relates to a semiconductor apparatus and a diagnostic test method and, for example, relates to a technique for executing a diagnostic test of a processing circuit that accesses a storage circuit.

In a semiconductor apparatus that supports the functional safety, a mechanism for making a diagnosis whether a circuit is operating correctly or not at regular intervals is required. In the case where a circuit to be diagnosed is a CPU (Central Processing Unit) in a small logic scale, whether the CPU is operating correctly can be diagnosed by implementing lockstep. The lockstep is a mechanism that mounts a plurality of the same CPUs on a semiconductor apparatus and determines whether all of the CPUs operate in the same way, and thereby diagnoses whether the circuit is operating correctly. Thus, in the case where a circuit to be diagnosed is a CPU in a large logic scale, the number of CPUs mounted increases, which raises a problem that the lockstep cannot be implemented due to the constraints on the circuit area.

Besides the lockstep, another mechanism for making a diagnosis whether a circuit is operating correctly or not is a self-test by software. However, the self-test by software has a problem that development costs of software are generally high. Therefore, as disclosed in Japanese Unexamined Patent Publication No. 2010-140219, BIST (Built In Self Test) is employed as a mechanism for making a diagnosis whether a circuit is operating correctly or not.

However, there is a problem that, in the case where a scan test like BIST is executed, data stored in a storage circuit to which a test target processing circuit accesses is overwritten. For example, after executing the scan test, it is necessary to reset the test target processing circuit in order to resume the operation of the circuit and, in some cases, the processing circuit initializes the data stored in the storage circuit due to this reset. Further, in some cases, when the scan test is executed, unintended writing of data is done from the test target processing circuit to the storage circuit, for example. Particularly, in the case where the storage circuit is a cache memory, if the data is initialized, cache errors occur frequently when the processing circuit resumes processing after the scan test is executed, which can cause the degradation of performance.

SUMMARY

As described above, there is a problem that, when a scan test is executed, data stored in a storage circuit to which a test target processing circuit to accesses is overwritten.

The other problems and novel features of the present invention will become apparent from the description of the specification and the accompanying drawings.

According to one embodiment, a semiconductor apparatus performs processing using data stored in a storage circuit and, when a scan test on a processing circuit that writes data into the storage circuit as the processing is performed is executed, inhibits writing of data from the processing circuit to the storage circuit.

According to the embodiment described above, even when a scan test is executed, it is possible to prevent overwriting of data stored in a storage circuit to which a test target processing circuit to accesses.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Preferred embodiments of the present invention will be described hereinafter with reference to the drawings. A preferred embodiment of the present invention will be described hereinafter with reference to the drawings. It should be noted that specific numerical values and the like in the following embodiments are given merely for illustrative purposes, and values are not limited thereto unless particularly noted. Further, in the following description and drawings, things that are obvious to those skilled in the art and the like are appropriately omitted, shortened and simplified to clarify the explanation.

First Embodiment

Figure 1:
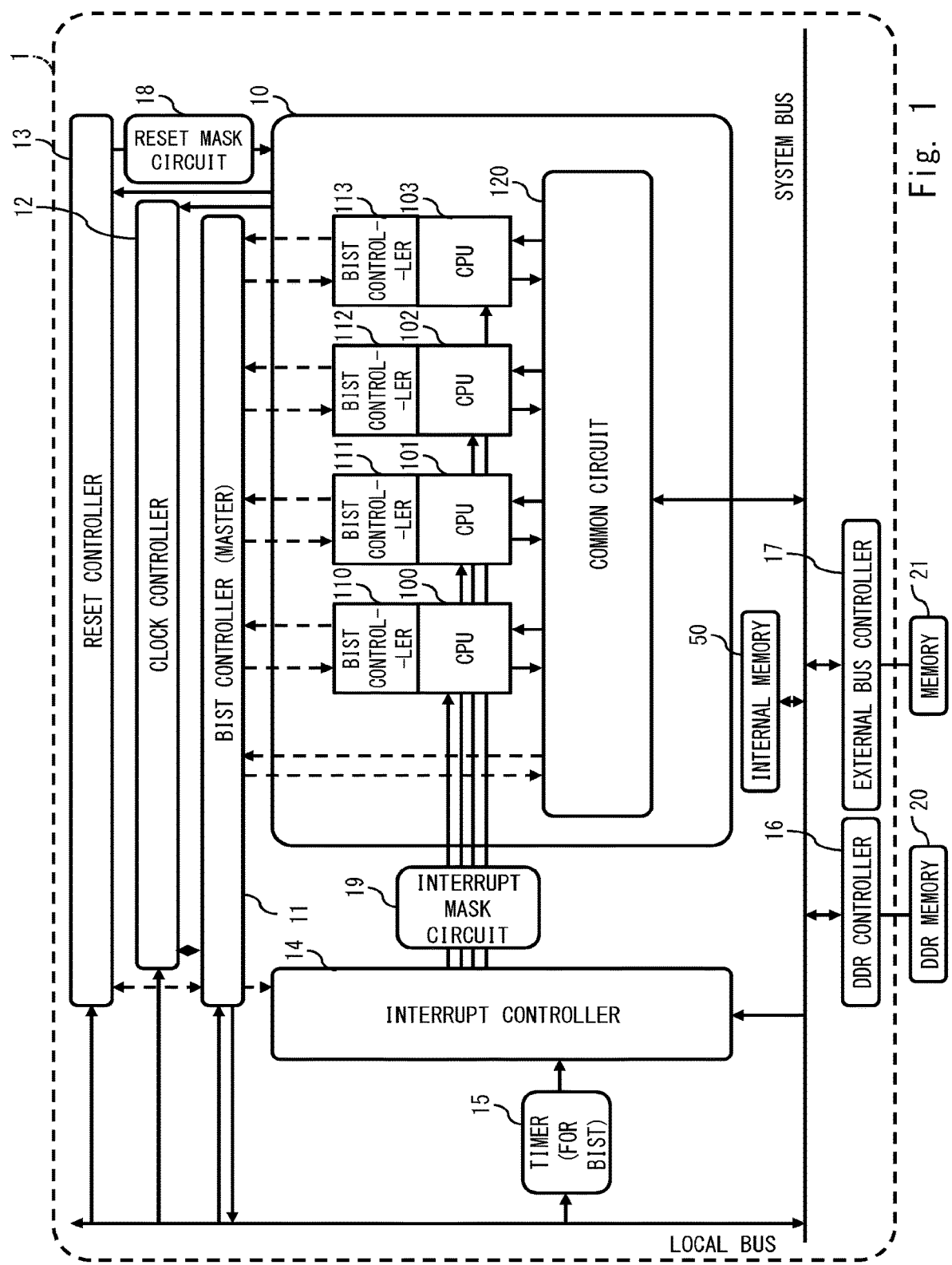
FIG. 1 is a block diagram showing a structure of a semiconductor apparatus according to a first embodiment.

The structure of a semiconductor apparatus 1 according to a first embodiment is described hereinafter with reference to FIG. 1. As shown in FIG. 1, the semiconductor apparatus 1 includes a CPU cluster 10, a BIST controller 11, a clock controller 12, a reset controller 13, an interrupt controller 14, a timer 15, a DDR (Double-Data-Rate) controller 16, an external bus controller 17, a reset mask circuit 18, an interrupt mask circuit 19, and an internal memory 50.

The CPU cluster 10, the interrupt controller 14, the DDR controller 16, the external bus controller 17 and the internal memory 50 are connected with one another through a system bus. The BIST controller 11, the clock controller 12, the reset controller 13 and the timer 15 are connected with one another through a local bus. Further, the system bus and the local bus are connected.

The CPU cluster 10 is a circuit that performs processing as the semiconductor apparatus 1 in collaboration with the other circuits 11 to 17. The CPU cluster 10 includes a plurality of CPUs 100 to 103, a plurality of BIST controllers 110 to 113, and a common circuit 120.

Each of the CPUs 100 to 103 is a circuit that shares the processing that is performed by the CPU cluster 10. Each of the CPUs 100 to 103 performs the processing by using data stored in a DDR memory 20, a memory 21 and the internal memory 50. The data contains a program that includes a plurality of instructions that cause each of the CPUs 100 to 103 to perform the processing. Further, each of the CPUs 100 to 103 updates the data stored in the DDR memory 20, the memory 21 and the internal memory 50 as the processing is performed.

Each of the BIST controllers 110 to 113 is a circuit that executes a runtime test of each of the CPUs 100 to 103 in accordance with control from the BIST controller 11. The BIST controller 110 executes a runtime test of the CPU 100, the BIST controller 111 executes a runtime test of the CPU 101, the BIST controller 112 executes a runtime test of the CPU 102, and the BIST controller 113 executes a runtime test of the CPU 103.

The common circuit 120 is a circuit that is used in common to the CPUs 100 to 103 when the CPU cluster 10 performs processing. Each of the CPUs 100 to 103 accesses, via the common circuit 120, the interrupt controller 14, the DDR controller 16, the external bus controller 17 and the internal memory 50 that are connected with the CPU cluster 10 through the system bus. Further, each of the CPUs 100 to 103 accesses, via the common circuit 120, the BIST controller 11, the clock controller 12, the reset controller 13 and the timer 15 that are connected with the CPU cluster 10 through the system bus and the local bus.

The BIST controller 11 is a circuit that controls the execution of a runtime test of the CPU cluster 10. To be more specific, the BIST controller 11 controls the execution of a runtime test of each of the CPUs 100 to 103 by each of the BIST controllers 110 to 113. Thus, the BIST controller 11 serves as a master, and each of the BIST controllers 110 to 113 serves as a slave.

The clock controller 12 is a circuit that generates a clock signal and supplies the signal to the circuits 10, 11, 13 to 19 and 50 included in the semiconductor apparatus 1.

The reset controller 13 is a circuit that resets the CPU cluster 10. To be more specific, the reset controller 13 resets each of the CPUs 100 to 103 and the common circuit 120. When the reset controller 13 resets any of the CPUs 100 to 103 and the common circuit 120, it outputs a reset signal to the circuit. Each of the CPUs 100 to 103 and the common circuit 120 is reset when the reset signal is input from the reset controller 13.

The interrupt controller 14 is a circuit that notifies each of the CPUs 100 to 103 of the occurrence of an interrupt from a circuit in the semiconductor apparatus 1 to the CPUs 100 to 103 and an interrupt from an external device. To be more specific, when an interrupt signal is input from a circuit in the semiconductor apparatus 1 or an external device, the interrupt controller 14 outputs the interrupt signal to the CPU that is set as the destination of the interrupt signal.

The timer 15 is a circuit that measures the elapsed time and notifies, by an interrupt, the CPU cluster 10 of the timing to execute a runtime test. To be more specific, the timer 15 outputs an interrupt signal to the interrupt controller 14 each time the timing to execute a runtime test is reached. In response to the interrupt signal, the interrupt controller 14 outputs the interrupt signal to the CPU that is set in advance as the circuit to which an interrupt is to be notified.

The DDR controller 16 is connected with the DDR memory 20 outside the semiconductor apparatus 1. The DDR controller 16 controls the access from a circuit in the semiconductor apparatus 1 to the DDR memory 20. For example, the DDR controller 16 reads data from the DDR memory 20 and outputs it to the CPU cluster 10 in response to a data read request from the CPU cluster 10. Further, for example, the DDR controller 16 writes data output from the CPU cluster 10 to the DDR memory 20 in response to a data write request from the CPU cluster 10.

The external bus controller 17 is connected with the memory 21 outside the semiconductor apparatus 1. The external bus controller 17 controls the access from a circuit in the semiconductor apparatus 1 to the memory 21. For example, the external bus controller 17 reads data from the memory 21 and outputs it to the CPU cluster 10 in response to a data read request from the CPU cluster 10. Further, for example, the DDR controller 16 writes data output from the CPU cluster 10 to the memory 21 in response to a data write request from the CPU cluster 10.

The reset mask circuit 18 is a circuit that inhibits the reset from the reset controller 13 to each of the CPUs 100 to 103 and the common circuit 120. Whether the reset is to be inhibited for each of the CPUs 100 to 103 and the common circuit 120 can be set arbitrarily to the reset mask circuit 18. This setting is made by setting a value indicating whether or not to inhibit the reset to a control register (not shown) included in the reset controller 13. Further, this setting can be changed at arbitrary timing by each of the CPUs 100 to 103. The reset mask circuit 18 masks (blocks off) the reset signal from the reset controller 13 to a circuit which is one of the CPUs 100 to 103 and the common circuit 120 for which the inhibition of the reset has been set, and thereby inhibits the reset of that circuit.

The interrupt mask circuit 19 is a circuit that inhibits the interrupt from the interrupt controller 14 to each of the CPUs 100 to 103. Whether the interrupt is to be inhibited for each of the CPUs 100 to 103 can be set arbitrarily to the interrupt mask circuit 19. This setting is made by setting a value indicating whether or not to inhibit the interrupt to a control register (not shown) included in the clock controller 12. Further, this setting can be changed at arbitrary timing by each of the CPUs 100 to 103. The interrupt mask circuit 19 masks (blocks off) the interrupt signal from the interrupt controller 14 to one of the CPUs 100 to 103 for which the inhibition of the interrupt has been set, and thereby inhibits the interrupt of that CPU.

The DDR memory 20, the memory 21 and the internal memory 50 store various data. The DDR memory 20, the memory 21 and the internal memory 50 store data to be used and updated by each of the CPUs 100 to 103 as described above, for example.

Figure 2:
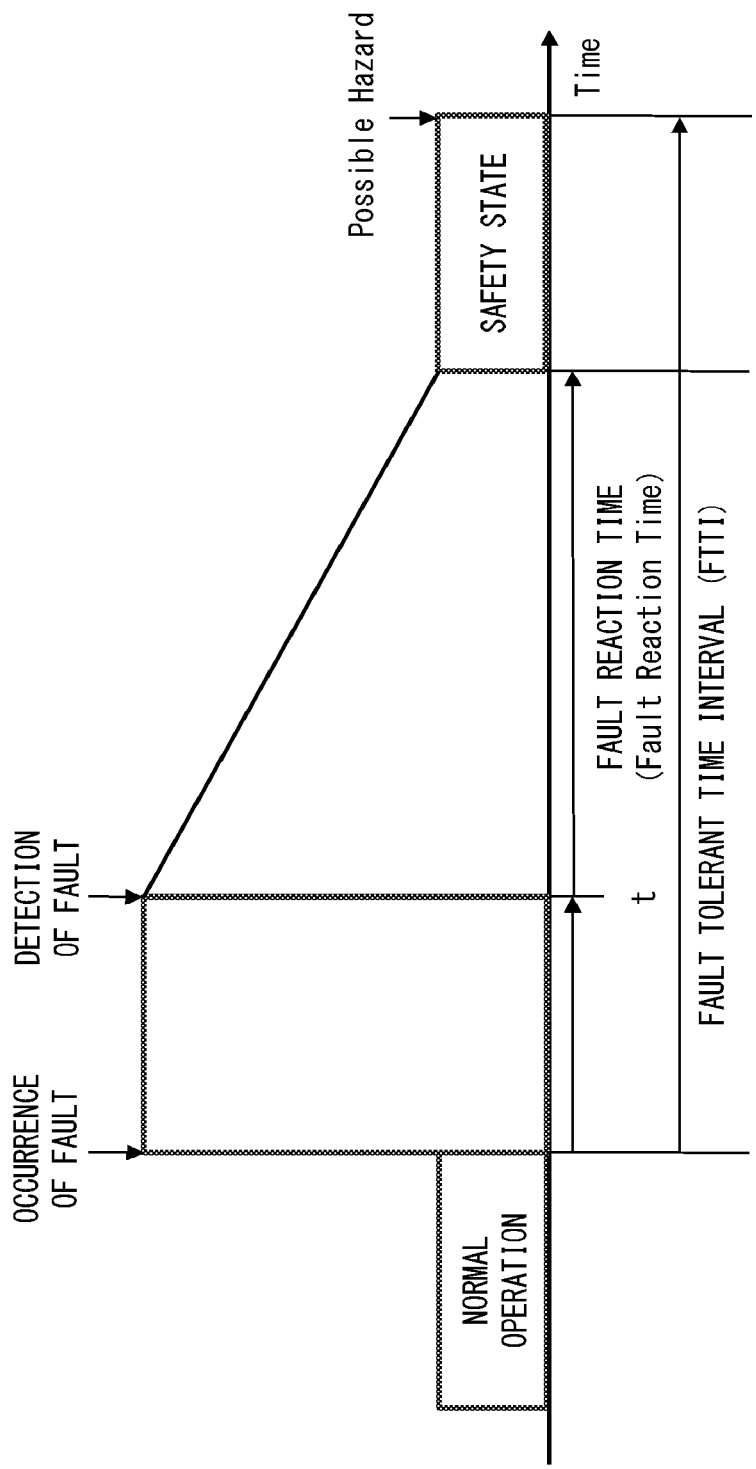
FIG. 2 is a view to explain FTTI and DTI.

The timing to execute a runtime test according to the first embodiment is described hereinafter with reference to FIG. 2. In the ISO26262 standards, it is defined that, in order to ensure the time interval called the fault tolerant time interval (FTTI), which is a time required for recovery from the occurrence of a fault, it is necessary to conduct a diagnosis at the time interval called the diagnostic test interval (DTI).

Therefore, the CPU cluster 10 sets the timer 15 so as to notify the execution timing of a runtime test at each DTI after the startup of the semiconductor apparatus 1. Specifically, the CPU cluster 10 sets the timer 15 so as to output an interrupt signal at each DTI. To be more specific, this setting is made by any of the CPUs 100 to 103. The CPU that sets the timer 15 may be determined in advance, for example. Note that the FTTI and the DTI can be set to arbitrary values by a system developer.

Figure 3:
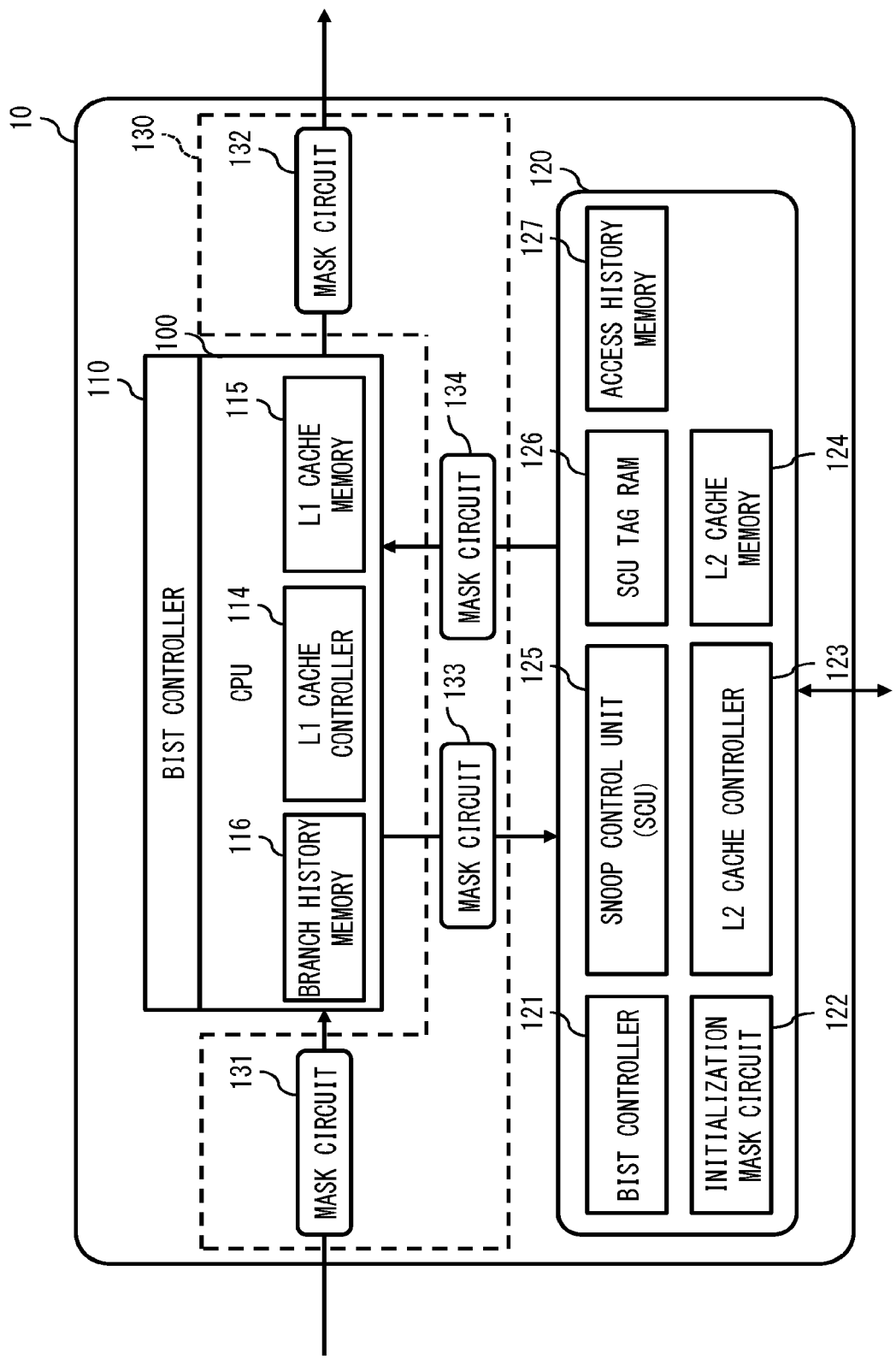
FIG. 3 is a block diagram showing a structure of a CPU cluster according to a first embodiment.

The detailed structure of the CPU cluster 10 according to the first embodiment is described hereinafter with reference to FIGS. 3 and 4. As shown in FIG. 3, the CPU 100 includes an L1 cache controller 114, an L1 cache memory 115, and a branch history memory (branch history table) 116. Note that, in FIG. 3, the structure of only the CPU 100 out of the CPUs 100 to 103 is shown. Because the structure of the CPUs 101 to 103 is the same as that of the CPU 100, the illustration and explanation thereof are omitted.

The L1 cache controller 114 is a circuit that controls reading and writing of data in the memory 21 for the CPU 100 and manages the L1 cache memory 115. When data which the CPU 100 is to read from the memory 21 in order for use in the processing is stored in the L1 cache memory 115, the L1 cache controller 114 acquires that data from the L1 cache memory 115.

On the other hand, when data which the CPU 100 is to read from the memory 21 is not stored in the L1 cache memory 115, the L1 cache controller 114 requests the common circuit 120 to read the data, and thereby acquires the data from an L2 cache memory 124 of the common circuit 120, from an L1 cache memory 115 of the other CPUs 101 to 103, or from the memory 21. To be more specific, the L1 cache controller 114 outputs a read request signal that requests reading of data from the memory 21 to the common circuit 120. In response to the read request signal, the common circuit 120 acquires the data that is requested to be read from the L2 cache memory 124, the L1 cache memory 115 of the other CPUs 101 to 103 or the memory 21 and outputs a read response signal containing the data to the CPU 100. The L1 cache controller 114 stores the data contained in the read response signal from the common circuit 120 into the L1 cache memory 115. Further, the CPU 100 performs processing by using the data.

In the case where the CPU 100 writes data into the memory 21, the L1 cache controller 114 stores the data into the L1 cache memory 115. The data is flashed from the L1 cache memory 115 to the memory 21 at arbitrary timing. To be more specific, the L1 cache controller 114 outputs a write request signal that requests writing of data into the memory 21 to the common circuit 120. The write request signal contains data that is requested to be written into the memory 21. In response to the write request signal, the common circuit 120 performs control for storing the data that is requested to be written into the L2 cache memory 124 and the memory 21.

The L1 cache memory 115 is a storage circuit in which data to be stored in the memory 21 is temporarily cached.

The branch history memory 116 stores information indicating a history as to whether branching has been performed or not in accordance with a branch instruction executed in the past in a program executed by the CPU 100. Specifically, when a branch instruction is executed, the CPU 100 stores the history of the branch instruction into the branch history memory 116. This history indicates the address of the branch instruction and whether a branch is done according to the branch instruction, for example. In the case of predicting a branch target of one branch instruction, the CPU 100 predicts the branch target based on the history of a branch instruction indicating the same address as the one branch instruction among the histories stored in the branch history memory 116.

Further, as shown in FIG. 3, the common circuit 120 includes a BIST controller 121, an initialization mask circuit 122, an L2 cache controller 123, an L2 cache memory 124, a snoop control unit (SCU) 125, a SCU tag RAM (Random Access Memory) 126, and an access history memory 127.

The BIST controller 121 is a circuit that executes a runtime test of the common circuit 120 in accordance with control from the BIST controller 11. The BIST controller 121 serves as a slave just like the BIST controllers 110 to 113.

The initialization mask circuit 122 is a circuit that inhibits the writing of data to the L2 cache memory 124 and the SCU tag RAM 126 at the time of executing a runtime test of the common circuit 120.

The L2 cache controller 123 is a circuit that controls reading and writing of data in the memory 21 by the CPU 100 and manages the L2 cache memory 124. When reading of data is requested from the CPU 100 to the memory 21, the L2 cache controller 123 tries to acquire the data from the L1 cache memory 115 of the other CPUs 101 to 103 by the snoop control unit 125, as described later. When the data cannot be acquired by the snoop control unit 125, the L2 cache controller 123 acquires the data from the L2 cache memory 124.

On the other hand, when the data that is requested to be read from the CPU 100 cannot be acquired from any of the L2 cache memory 124 and the snoop control unit 125, the cache controller 123 requests the external bus controller 17 to read that data and thereby acquires the data from the memory 21. To be specific, the L2 cache controller 123 outputs a read request signal that requests reading of data from the memory 21 to the external bus controller 17 through the system bus. In response to the read request signal, the external bus controller 17 outputs a read response signal containing the data acquired from the memory 21 to the common circuit 120 through the system bus. The L2 cache controller 123 acquires the data contained in the read response signal.

The L2 cache controller 123 outputs the data acquired from the L2 cache memory 124, the memory 21 or the snoop control unit 125 to the CPU 100 from which the request has been made. To be more specific, the L2 cache controller 123 outputs the read response signal containing the acquired data to the CPU 100 from which the request has been made.

When writing of data is requested from the CPU 100 to the memory 21, the L2 cache controller 123 stores the data into the L2 cache memory 124. The data is flashed from the L2 cache memory 124 to the memory 21 at arbitrary timing. To be more specific, the L2 cache controller 123 outputs a write request signal that requests writing of the data into the memory 21 to the external bus controller 17 through the system bus. In response to the write request signal, the external bus controller 17 stores the data contained in the write request signal into the memory 21.

The L2 cache memory 124 is a storage circuit in which data to be stored in the memory 21 is temporarily cached as described above. The L2 cache memory 124 is a memory in the lower level than the L1 cache memory 115.

The snoop control unit 125 controls the cache coherency of the L1 cache memory 115 among the plurality of CPUs 100 to 103 by snooping.

The snoop control unit 125 determines whether the data requested to be read from the CPU 100 is stored in the L1 cache memory 115 of any of the CPUs 101 to 103 other than the CPU 100 that has requested the reading. When the snoop control unit 125 determines that the data is stored in the L1 cache memory 115 of any of the CPUs 101 to 103 other than the CPU 100 that has requested the reading, it requests the data to that CPU. To be more specific, the snoop control unit 125 outputs a snoop request signal that requests the data to the CPU which includes that L1 cache memory 115. In response to the snoop request signal, the L1 cache controller 114 of that CPU acquires the data requested by the snoop request signal from the L1 cache memory 115 and outputs a snoop response signal containing the data to the common circuit 120. The snoop control unit 125 acquires the data contained in the snoop response signal.

Further, the snoop control unit 125 determines whether the data requested to be written from the CPU 100 is stored in the L1 cache memory 115 of any of the CPUs 101 to 103 other than the CPU 100 that has requested the writing. When the snoop control unit 125 determines that the data is stored in the L1 cache memory 115 of any of the CPUs 101 to 103 other than the CPU 100 that has requested the writing, it requests the invalidation of that data to that CPU. To be more specific, the snoop control unit 125 outputs a snoop request signal that requests the invalidation of the data to the CPU which includes that L1 cache memory 115. In response to the snoop request signal, the L1 cache controller 114 of that CPU invalidates the data requested be invalidated by the snoop control signal in the L1 cache memory 115. The data is thereby deleted from the L1 cache memory 115 and treated as not existing in the L1 cache memory 115.

The SCU tag RAM 126 is a storage circuit that stores information indicating which address in the memory 21 corresponds to each of the data stored in the L1 cache memory 115 of the CPUs 100 to 103.

Based on the information stored in the SCU tag RAM 126, the snoop control unit 125 determines which of the CPUs 101 to 103 other than the CPU 100 that has requested the reading or writing has the L1 cache memory 115 that stores the above-described data requested to be read or written. To be specific, the read request signal contains the address of the data to be read in the memory 21, and the write request signal contains the address where the data to be written in the memory 21. The snoop control unit 125 determines whether any of the address of the data stored in the L1 cache memory 115 of any of the CPUs 101 to 103 other than the CPU 100 that has requested the reading or writing matches the address contained in the read request signal or the write request signal. When the address matches, the above-described data request or invalidation request is made for the data stored in the L1 cache memory 115 in any of the CPUs 101 to 103 other than the CPU 100 that has requested the reading or writing.

Thus, when the data is stored into the L1 cache memory 115, the L1 cache controller 114 of each of the CPUs 100 to 103 notifies the common circuit 120 of the address of the data in the memory 21. In response to the notification of the address from the L1 cache controller 114 of each of the CPUs 100 to 103, the snoop control unit 125 of the common circuit 120 updates the SCU tag RAM 126 so as to indicate that the data of the notified address is stored in the L1 cache memory 115 of the CPU from which the notification is sent. Further, when the data of the notified address is stored in the L2 cache memory 124, the L2 cache controller 123 of the common circuit 120 invalidates the data because that data is no longer the latest data.

The access history memory 127 stores information indicating an access history to a cache line in the L2 cache memory 124. Note that the access history indicates the content that is used for determination of a cache line to be refilled (overwritten) when writing data into the L2 cache memory 124. For example, in the case where LRU (Least Recently Used) is employed as a cache algorithm, the access history indicates the cache line that has been accessed earliest among a plurality of cache lines respectively corresponding to a plurality of ways specified by the same index address. Further, for example, in the case where LFU (Least Frequently Used) is employed as a cache algorithm, the access history indicates the frequency of access to data in each of a plurality of cache lines respectively corresponding to a plurality of ways specified by the same index address. In response to an access to the L2 cache memory 124, the L2 cache controller 123 updates the information stored in the access history memory 127. Further, when writing data into the L2 cache memory 124, the L2 cache controller 123 determines a cache line to be refilled (overwritten) based on the information stored in the access history memory 127.

Further, as shown in FIG. 3, the CPU cluster 10 includes a wrapper circuit 130. The wrapper circuit 130 includes a plurality of mask circuits 131 to 134. Note that, in FIG. 3, only the wrapper circuit 130 for the CPU 100 among the CPUs 100 to 103 is shown. Because the wrapper circuit 130 is placed also for the CPUs 101 to 103 in the same way as in the CPU 100, the illustration and explanation thereof are omitted.

The mask circuit 131 is a circuit that masks (blocks off) an interrupt signal that is input from the interrupt controller 14 to the CPU 100.

The mask circuit 132 is a circuit that masks (blocks off) a signal that is output from the CPU 100 to the clock controller 12 and the reset controller 13. An example of this signal is a signal that requests the clock controller 12 to stop the supply of a clock signal with the transition to low power mode.

The mask circuit 133 is a circuit that masks (blocks off) a signal that is input from the CPU 100 to the common circuit 120. Examples of this signal are a read request signal, a write request signal, and a snoop response signal.

The mask circuit 134 is a circuit that masks (blocks off) a signal that is output from the common circuit 120 to the CPU 100. Examples of this signal are a read response signal, a write response signal, and a snoop request signal.

The mask circuits 131 and 134 aim to facilitate the creation of test patterns by fixing a value input to the CPU 100 and defining an expected value in a scan test of the CPU 100. The mask circuits 132 and 133 aim to prevent the normal operation of the system from being hindered by inhibiting the output of an unintended signal from the CPU 100 to another circuit.

Whether or not the mask circuits 131 to 134 mask (block off) a signal can be set arbitrary to the mask circuits 131 to 134. This setting is made by setting a value indicating whether or not to mask a signal to each of the mask circuits 131 to 134 or a control register (not shown) included in the clock controller 12. Further, this setting can be changed at arbitrary timing by the BIST controller 110. Thus, the setting of the mask circuits 131 to 134 in the CPU 101 is changed by the BIST controller 111, the setting of the mask circuits 131 to 134 in the CPU 102 is changed by the BIST controller 112, and the setting of the mask circuits 131 to 134 in the CPU 103 is changed by the BIST controller 113. The operation of the mask circuits 131 to 134 of each of the CPUs 100 to 103 is activated so as to mask a signal when executing a runtime test in the CPUs 100 to 103.

Figure 4:
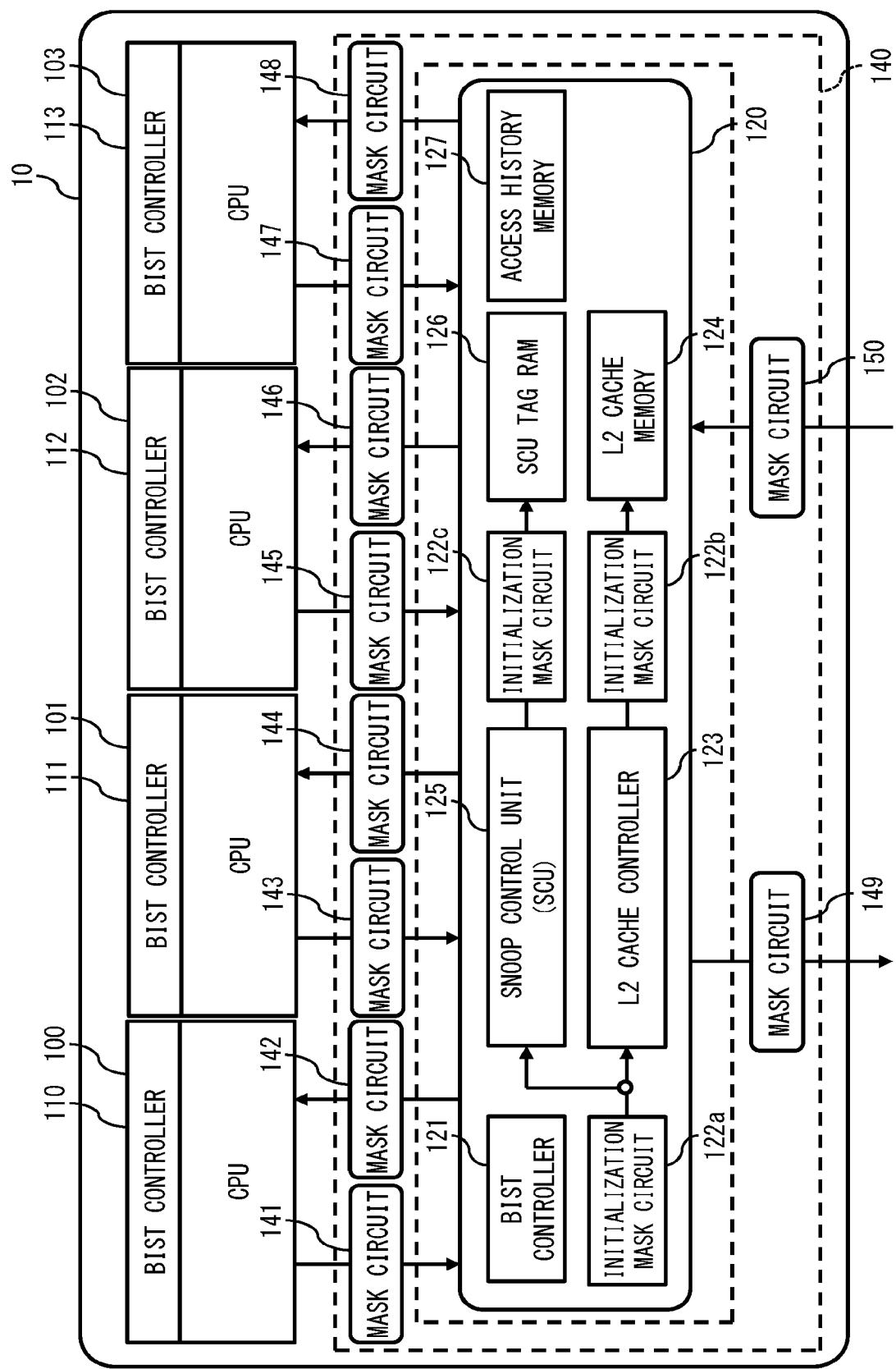
FIG. 4 is a block diagram showing a structure of the CPU cluster according to the first embodiment.

Further, as shown in FIG. 4, the initialization mask circuit 122 includes initialization mask circuits 122a to 122c.

The initialization mask circuit 122a is a circuit that inhibits the processing that the L2 cache controller 123 writes an initial value into the L2 cache memory 124 and thereby initializes the L2 cache memory 124 and the processing that the snoop control unit 125 writes an initial value into the SCU tag RAM 126 and thereby initializes the SCU tag RAM 126. To be more specific, the initialization mask circuit 122a outputs an instruction signal that instructs the inhibition of the initialization to each of the L2 cache controller 123 and the snoop control unit 125. When the instruction signal is input at the reset of the common circuit 120, each of the L2 cache controller 123 and the snoop control unit 125 refrains from writing data for the initialization to each of the L2 cache memory 124 and the SCU tag RAM 126, which is executed when canceling the reset of the common circuit 120. The initialization mask circuit 122a activates its operation so as to inhibit the initialization of the L2 cache memory 124 and the SCU tag RAM 126 at the resetting after executing a runtime test of the common circuit 120.

Note that the function of changing the operation as to whether or not to perform writing for initialization in accordance with the instruction is generally used by the L2 cache controller 123 and the snoop control unit 125 for the purpose of (1) debugging or (2) data storage when the CPU cluster 10 returns from the power saving mode (partial power-off mode). To be more specific, in (1), it is used for the purpose of leaving the data for debugging when resetting and restarting the CPU cluster 10 after it has abnormally stopped. Further, in (2), it is used for the purpose of taking over the data in order to continue the processing when resetting and returning from the power saving mode where all of the CPUs 100 to 103 in the CPU cluster 10 have entered the sleep mode and the CPUs 100 to 103, the snoop control unit 125 and the L2 cache controller 123 are powered down. In the first embodiment, this function is used also in the execution of a runtime test, thereby achieving the reduction of logic resign costs in relation to taking over the data of the L2 cache memory 124 and the SCU tag RAM 126 when executing a runtime test.

The initialization mask circuit 122b is a circuit that inhibits the writing from the L2 cache controller 123 to the L2 cache memory 124. To be more specific, the initialization mask circuit 122b masks (blocks off) a signal that is output from the L2 cache controller 123 to the L2 cache memory 124 for data writing. The initialization mask circuit 122b activates its operation so as to inhibit the writing of data to the L2 cache memory 124 when executing a runtime test of the common circuit 120.

The initialization mask circuit 122c is a circuit that inhibits the writing from the snoop control unit 125 to the SCU tag RAM 126. To be more specific, the initialization mask circuit 122c masks (blocks off) a signal that is output from the snoop control unit 125 to the SCU tag RAM 126 for data writing. The initialization mask circuit 122c activates its operation so as to inhibit the writing of data to the SCU tag RAM 126 when executing a runtime test of the common circuit 120.

Whether the initialization mask circuits 122a to 122c inhibit the initialization or writing or not can be set arbitrarily to the initialization mask circuits 122a to 122c. This setting is made by setting a value indicating whether or not to inhibit the initialization or writing to each of the initialization mask circuits 122a to 122c or a control register (not shown) included in the clock controller 12. Further, this setting can be changed at arbitrary timing by one of the CPUs 100 to 103 that controls the execution of a runtime test of the common circuit 120.

Further as shown in FIG. 4, the common circuit 120 includes a wrapper circuit 140. The wrapper circuit 140 includes a plurality of mask circuits 141 to 150.

Each of the mask circuits 141, 143, 145 and 147 is a circuit that masks (blocks off) a signal that is input from each of the CPUs 100 to 103 to the common circuit 120. Examples of this signal are a read request signal, a write request signal, and a snoop response signal.

Each of the mask circuits 142, 144, 146 and 148 is a circuit that masks (blocks off) a signal that is output from the common circuit 120 to each of the CPUs 100 to 103. Examples of this signal are a read response signal, a write response signal, and a snoop request signal.

The mask circuit 149 is a circuit that masks (blocks off) a signal that is output from the common circuit 120 to the system bus. Examples of this signal are a read request signal and a write request signal.

The mask circuit 150 is a circuit that masks (blocks off) a signal that is input from the system bus to the common circuit 120. Examples of this signal are a read response signal and a write response signal.

The mask circuits 141, 143, 145, 147 and 150 aim to facilitate the creation of test patterns by fixing a value input to the common circuit 120 and defining an expected value in a scan test of the common circuit 120. The mask circuits 142, 144, 146, 148 and 149 aim to prevent the normal operation of the system from being hindered by inhibiting the output of an unintended signal from the common circuit 120 to another circuit.

Whether or not the mask circuits 141 to 150 mask (block off) a signal can be set arbitrary to the mask circuits 141 to 150. This setting is made by setting a value indicating whether or not to mask a signal to each of the mask circuits 141 to 150 or a control register (not shown) included in the clock controller 12. Further, this setting can be changed at arbitrary timing by the BIST controller 121. The mask circuits 141 to 150 activate their operations so as to mask a signal when executing a runtime test of the common circuit 120.

Note that, although the case where data of the memory 21 is cached in the L1 cache memory 115 and the L2 cache memory 124 is described as an example above, data of the DDR memory 20 and the DDR memory 20 may be cached by the same control. The same applies to the following description.

An execution procedure of a runtime test on the CPUs 100 to 103 according to the first embodiment is described hereinafter with reference to FIG. 5. Although the procedure in the CPU 100 is described below, the procedure in the CPUs 101 to 103 is performed in the same manner.

The CPU 100 starts control for executing a runtime test of itself in response to a notification of interrupt, which serves as a trigger for the start of a runtime test. First, the CPU 100 sets test conditions to a control register (not shown) of the BIST controller 11 through the system bus (S1). This setting of test conditions includes the setting of a test target. To be more specific, the CPU 100 sets itself as a test target to the BIST controller 11.

The CPU 100 instructs the activation of a runtime test to the BIST controller 11 through the system bus (S2). In response to the instruction, the BIST controller 11 waits for the CPU 100 that is set as a test target to transition to the sleep mode.

The CPU 100 saves (writes) the data stored in the register of itself into the DDR memory 20, the memory 21 and the internal memory 50 (S3). Further, the CPU 100 flashes the data in the L1 cache memory 115 to the memory 21. Specifically, the latest data stored in the L1 cache memory 115 of the CPU 100 is reflected on the L2 cache memory 124 and the memory 21 in the lower level. Thus, even if the data in the L1 cache memory 115 of the CPU 100 is deleted as a result of the execution of a runtime test of the CPU 100, it is possible to prevent the inconsistency from occurring in the processing to be performed in the CPUs 100 to 103 after the runtime test. The CPU 100 sets the interrupt mask circuit 19 so as to mask an interrupt signal from the interrupt controller 14 to itself (S4). Then, the CPU 100 transitions to the sleep mode by a WFI (Wait For Interrupt) instruction (sleep instruction) (S5). The sleep mode caused by the WFI instruction is the sleep mode that wakes up in response to a notification of interrupt. Note that, there is a problem that the CPU 100 stops the transition to the sleep mode when an interrupt is received during the transition to the sleep mode by the WFI. To prevent this, the interrupt signal to the CPU 100 is masked. After transitioning to the sleep mode, the CPU 100 outputs a status signal notifying that it is in the sleep mode to the BIST controller 11.

When the status signal notifying that it is in the sleep mode is output from the CPU 100 that is set as a test target, the BIST controller 11 instructs the start of a runtime test of the CPU 100 to the BIST controller 110. In response to the instruction from the BIST controller 11, the BIST controller 110 starts a runtime test of the CPU 100. First, the BIST controller 110 makes settings so that the mask circuits 131 to 134 of the wrapper circuit 130 in the CPU 100 mask a signal (S6). This prevents the transmission of an unintended signal to another circuit that is connected with the CPU 100 being a test target and the transmission of an unintended signal from another circuit to the CPU 100 being a test target.

The BIST controller 110 executes a runtime test of the CPU 100 (S7). To be more specific, the BIST controller 110 executes a scan test (LBIST, logic BIST) on a logic circuit of the CPU 100 and executes MBIST (memory BIST) on a storage circuit (for example, the branch history memory 116) of the CPU 100.

Specifically, the BIST controller 110 sequentially creates test patterns and scans them into a scan chain of the logic circuit of the CPU 100. Further, the BIST controller 110 sequentially scans out and acquires execution result data from the scan chain of the logic circuit of the CPU 100. The BIST controller 110 compresses the acquired execution result data and generates a BIST execution result. The BIST controller 110 compares the generated BIST execution result with an expected value generated in accordance with the test pattern. When the compared values match, the BIST controller 110 determines that the logic circuit of the CPU 100 is normal, and when the compared values do not match, the BIST controller 110 determines that the logic circuit of the CPU 100 is in failure.

Further, the BIST controller 110 sequentially creates test patterns and writes them into the storage circuit of the CPU 100. The BIST controller 110 reads test patterns written from the storage circuit of the CPU 100. The BIST controller 110 compares the test pattern before writing (which is used for writing) with the read test pattern. When the compared values match, the BIST controller 110 determines that the storage circuit of the CPU 100 is normal, and when the compared values do not match, the BIST controller 110 determines that the storage circuit of the CPU 100 is in failure. Note that MBIST is not done on the storage circuit (for example, the L1 cache memory 115) having a mechanism for detecting an error by itself (for example, EEC (Error Checking and Correction)).

When the BIST controller 110 determines that all of the logic circuit and the storage circuit of the CPU 100 are normal, it stores a runtime test result value indicating the CPU 100 is normal to a result register of the BIST controller 11. On the other hand, when the BIST controller 110 determines that any of the logic circuit and the storage circuit of the CPU 100 is in failure, it stores a runtime test result value indicating the CPU 100 is in failure to the result register of the BIST controller 11.

After executing a runtime test of the CPU 100, the BIST controller 110 makes settings so that the mask circuits 131 to 134 of the wrapper circuit 130 in the CPU 100 cancel the masking of the signal (S8). The BIST controller 110 notifies the BIST controller 11 of the end of execution of the runtime test of the CPU 100. In response to the notification from the BIST controller 110, the BIST controller 11 outputs, to the reset controller 13, a request signal that requests the reset of the CPU 100 being the test target (S9). In response to the request signal from the BIST controller 11, the reset controller 13 outputs a reset signal to the CPU 100 for which the request signal requests the reset. The CPU 100 is thereby reset.

At the time of booting by the reset, the CPU 100 checks the cause of the reset of itself (S10). To be more specific, the CPU 100 checks whether it is booted by the reset after execution of a runtime test by referring to the control register included in the BIST controller 11 through the system bus. Specifically, when the runtime test of the CPU 100 is executed, the BIST controller 11 stores the data indicating the execution of the runtime test of the CPU 100 in the control register. The data indicating the execution of the runtime test of the CPU 100 is deleted from the control register by the CPU 100 after it is checked by the CPU 100.

When the CPU 100 recognizes that it is booted by the reset after execution of a runtime test, it acquires the runtime test result value that has been stored into the result register in the BIST controller 11 through the system bus in the processing at the time of booting (S11) and thereby ends the runtime test (S12).

When the runtime test result value indicates that the CPU 100 is normal, the CPU 100 restores the data saved in the above Step S3 to the register of the CPU 100 (S13). The CPU 100 sets the interrupt mask circuit 19 so as to cancel the masking of the interrupt signal from the interrupt controller 14 to itself (S14). Then, the CPU 100 resumes the execution of the program that has been executed before the execution of the runtime test.

On the other hand, when the runtime test result value indicates that the CPU 100 is in failure, the CPU 100 performs an anti-failure routine corresponding to that. As the anti-failure routine, processing that shuts down the whole system in the semiconductor apparatus 1 may be performed, or the system operation in the semiconductor apparatus 1 may be continued using the other CPUs 101 to 103, without using the CPU 100.

Note that, when the CPU 100 is not booted by the reset after execution of a runtime test (it is booted after the normal reset), the CPU 100 performs the processing at booting after the normal reset, and does not perform the processing of acquiring the runtime test result value and the processing in accordance with that value.

An execution procedure of a runtime test on the common circuit 120 according to the first embodiment is described hereinafter with reference to FIG. 6. Although the procedure that the CPU 100 controls the execution of a runtime test on the common circuit 120 is described below, any of the CPUs 101 to 103, instead of the CPU 100, may control the execution of a runtime test on the common circuit 120.

The CPU 100 starts control that executes a runtime test of the common circuit 120 after executing the runtime test of itself. First, the CPU 100 notifies a CPU interrupt to each of the other CPUs 101 to 103 that share the common circuit 120 with itself (S21). In response to the notification of the CPU interrupt, each of the other CPUs 101 to 103 transitions to the sleep mode by the WFI instruction.

The CPU 100 sets test conditions to the control register of the BIST controller 11 through the system bus (S22). This setting of test conditions includes the setting of a test target as described above. To be more specific, the CPU 100 sets the common circuit 120 as a test target to the BIST controller 11.

The CPU 100 instructs the activation of a runtime test to the BIST controller 11 through the system bus (S23). In response to the instruction, the BIST controller 11 waits for all of the CPUs 100 to 103 to transition to the sleep mode.

The CPU 100 saves (writes) the data stored in a register included in the common circuit 120 into the DDR memory 20, the memory 21 and the internal memory 50 (S24). The CPU 100 sets the interrupt mask circuit 19 so as to mask an interrupt signal from the interrupt controller 14 to the other CPUs 101 to 103. The CPU 100 sets the interrupt controller 14 through the system bus so as to output the interrupt signal to the CPU 100 only for an interrupt from the BIST controller 11. Specifically, the CPU 100 sets the interrupt controller 14 so as not to output the interrupt signal for an interrupt from circuits other than the BIST controller 11. Further, the CPU 100 sets the reset mask circuit 18 so as to mask the reset signal from the reset controller 13 to all of the CPUs 100 to 103 that use the common circuit 120 (S25). Then, the CPU 100 transitions to the sleep mode by the WFI instruction (S26). After transitioning to the sleep mode, each of the CPUs 100 to 103 outputs a status signal notifying that it is in the sleep mode to the BIST controller 11.

When the status signal notifying that it is in the sleep mode is output from all of the CPUs 100 to 103 that use the common circuit 120, the BIST controller 11 instructs the start of a runtime test of the common circuit 120 to the BIST controller 121. In response to the instruction from the BIST controller 11, the BIST controller 121 starts a runtime test of the common circuit 120. First, the BIST controller 121 makes settings so that the mask circuits 141 to 150 of the wrapper circuit 140 in the common circuit 120 mask a signal (S27). This prevents the transmission of an unintended signal to another circuit that is connected with the common circuit 120 being a test target and the transmission of an unintended signal from another circuit to the common circuit 120 being a test target.

The BIST controller 121 executes a runtime test of the common circuit 120 (S28). To be more specific, the BIST controller 121 executes a scan test (LBIST, logic BIST) on a logic circuit of the common circuit 120 and executes MBIST (memory BIST) on a storage circuit (for example, the access history memory 127) of the common circuit 120.

Specifically, the BIST controller 121 sequentially creates test patterns and scans them into a scan chain of the logic circuit of the common circuit 120. Further, the BIST controller 121 sequentially scans out and acquires execution result data from the scan chain of the logic circuit of the common circuit 120. The BIST controller 121 compresses the acquired execution result data and generates a BIST execution result. The BIST controller 121 compares the generated BIST execution result with an expected value generated in accordance with the test pattern. When the compared values match, the BIST controller 121 determines that the logic circuit of the common circuit 120 is normal, and when the compared values do not match, the BIST controller 121 determines that the logic circuit of the common circuit 120 is in failure.

Further, the BIST controller 121 sequentially creates test patterns and writes them into the storage circuit of the common circuit 120. The BIST controller 121 reads test patterns written from the storage circuit of the common circuit 120. The BIST controller 121 compares the test pattern before writing (which is used for writing) with the read test pattern. When the compared values match, the BIST controller 121 determines that the storage circuit of the common circuit 120 is normal, and when the compared values do not match, the BIST controller 121 determines that the storage circuit of the common circuit 120 is in failure. Note that MBIST is not done on the storage circuit (for example, the L2 cache memory 124 and the SCU tag RAM 126) having a mechanism for detecting an error by itself (for example, EEC).

When the BIST controller 121 determines that all of the logic circuit and the storage circuit of the common circuit 120 are normal, it stores a runtime test result value indicating the common circuit 120 is normal to a result register of the BIST controller 11. On the other hand, when the BIST controller 121 determines that any of the logic circuit and the storage circuit of the common circuit 120 is in failure, it stores a runtime test result value indicating the common circuit 120 is in failure to the result register of the BIST controller 11.

After executing a runtime test of the common circuit 120, the BIST controller 121 makes settings so that the mask circuits 141 to 150 of the wrapper circuit 140 in the common circuit 120 cancel the masking of the signal (S29). The BIST controller 121 notifies the BIST controller 11 of the end of execution of the runtime test of the common circuit 120. In response to the notification from the BIST controller 121, the BIST controller 11 outputs, to the reset controller 13, a request signal that requests the reset of the common circuit 120 being the test target (S30). In response to the request signal from the BIST controller 11, the reset controller 13 outputs a reset signal to the common circuit 120 for which the request signal requests the reset. The common circuit 120 is thereby reset.

The reset controller 13 is generally designed to, when resetting the common circuit 120, reset the CPUs 100 to 103 that share the common circuit 120. On the other hand, as described above, the reset mask circuit 18 is set to mask the rest signal to the CPUs 100 to 103 in Step S25. The reset of the CPUs 100 to 103 is thereby inhibited, and the CPUs 100 to 103 can continue their operations after the end of the runtime test of the common circuit 120.

Further, in response to the notification from the BIST controller 121, the BIST controller 11 outputs an interrupt signal to the interrupt controller 14. In response to the interrupt signal from the BIST controller 11, the interrupt controller 14 outputs the interrupt signal to the CPU 100. In response to the interrupt signal from the interrupt controller 14, the CPU 100 wakes up from the sleep mode (S31), acquires the runtime test result value stored in the result register included in the BIST controller 11 (S32) and then ends the runtime test (S33).

When the runtime test result value indicates that the common circuit 120 is normal, the CPU 100 restores the data saved in the above Step S24 to the register of the common circuit 120 (S34). The CPU 100 sets the interrupt mask circuit 19 so as to cancel the masking of the interrupt signal from the interrupt controller 14 to the other CPUs 101 to 103. Further, the CPU 100 sets the interrupt controller 14 through the system bus so as to resume the output of the interrupt signal to the CPU 100 for an interrupt from circuits other than the BIST controller 11 as well. Furthermore, the CPU 100 sets the reset mask circuit 18 so as to cancel the masking of the reset signal from the reset controller 13 to all of the CPUs 100 to 103 that use the common circuit 120 (S35).

The CPU 100 notifies a CPU interrupt to each of the other CPUs 101 to 103 that share the common circuit 120 with itself (S36). Then, the CPU 100 resumes the execution of the program that has been executed before the execution of the runtime test. Further, each of the CPUs 101 to 103 wakes up from the sleep mode in response to the CPU interrupt from the CPU 100 and resumes the execution of the program that has been executed before the execution of the runtime test On the other hand, when the runtime test result value indicates that the common circuit 120 is in failure, the CPU 100 performs an anti-failure routine corresponding to that. As the anti-failure routine, processing that shuts down the whole system in the semiconductor apparatus 1 may be performed.

The transition of the CPUs 100 to 103 to the sleep mode by the WFI instruction is used for connecting an emulator to the semiconductor apparatus 1 for debugging. In the first embodiment, as described earlier, the transition to the sleep mode by the WFI instruction is used also in the execution of a runtime test, thereby reducing design costs and achieving the prevention of operation of the CPUs 100 to 103 during execution of a runtime test and the resumption of the operation.

The operation of the CPU cluster 10 according to the first embodiment during execution of a runtime test is described hereinafter with reference to FIG. 7.

Figure 7:
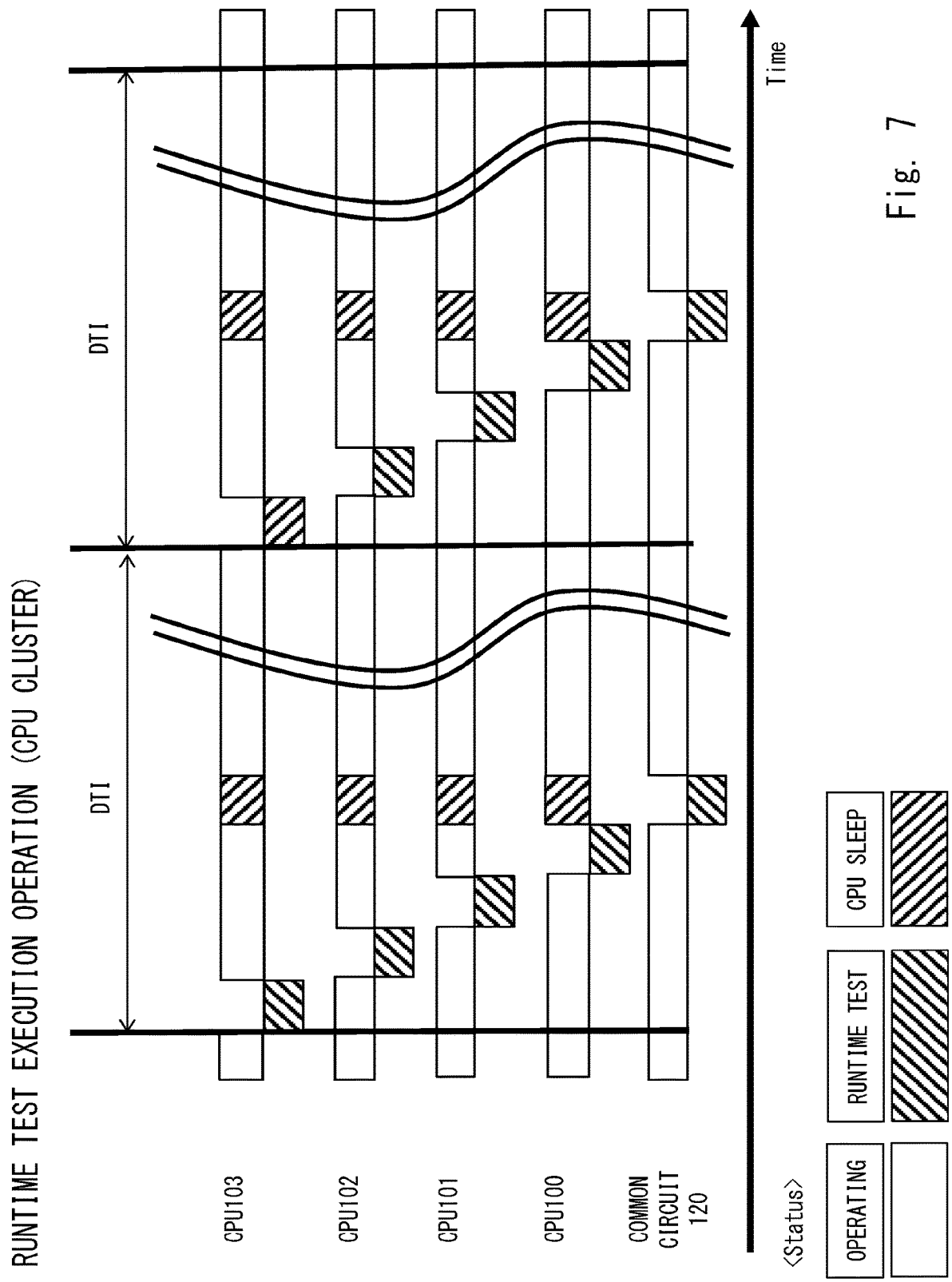
FIG. 7 is a timing chart showing an operation of the CPU cluster according to the first embodiment during execution of a runtime test.

As shown in FIG. 7, a runtime test on all of the circuits (the CPUs 100 to 103 and the common circuit 120) in the CPU cluster 10 is performed by time sharing in DTI in order to minimize the degradation of performance of the whole system. The notification of the DTI is made by an interrupt from the timer 15 as described earlier.

Figure 5:
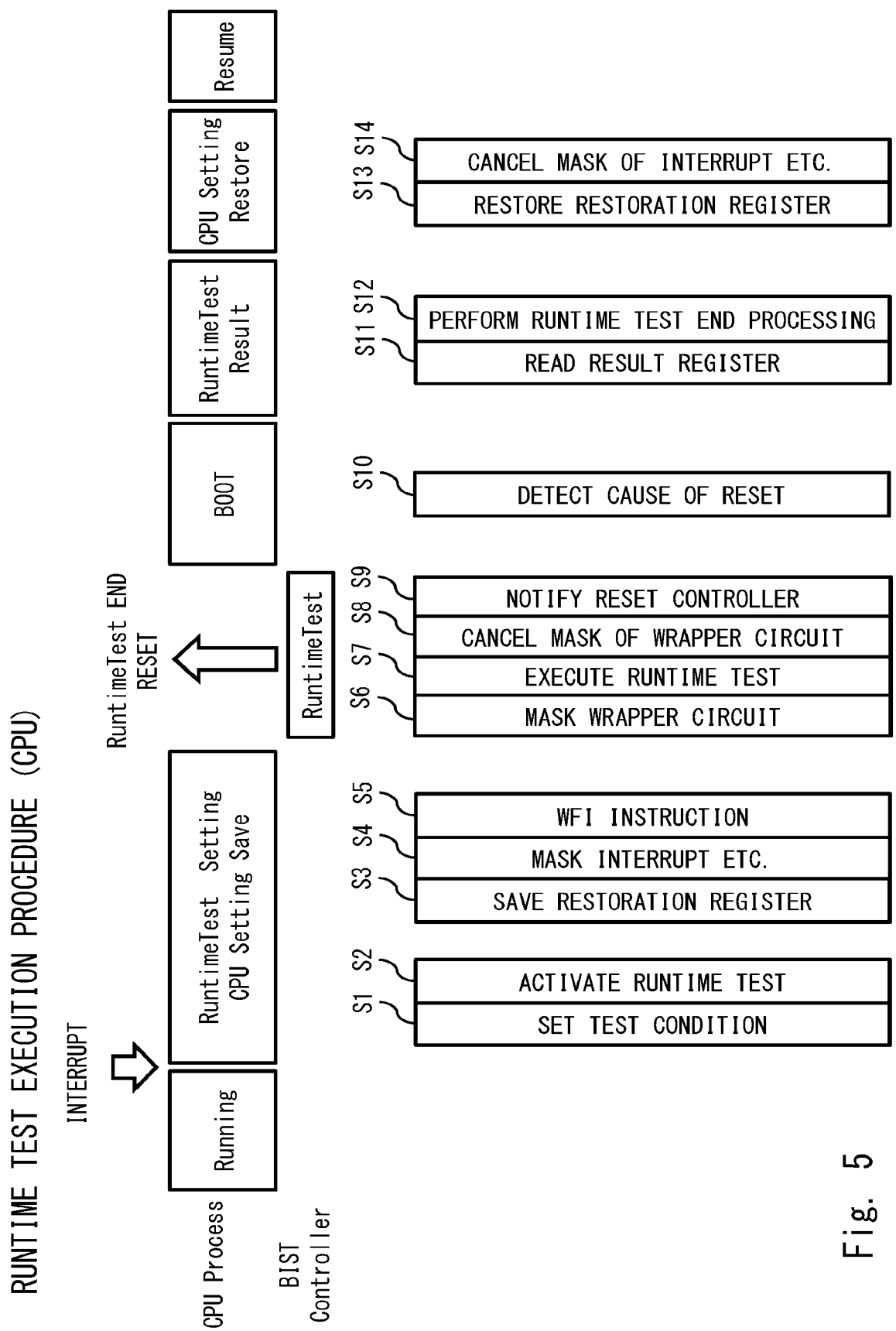
FIG. 5 is a timing chart showing an execution sequence of a runtime test on a CPU according to the first embodiment.

In response to the interrupt from the timer 15, the CPU 103 suspends its processing and executes a runtime test of itself in accordance with the procedure shown in FIG. 5. At this time, each of the other CPUs 100 to 102 continues to perform their processing. After the end of execution of a runtime test, the CPU 103 resumes its processing and notifies a CPU interrupt to the CPU 102.

In response to the CPU interrupt from the CPU 103, the CPU 102 suspends its processing and executes a runtime test of itself in accordance with the procedure shown in FIG. 5. At this time, each of the other CPUs 100 to 101 and 103 continues to perform their processing. After the end of execution of a runtime test, the CPU 102 resumes its processing and notifies a CPU interrupt to the CPU 101.

In response to the CPU interrupt from the CPU 102, the CPU 101 suspends its processing and executes a runtime test of itself in accordance with the procedure shown in FIG. 5. At this time, each of the other CPUs 100 and 102 to 103 continues to perform their processing. After the end of execution of a runtime test, the CPU 101 resumes its processing and notifies a CPU interrupt to the CPU 100.

In response to the CPU interrupt from the CPU 101, the CPU 100 suspends its processing and executes a runtime test of itself in accordance with the procedure shown in FIG. 5. At this time, each of the other CPUs 101 to 103 continues to perform their processing.

Figure 6:
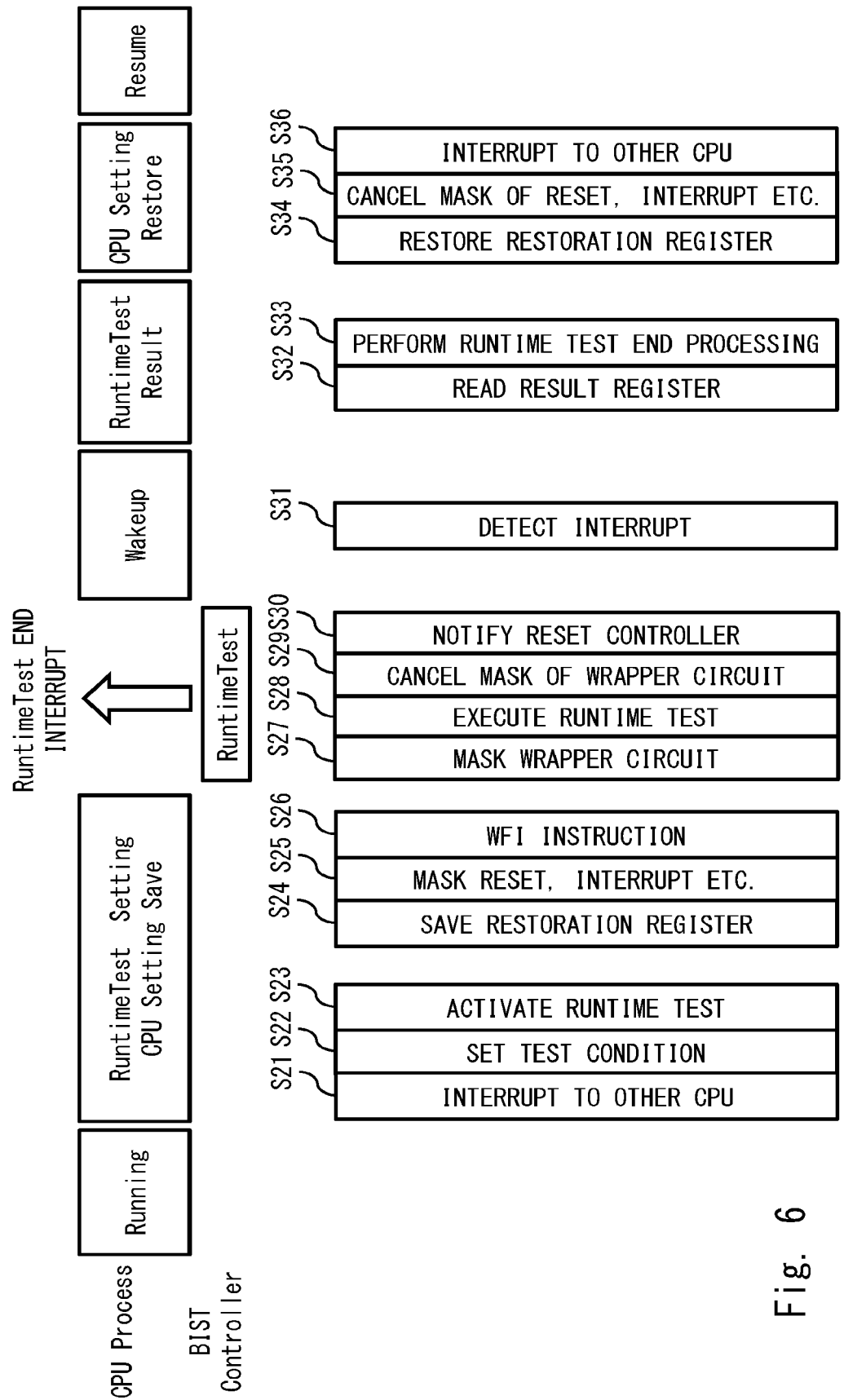
FIG. 6 is a timing chart showing an execution sequence of a runtime test on a common circuit according to the first embodiment.

After the end of execution of a runtime test, the CPU 100 executes a runtime test of the common circuit 120 in accordance with the procedure shown in FIG. 6. At this time, each of all the CPUs 100 to 103 that share the common circuit 120 enters the sleep mode and suspends their processing as described above. After the end of execution of the runtime test of the common circuit 120, each of all the CPUs 100 to 103 resumes their processing.

After that, the timer 15 causes an interrupt to the CPU 103 again each time DTI has elapsed from the time when an interrupt is made to the CPU 103, and thereby the runtime tests of the CPUs 100 to 103 and the common circuit 120 are executed. Thus, each time DTI has elapsed, the runtime tests of the CPUs 100 to 103 and the common circuit 120 are executed.

The operation of the CPU 103 according to the first embodiment during execution of a runtime test is described hereinafter with reference to FIG. 8.

The timer 15 notifies an interrupt to the CPU 103 through the interrupt controller 14 at the time when DTI has elapsed from the last time when the interrupt signal has been output. Specifically, in this example, the CPU 103 is set in advance as the circuit to which an interrupt from the timer 15 is to be notified.

When an interrupt caused by the timer 15 is notified during execution of its processing (S100), the CPU 103 executes an interrupt handler in accordance with the interrupt of the timer 15. In the interrupt handler, the CPU 103 performs setting for executing a runtime test (S101) and saving of information in the CPU 103 (S102) and enters the sleep mode (S103). Step S101 corresponds to Steps S1 and S2 in FIG. 5, Step S102 corresponds to Steps S3 and S4 in FIG. 5, and Step S103 corresponds to Step S5 in FIG. 5.

After the CPU 103 enters the sleep mode, the BIST controller 11 executes a runtime test of the CPU 103 (S104). After the end of execution of the runtime test of the CPU 103, the BIST controller 11 resets the CPU 103 through the reset controller 13 (S105). Step S104 corresponds to Steps S6 to S8 in FIG. 5, and Step S105 corresponds to Step S9 in FIG. 5.

At the time of booting after the reset (S106), the CPU 103 executes a reset handler. In the reset handler, the CPU 103 performs the checking of a runtime test result (S107) and the restoration of information of the CPU 103 (S108). Step S106 corresponds to Steps S10 in FIG. 5, Step S107 corresponds to Steps S11 and S12 in FIG. 5, and Step S108 corresponds to Steps S13 and S14 in FIG. 5. Further, in the reset handler, the CPU 103 notifies a CPU interrupt to the CPU 102, which is the next test target (S109). Then, the CPU 103 ends the reset handler (S110) and resumes the processing that has been performed before execution of the runtime test (S111).

The operation of the CPUs 102 and 101 according to the first embodiment during execution of a runtime test is described hereinafter with reference to FIG. 9. In FIG. 9, the same processing as in the processing of FIG. 8 is denoted by the same reference numeral, and the description thereof is omitted as appropriate.

When a CPU interrupt from the CPU that has executed a runtime test last time is notified during its processing (S100), each of the CPUs 102 and 101 executes an interrupt handler in accordance with the CPU interrupt. The CPU interrupt is notified from the CPU 103 to the CPU 102, and the CPU interrupt is notified from the CPU 102 to the CPU 101. Thus, each of the CPUs 102 and 101 is different from the CPU 103 in that they perform the processing of Steps S101 to S103 in the interrupt handler in accordance with the CPU interrupt from the CPUs 103 and 102, respectively.

Further, in Step S109 in the reset hander, the CPU 102 notifies the CPU interrupt to the CPU 101, and the CPU 101 notifies the CPU interrupt to the CPU 100.

The operation of the CPU 100 according to the first embodiment during execution of a runtime test is described hereinafter with reference to FIG. 10. In FIG. 10, the same processing as in the processing of FIGS. 8 and 9 is denoted by the same reference numeral, and the description thereof is omitted as appropriate.

When a CPU interrupt to the CPU 100 from the CPU 101 that has executed a runtime test last time is notified during its processing (S100), the CPU 100 executes an interrupt handler in accordance with the CPU interrupt. The CPU 100 performs the processing of Steps S101 to S103 in the interrupt handler in accordance with the CPU interrupt from the CPU 101, just like the CPUs 102 and 101.

On the other hand, the CPU 100 is different from the CPUs 101 to S103 in that it notifies a CPU interrupt to each of the other CPUs 101 to 103 (S112) after performing Steps S106 to S108 in the reset handler, and executes a runtime test of the common circuit 120 as described below with reference to FIG. 11.

The operation of the common circuit 120 according to the first embodiment during execution of a runtime test is described hereinafter with reference to FIG. 11.

As shown in FIG. 10, the CPU 100 notifies a CPU interrupt to each of the other CPUs 101 to 103 in the reset handler after execution of its runtime test (S112). Step S112 corresponds to Step S21 in FIG. 6. When a CPU interrupt to the CPUs 101 to 103 from the CPU 100 is notified during its processing (S130), each of the CPUs 101 to 103 executes an interrupt handler in accordance with the CPU interrupt from the CPU 100. Each of the CPUs 101 to 103 transitions to the sleep mode by the WFI instruction in the interrupt handler in accordance with the CPU interrupt from the CPU 100 (S131).

Further, the CPU 100 performs, in the reset handler, setting for executing a runtime test (S113) and saving of information in the common circuit 120 (S114) and then enters the sleep mode (S115). Step S113 corresponds to Steps S22 and S23 in FIG. 6, Step S114 corresponds to Steps S24 and S25 in FIG. 6, and Step S115 corresponds to Step S26 in FIG. 6.

After all of the CPUs 100 to 103 enter the sleep mode, the BIST controller 11 executes a runtime test of the common circuit 120 (S116). In this step, as described earlier, the initialization mask circuit 122b inhibits the update of the L2 cache memory 124 by the L2 cache controller 123, and the initialization mask circuit 122c inhibits the update of the SCU tag RAM 126 by the snoop control unit 125.

After the end of execution of the runtime test of the common circuit 120, the BIST controller 11 resets the common circuit 120 through the reset controller 13 (S117). Step S116 corresponds to S27 to S29 in FIG. 6, and Step S117 corresponds to Step S30 in FIG. 6. At this time, the initialization mask circuit 122a inhibits the initialization of the L2 cache memory 124 and the the SCU tag RAM 126 by the L2 cache controller 123 and the snoop control unit 125.

According to the operation by the initialization mask circuits 122a to 122c, the content of the SCU tag RAM 126 is maintained, and it is thereby possible to ensure the cache coherency of the L1 cache memory 115 when the CPUs 100 to 103 and the common circuit 120 resume the processing. Further, because the content of the L2 cache memory 124 is maintained, it is possible to prevent cache miss of the L2 cache memory 124 when the CPUs 100 to 103 and the common circuit 120 resume the processing and thereby prevent the degradation of performance. In other words, even when a scan test of the common circuit 120 is executed, the CPUs 100 to 103 and the common circuit 120 can continue the processing by using the data stored in the L2 cache memory 124 and the SCU tag RAM 126.

The BIST controller 11 notifies an interrupt to the CPU 100 through the interrupt controller 14 after execution of the runtime test of the common circuit 120. When the interrupt caused by the BIST controller 11 is notified, the CPU 100 wakes up from the sleep mode and executes an interrupt handler in accordance with the interrupt from the BIST controller 11. In the interrupt handler, the CPU 100 performs the checking of a runtime test result (S118) and the restoration of information of the common circuit 120 (S119). Step S118 corresponds to Steps S31 to S33 in FIG. 6, and Step S119 corresponds to Steps S34 and S35 in FIG. 6. Further, in the interrupt handler, the CPU 100 notifies a CPU interrupt to each of the other CPUs 101 to 103 (S120). Step S120 corresponds to Step S36 in FIG. 6. Then, the CPU 100 ends the interrupt handler (S121) and resumes the processing that has been performed before execution of the runtime test (S122). When the CPU interrupt is notified from the CPU 100, each of the other CPUs 101 to 103 wakes up from the sleep mode (S132) and resumes the processing (S133).

Figure 28:
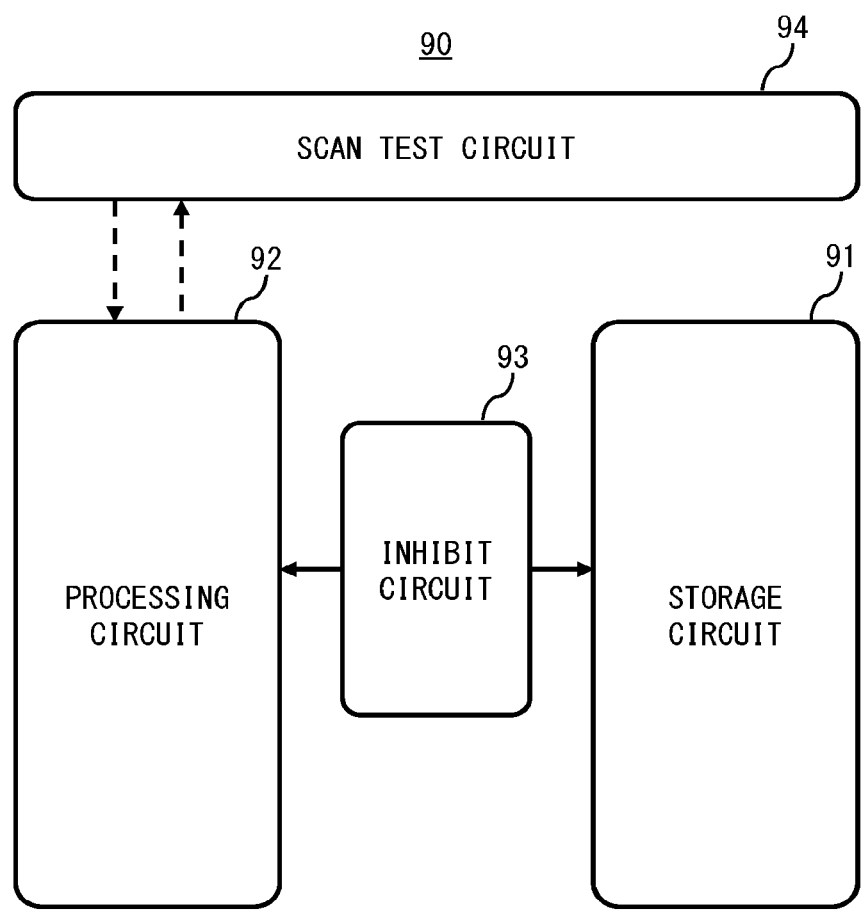
FIG. 28 is a block diagram showing a schematic structure of a semiconductor apparatus according to an embodiment.

As described above, in the first embodiment, a semiconductor apparatus 90 performs processing by using data stored in a storage circuit 91 and, when a scan test circuit 94 executes a scan test on a processing circuit 92 that writes data into the storage circuit in accordance with execution of processing, an inhibit circuit 93 inhibits the writing of data from the processing circuit 92 into the storage circuit 91 as shown in FIG. 28. Therefore, even when a scan test is executed, it is possible to inhibit the change of data stored in the storage circuit 91 to which the processing circuit 92, which is a test target, accesses. Note that the semiconductor apparatus 90 corresponds to the semiconductor apparatus 1. The storage circuit 91 corresponds to the L2 cache memory 124 and the SCU tag RAM 126. The processing circuit 92 corresponds to the CPUs 100 to 103, the L2 cache controller 123 and the snoop control unit 125. The scan test circuit 94 corresponds to the BIST controllers 11, 110 to 113 and 121. The inhibit circuit 93 corresponds to the initialization mask circuit 122.

To be more specific, in the first embodiment, when executing a scan test on the common circuit 120 having the L2 cache controller 123, the inhibit circuit 93 (which corresponds to the initialization mask circuit 122b) inhibits the writing of data from the L2 cache controller 123 to the L2 cache memory 124. It is thereby possible to maintain the content of the L2 cache memory 124, and the need to acquire data from the memory 21 is eliminated for the data stored in the L2 cache memory 124 after the end of the scan test, thereby reducing the degradation of performance.

Further, in the first embodiment, when executing a scan test on the common circuit 120 having a coherency control circuit (which corresponds to the snoop control unit 125) that ensures cache coherency, the writing of data from the coherency control circuit to a management information storage circuit (which corresponds to the SCU tag RAM 126) that stores management information to be used for ensuring cache coherency is inhibited. Because the content of the management information storage circuit is thereby maintained, it is possible to ensure cache coherency after the end of the scan test.

Furthermore, in the first embodiment, each of a plurality of arithmetic circuits (which correspond to the CPUs 100 to 103) flashes the data of the L1 cache memory 115 included therein to memories in the lower level (which correspond to the L2 cache memory 124, the DDR memory 20, the memory 21 and the internal memory 50). It is thereby possible to ensure cache coherency among the plurality of arithmetic circuits.

Further, in the first embodiment, one of a plurality of arithmetic circuits instructs execution of a scan test to a scan test circuit in response to an interrupt from another arithmetic circuit, and notifies an interrupt to another arithmetic circuit after executing the scan test in accordance with the instruction. It is thereby possible to execute the scan tests of the plurality of arithmetic circuit without overlap in time. In other words, the arithmetic circuit where a scan test is not executed can continue the system processing. It is thereby possible to suppress the degradation of performance in the whole system.

Second Embodiment

Figure 12:
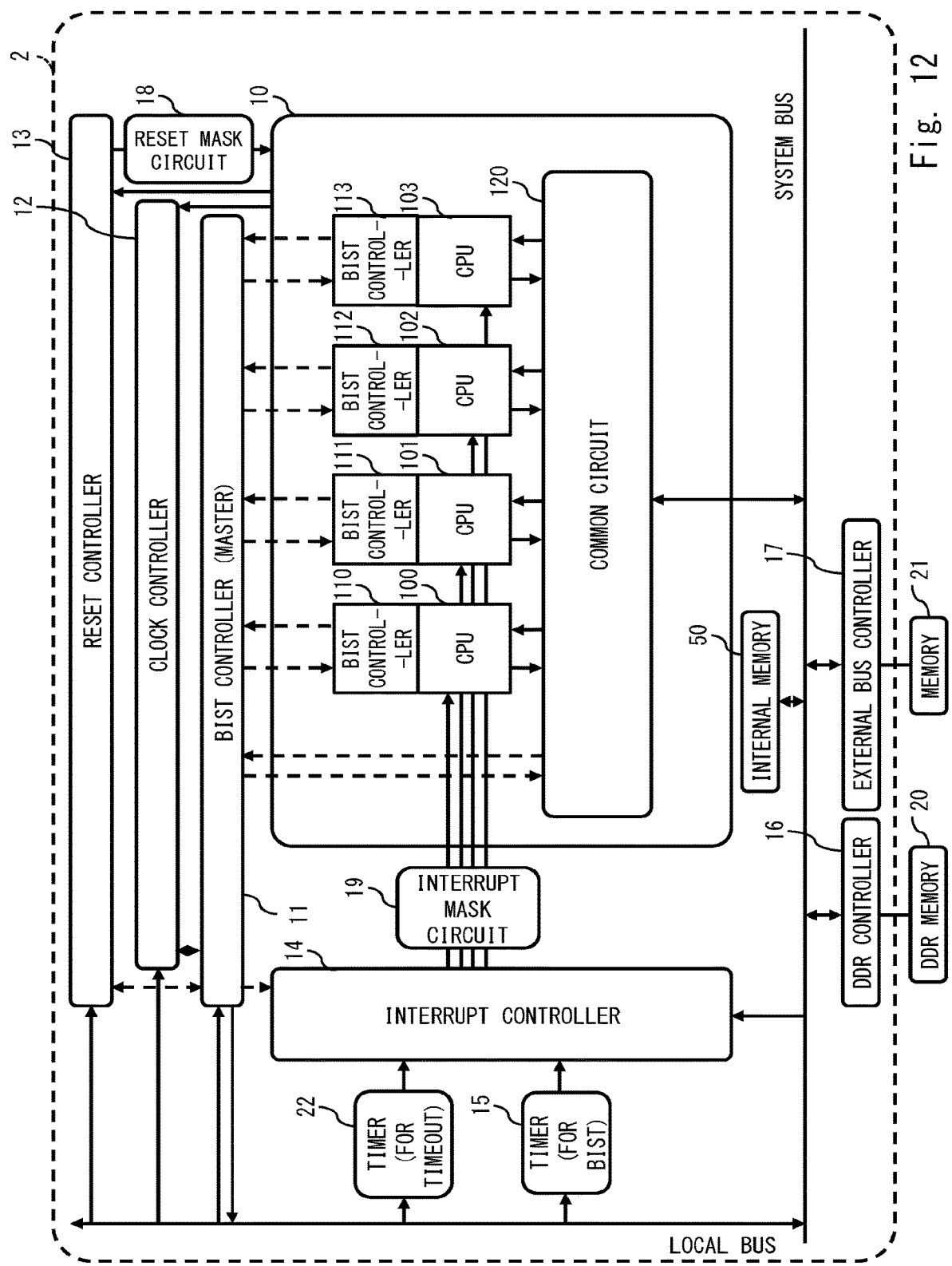
FIG. 12 is a block diagram showing a structure of a semiconductor apparatus according to a second embodiment.

A second embodiment is described hereinafter. In the description of the second embodiment below, the same matter as in the first embodiment described above is denoted by the same reference symbol or the like, and the description thereof is omitted as appropriate. As shown in FIG. 12, a semiconductor apparatus 2 according to the second embodiment further has a timer 22 in comparison with the semiconductor apparatus 1 according to the first embodiment.

The timer 22 is a circuit that measures the elapsed time from the start of a runtime test and notifies the CPU cluster 10, by an interrupt, of the timing when the elapsed time exceeds a time that is preset as a time to end the runtime test as a timeout.

Specifically, a runtime test does not always end normally. There is a possibility that a runtime test does not end normally due to failures of the BIST controllers 11, 110 to 113 and 121. Thus, when a runtime test does not end even after the elapse of a time to end the runtime test, it can be notified using the timer 22.

The period when the timeout is measured by the timer 22 may be set to an arbitrary period in advance. For example, referring to FIG. 7, the period may be (1) the period from the start to the end of a runtime test of each of the CPUs 100 to 103 and the common circuit 120 or (2) the period from the start of a runtime test of the CPU 103 to the end of a runtime test of the common circuit 120.

Period (1)

Figure 8:
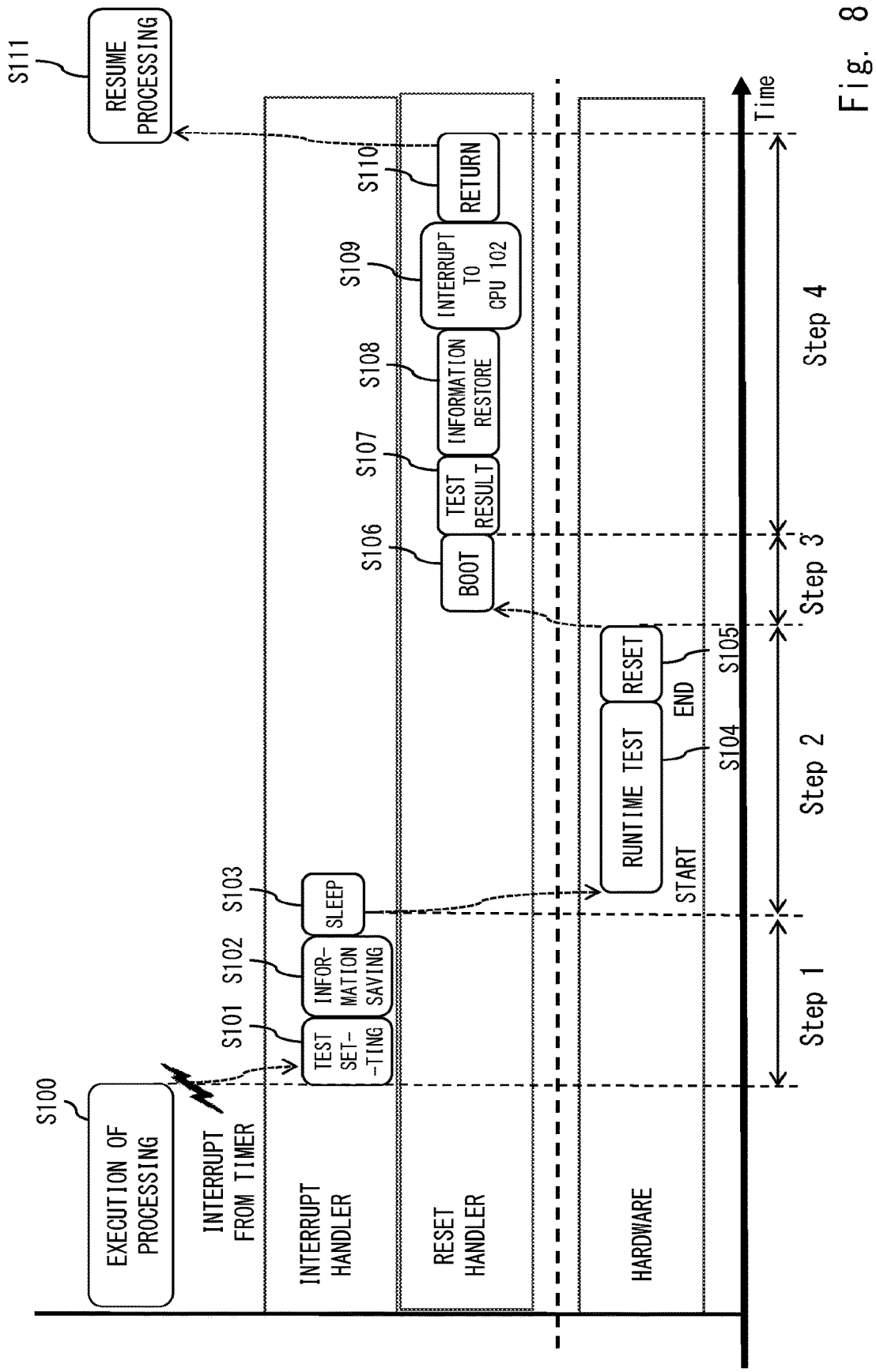
FIG. 8 is a timing chart showing an operation of the CPU according to the first embodiment during execution of a runtime test.
Figure 9:
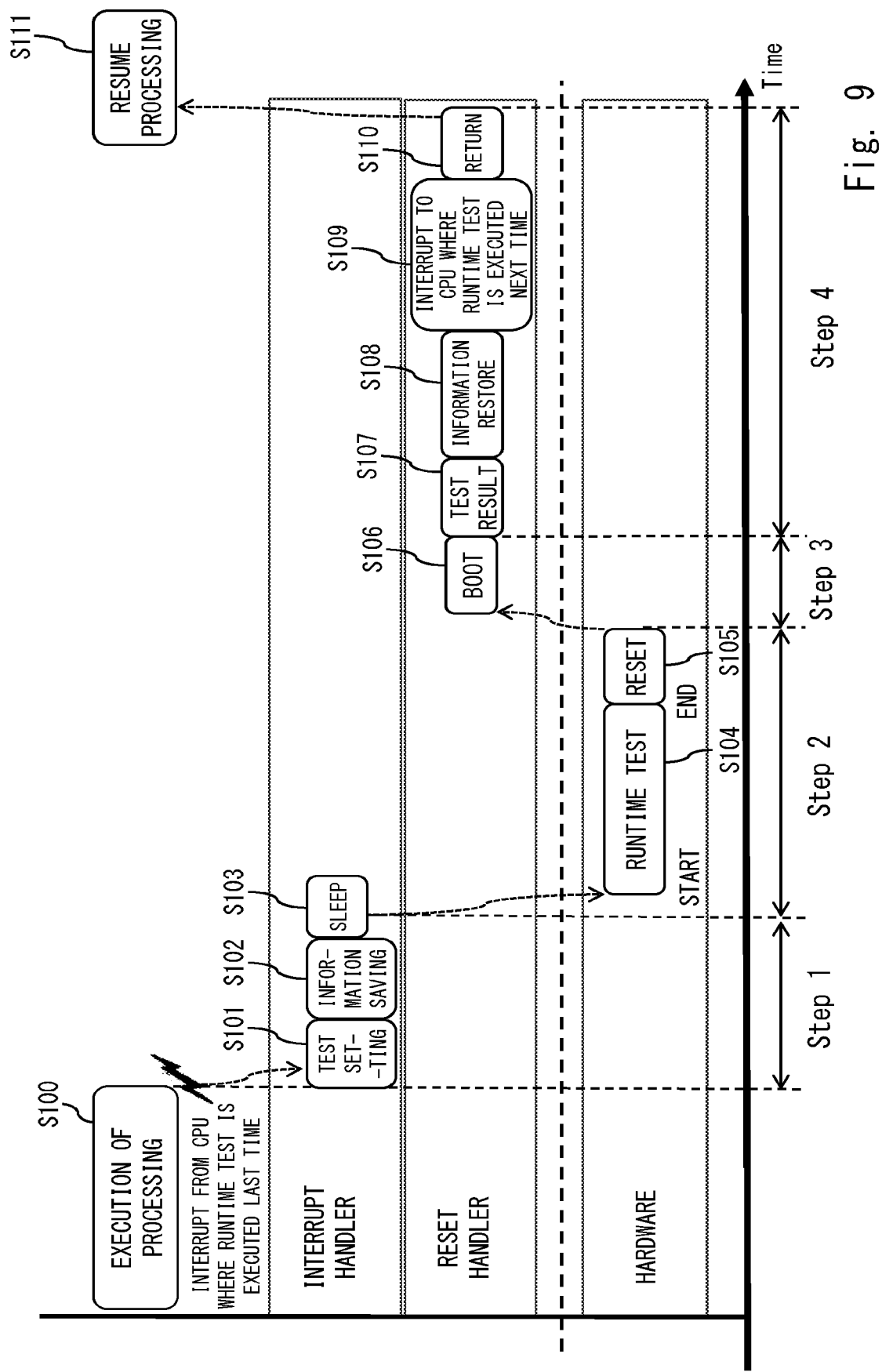
FIG. 9 is a timing chart showing an operation of the CPU according to the first embodiment during execution of a runtime test.
Figure 10:
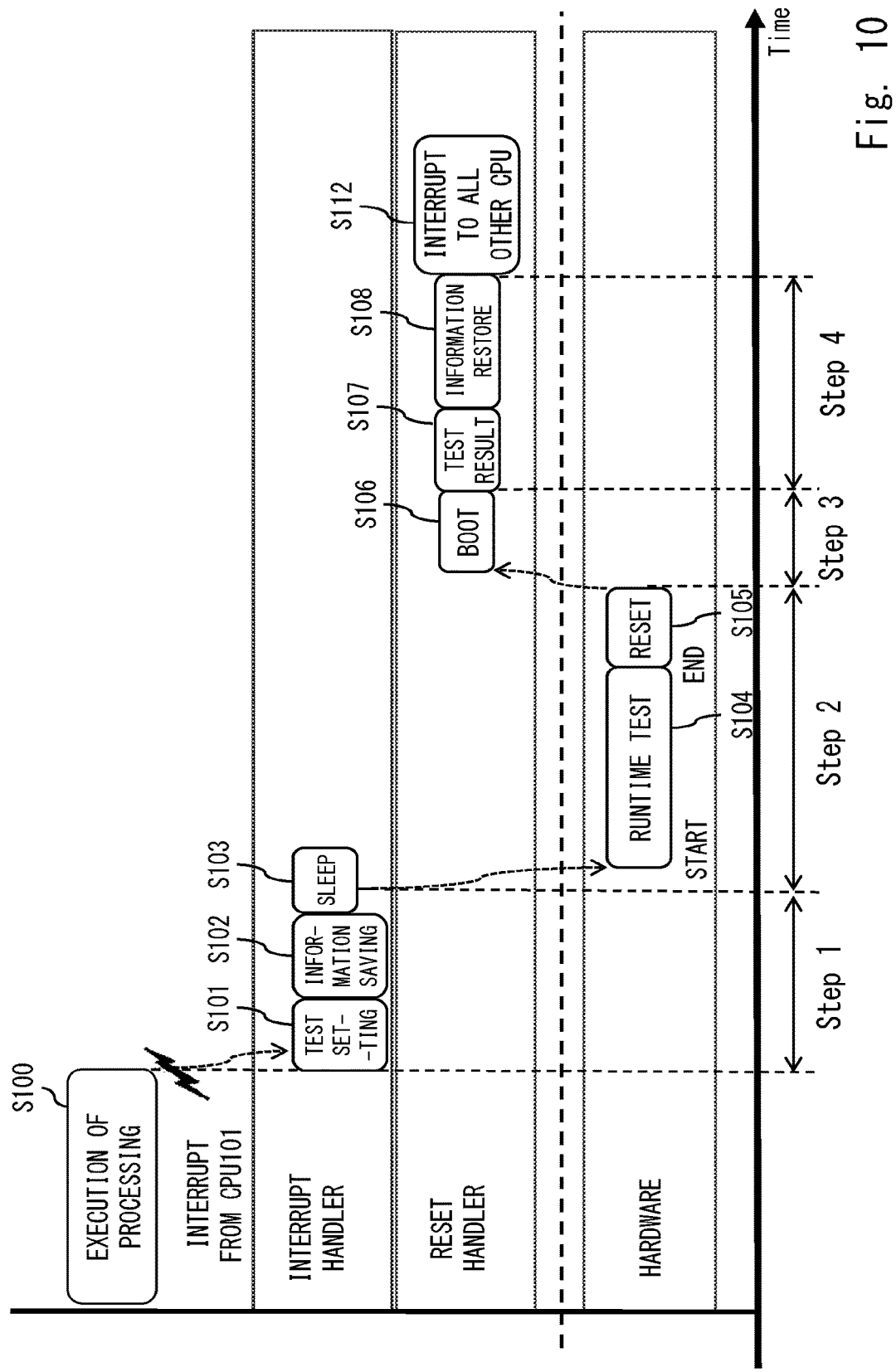
FIG. 10 is a timing chart showing an operation of the CPU according to the first embodiment during execution of a runtime test.

In the case of executing a runtime test of a CPU, each of the CPUs 100 to 103 sets a control register (not shown) of the timer 22 to start the measurement of a time (set the timer) through the system bus at the timing of Step S101 or S102 in FIGS. 8 to 10, for example. The timer 22 starts the measurement of a time based on this setting. Further, each of the CPUs 100 to 103 sets the control register of the timer 22 to stop the measurement of a time (cancel the timer) through the system bus at the timing of any of Steps S107 to S109 in FIGS. 8 to 10, for example. The timer 22 stops the measurement of a time based on this setting.

Further, each of the CPUs 100 to 103 sets the interrupt controller 14 through the system bus so that a circuit to which an interrupt signal corresponding to an interrupt from the timer 22 is to be notified is any of the CPUs other than itself or all of the CPUs 100 to 103, for example. Thus, even when each of the CPUs 100 to 103 is executing a runtime test, the processing in accordance with the timeout can be immediately performed by another CPU.

Figure 11:
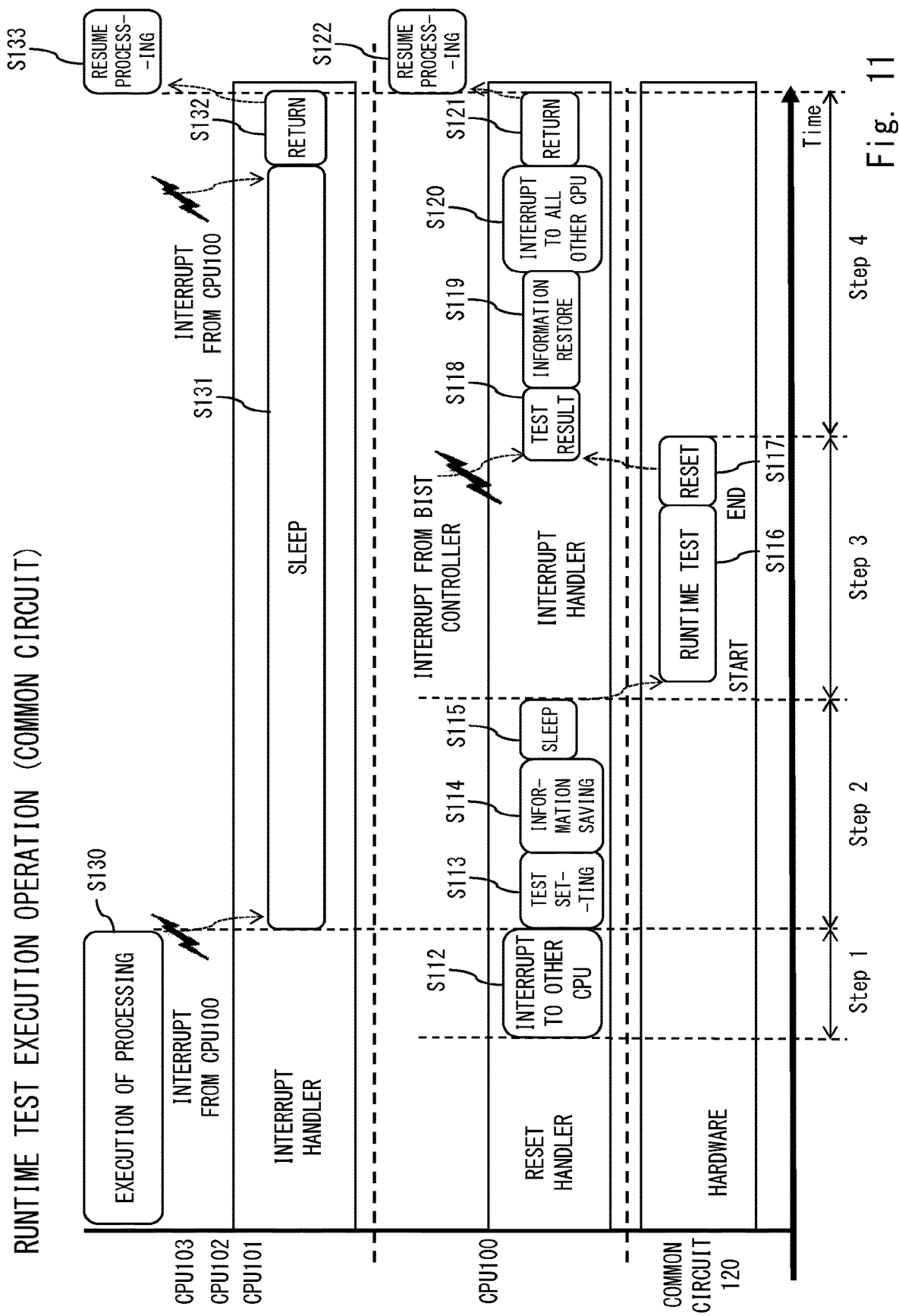
FIG. 11 is a timing chart showing an operation of the common circuit according to the first embodiment during execution of a runtime test.

In the case of executing a runtime test of the common circuit 120, the CPU 100 sets the control register of the timer 22 to start the measurement of a time (set the timer) through the system bus at the timing of any of Steps S112 to S114 in FIG. 11. The timer 22 starts the measurement of a time based on this setting. Further, the CPU 100 sets the control register of the timer 22 to stop the measurement of a time (cancel the timer) through the system bus at the timing of any of Steps S118 to S120 in FIG. 11, for example. The timer 22 stops the measurement of a time based on this setting.

Further, the CPU 100 sets the interrupt controller 14 through the system bus so that a circuit to which an interrupt signal corresponding to an interrupt from the timer 22 is to be notified is any one of the CPUs 100 to 103 or all of the CPUs 100 to 103, for example. Note that, however, in Step S25 of FIG. 6, the CPU 100 sets the interrupt controller 14 so as to output an interrupt signal corresponding to the interrupt from the timer 22 for the CPU to which the interrupt signal is to be notified. Further, in Step S25 of FIG. 6, the CPU 100 sets the interrupt mask circuit 19 so as not to mask the interrupt signal for the CPU to which the interrupt signal is to be notified.

Period (2)

The CPU 103 sets the control register of the timer 22 to start the measurement of a time (set the timer) through the system bus at the timing of Step S101 or S102 in FIG. 8, for example. The timer 22 starts the measurement of a time based on this setting. Further, the CPU 100 sets the control register of the timer 22 to stop the measurement of a time (cancel the timer) through the system bus at the timing of any of Steps S118 to S120 in FIG. 11, for example. The timer 22 stops the measurement of a time based on this setting.

Further, the CPU 103 sets the interrupt controller 14 through the system bus so that a circuit to which an interrupt signal corresponding to an interrupt from the timer 22 is to be notified is any one of the CPUs 100 to 103 or all of the CPUs 100 to 103, for example. Note that, however, in Step S25 of FIG. 6, the CPU 100 sets the interrupt controller 14 so as to output an interrupt signal corresponding to the interrupt from the timer 22 for the CPU to which the interrupt signal is to be notified. Further, in Step S25 of FIG. 6, the CPU 100 sets the interrupt mask circuit 19 so as not to mask the interrupt signal for the CPU to which the interrupt signal is to be notified. If the CPU to which the interrupt signal is to be notified is any one of the CPUs 100 to 103, the CPU to which the interrupt signal is to be notified cannot acquire the interrupt signal when that CPU is executing a runtime test. Thus, in the case of the period (2), it is preferred that at least two CPUs are set as the CPU to which the interrupt signal is to be notified.

When an interrupt signal corresponding to the timeout of the timer 22 is input, each of the CPUs 100 to 103 performs an anti-failure routine. As the anti-failure routine, processing that shuts down the whole system in the semiconductor apparatus 2 may be performed.

As described above, in the second embodiment, the semiconductor apparatus 2 includes the timer 22 that notifies a timeout when the execution time of a runtime test exceeds a specified time. Then, the processing circuit 92 (which corresponds to the CPUs 100 to 103, the L2 cache controller 123 and the snoop control unit 125) sets the timer 22 at the start of a scan test on the processing circuit 92 and cancels the timer at the end of the scan test on the processing circuit 92. Thus, when a scan test stops due to a failure in the scan test circuit (which corresponds to the BIST controllers 11, 110 to 113 and 121) that executes the scan test, the failure can be detected.

Third Embodiment

Figure 13:
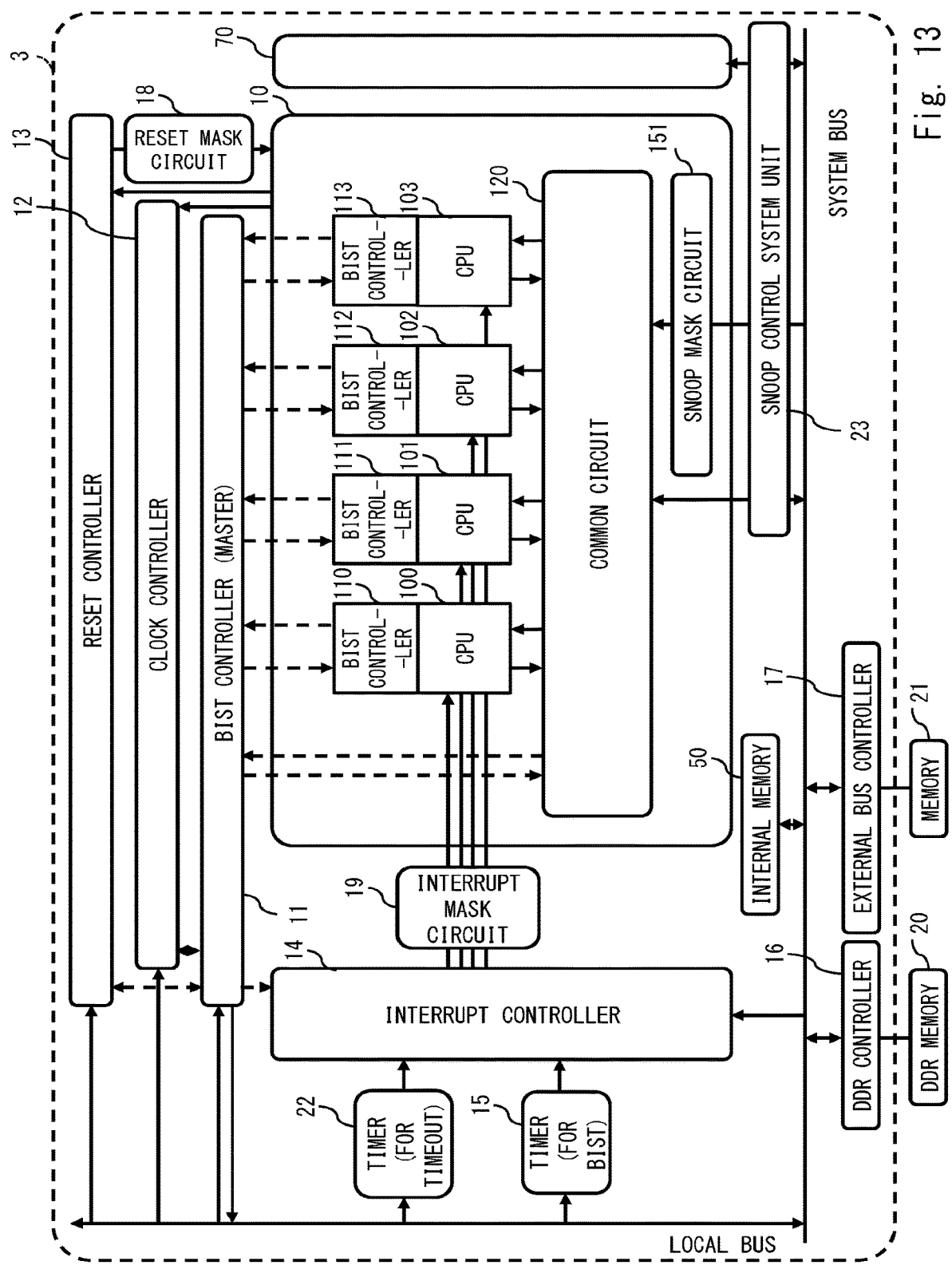
FIG. 13 is a block diagram showing a structure of a semiconductor apparatus according to a third embodiment.
Figure 14:
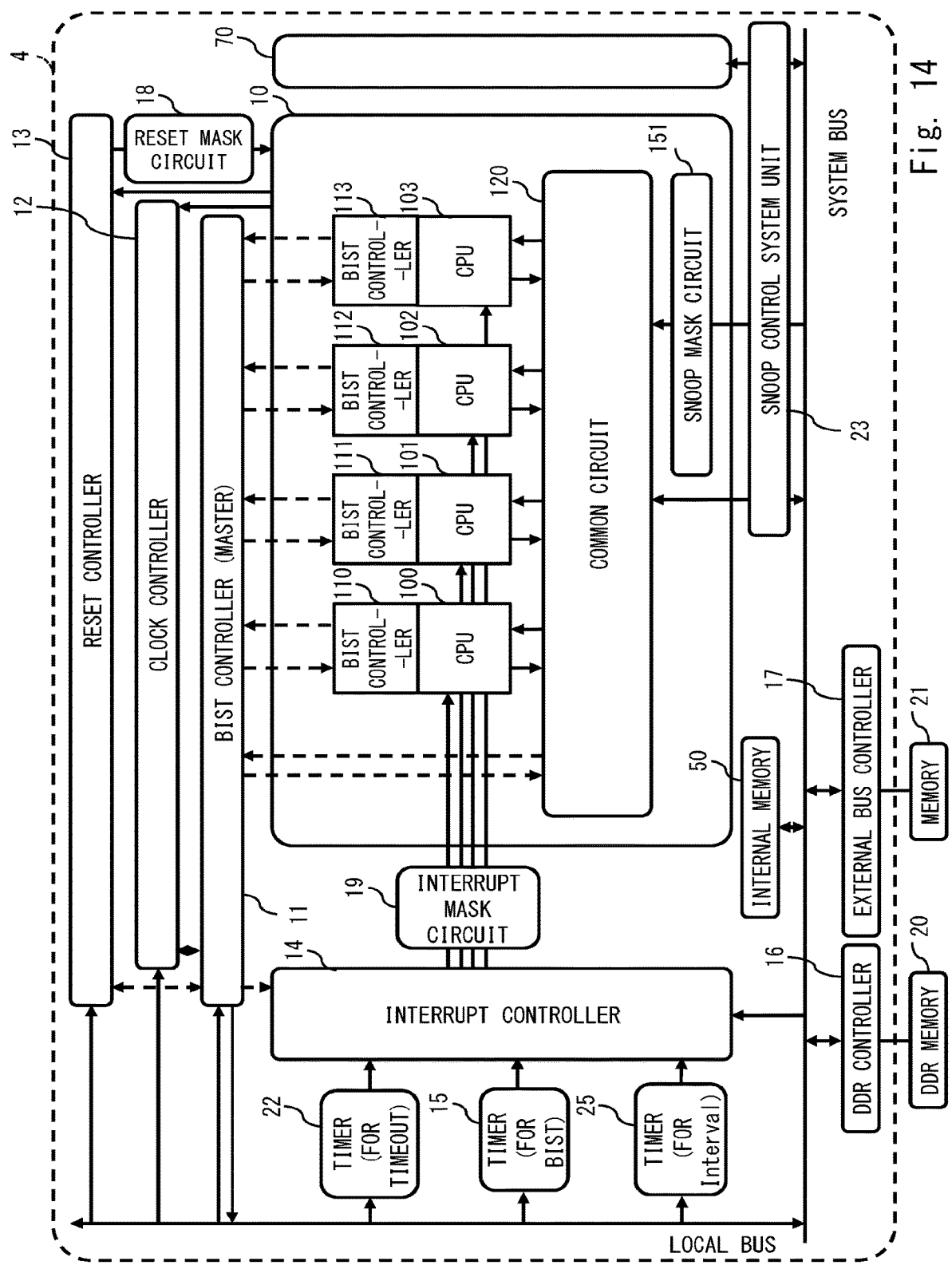
FIG. 14 is a block diagram showing a structure of a semiconductor apparatus according to a fourth embodiment.

A third embodiment is described hereinafter. In the description of the third embodiment below, the same matter as in the first and second embodiments described above is denoted by the same reference symbol or the like, and the description thereof is omitted as appropriate. As shown in FIG. 13, a semiconductor apparatus 3 according to the third embodiment further has a snoop control system unit 23 in comparison with the semiconductor apparatus 2 according to the second embodiment. Further, the semiconductor apparatus 3 according to the third embodiment includes a plurality of CPU clusters 10 and 70. Furthermore, the CPU cluster 10 according to the third embodiment further has a snoop mask circuit 151 in comparison with the CPU cluster 10 according to the second embodiment. Note that, because the structure of the CPU cluster 70 is the same as that of the CPU cluster 10, the description thereof is omitted. Further, although the case where the semiconductor apparatus 3 includes two CPU clusters 10 and 70 is described as an example in FIG. 13, the number of CPU clusters is not limited thereto.

The snoop control system unit 23 is connected to the system bus. The snoop control system unit 23 performs control that ensures cache coherency of the L1 cache memory 115 and the L2 cache memory 124 between the plurality of CPU clusters 10 and 70 by snooping.

The third embodiment is different from the first and second embodiments in that, when data that is requested to be read by the CPUs 100 to 103 cannot be acquired from any of the L2 cache memory 124 and the snoop control unit 125, the L2 cache controller 123 of the common circuit 120 outputs a read request signal that requests reading of the data to the snoop control system unit 23.

In the case where a read request signal is input from any of the plurality of CPU clusters 10 and 70 (which is the CPU cluster 10 in this example), the snoop control system unit 23 determines whether the data requested by the read request signal is stored in the CPU cluster 70 which is different from the CPU cluster 10 that has made the request. When the snoop control system unit 23 determines that the data is stored in the CPU cluster 70 which is different from the CPU cluster 10 that has made the request, it requests the data to the CPU cluster 70 having that data. To be more specific, the snoop control system unit 23 outputs a snoop request signal that requests the data to the CPU cluster 70. In response to the snoop request signal, the L2 cache controller 123 of the common circuit 120 in the CPU cluster 70 acquires the data requested by the snoop request signal from the L2 cache memory 124.

On the other hand, when the data is not stored in the L2 cache memory 124, the snoop control unit 125 of the common circuit 120 in the CPU cluster 70 outputs a snoop request signal that requests the data to a CPU having the data in the CPU cluster 70. In response to the snoop request signal, the L1 cache controller 114 of that CPU acquires the data requested by the snoop request signal from the L1 cache memory 115 and outputs a snoop response signal containing the data to the common circuit 120. The snoop control unit 125 acquires the data contained in the snoop response signal. Then, the L2 cache controller 123 outputs the snoop response signal containing the data acquired from the L2 cache memory 124 or by control of the snoop control unit 125 to the snoop control system unit 23.

The snoop control system unit 23 acquires the data contained in the snoop response signal output from the CPU cluster 70. The snoop control system unit 23 outputs a read response signal containing the acquired data to the CPU cluster 10 that has output the read request signal. The CPU cluster 10 that has output the read request signal can thereby acquire the data requested by the read request signal.

On the other hand, when the snoop control system unit 23 cannot acquire the data from the CPU cluster 70, it outputs the read request signal to the external bus controller 17 through the system bus. In response to the read request signal, the external bus controller 17 outputs a read response signal containing the data acquired from the memory 21 to the snoop control system unit 23 through the system bus. The snoop control system unit 23 acquires the data contained in the read response signal.

The snoop control system unit 23 outputs the data acquired from the other CPU cluster 70 or the memory 21 to the common circuit 120 that has made the request. To be specific, the snoop control system unit 23 outputs a read response signal containing the acquired data to the CPU 100 that has made the request.

Further, in the case where a write request signal is input from any of the plurality of CPU clusters 10 and 70 (which is the CPU cluster 10 in this example), the snoop control system unit 23 determines whether the data requested by the write request signal is stored in the CPU cluster 70 which is different from the CPU cluster 10 that has made the request. When the snoop control system unit 23 determines that the data is stored in the CPU cluster 70 which is different from the CPU cluster 10 that has made the request, it requests the CPU cluster 70 having that data to invalidate the data. To be more specific, the snoop control system unit 23 outputs a snoop request signal that requests the invalidation of the data to the CPU cluster 70. In response to the snoop request signal, the L2 cache controller 123 of the common circuit 120 in the CPU cluster 70 invalidates the data requested by the snoop request signal in the L2 cache memory 124. The data is thereby deleted from the L2 cache memory 124 and treated as not existing in the L2 cache memory 124.

Further, the snoop control unit 125 of the common circuit 120 in the CPU cluster 70 outputs a snoop request signal that requests the invalidation of the data to a CPU having the data in the CPU cluster 70. In response to the snoop request signal, the L1 cache controller 114 of that CPU invalidates the data requested to be invalidated by the snoop request signal in the L1 cache memory 115.

Further, the snoop control system unit 23 outputs the write request signal to the external bus controller 17 and stores the data into the memory 21.

To determine whether or not the data is stored in the CPU cluster 70 which is different from the CPU cluster 10 that has made the request, the snoop control system unit 23 may include a SCU tag RAM (not shown) that stores information indicating which address in the memory 21 corresponds to each of the data stored in the plurality of CPU clusters 10 and 70 and performs control in the same way as the snoop control unit 125 and the SCU tag RAM 126. Further, in the case where the snoop control system unit 23 does not include a SCU tag RAM, a snoop request signal may be output to all the CPU cluster 70 other than the CPU cluster 10 that has made the request.

Note that, although the case where control is performed on a read request and a write request from the CPU cluster 10 is described as an example, a read request and a write request from the CPU cluster 70 may be controlled in the same manner. Further, although the case where the snoop control system unit 23 controls the data in the memory 21 is described as an example, the data in the DDR memory 20 and the internal memory 50 may be controlled in the same manner. The same applies to the following description.

The snoop mask circuit 151 is a circuit that masks (blocks off) the snoop request signal that is input from the snoop control system unit 23 to the common circuit 120. Whether the snoop mask circuit 151 masks (blocks off) the snoop request signal can be set arbitrary to the snoop mask circuit 151. This setting is made by setting a value indicating whether or not to mask the snoop request signal to the snoop mask circuit 151 or a control register (not shown) included in the clock controller 12. Further, this setting can be changed at arbitrary timing by control of the BIST controller 121.

Referring back to FIG. 6, at the timing of Step S27, the BIST controller 121 sets the snoop mask circuit 151 so as to mask the snoop request signal. Further, at the timing of Step S29, the BIST controller 121 sets the snoop mask circuit 151 so as to cancel the masking of the snoop request signal. Note that, as a result of the cancellation of masking, the processing of the snoop request signal that has been masked is started by the common circuit 120.

It is thereby possible to prevent that the common circuit 120 where a runtime test is executed performs an unintended operation by a snoop request signal from the other CPU cluster 70 during execution of a runtime test of the common circuit 120 in the CPU cluster 10. Note that the snoop request signal is normally processed after it is waited until the masking by the snoop mask circuit 151 is cancelled.

Note that, although the embodiment in which the snoop control system unit 23 and the snoop mask circuit 151 are added and a plurality of CPU clusters 10 and 70 are included in the structure of the second embodiment is described as the third embodiment, the present invention is not limited thereto. For example, this structure may be applied to the first embodiment.

As described above, in the third embodiment, the semiconductor apparatus 3 includes a plurality of processing circuits 92 (which corresponds to the CPUs 100 to 103, the L2 cache controller 123 and the snoop control unit 125). Then, each of the plurality of processing circuits 92 includes a mask circuit (which corresponds to the snoop mask circuit 151) that blocks off the signal that is output from a second coherency circuit (which corresponds to the snoop control system unit 23) to the common circuit 120 having a first coherency control circuit (which corresponds to the snoop control unit 125) when executing a scan test on the common circuit 120 having the first coherency control circuit. It is thereby possible to suspend the transaction related to processing circuit 92 (the CPU clusters 10 and 70) during execution of a runtime test and then resume the transaction after the end of the runtime test, thereby preventing a disadvantage in the system.

Fourth Embodiment

A fourth embodiment is described hereinafter. In the description of the fourth embodiment below, the same matter as in the first and third embodiments described above is denoted by the same reference symbol or the like, and the description thereof is omitted as appropriate.

The fourth embodiment is different from the first to third embodiments in that the runtime tests of the CPUs 100 to 103 and the common circuit 120 are performed by being split, not at a time. A semiconductor apparatus 4 according to the fourth embodiment further includes a timer 25 in comparison with the semiconductor apparatus 3 according to the third embodiment. Hereinafter, each of units obtained by splitting a runtime test in the DTI is referred to as "split test".

The timer 25 is a circuit that measures the elapsed time from the end of a split test and, when the elapsed time exceeds a time that is preset as a time to start the next split test, notifies, by an interrupt, that it reaches the timing to start the split test to the CPU that is executing a runtime test of itself or the common circuit 120 by splitting the test.

An example of splitting a runtime test according to the fourth embodiment is described with reference to FIG. 15. A runtime test may be performed by being split into a predetermined number of parts. The example of FIG. 15 shows the case where a runtime test is split into three split test.

In the fourth embodiment, a runtime test for each of a plurality of units obtained by splitting a plurality of test patterns used for a runtime test in DTI is performed as a split test. For example, in the case where a runtime test target circuit includes two logic circuits and three storage circuits as shown in FIG. 15, a plurality of test patterns used for the runtime test may be split into a unit to be used for a scantest of one logic circuit ("SCAN-1" in FIG. 15), a unit to be used for a scantest of the other logic circuit ("SCAN-2" in FIG. 15), and a unit to be used for MBIST of three storage circuits ("MBIST" in FIG. 15). Then, a split test is executed for each unit as shown in FIG. 15.

Figure 15:
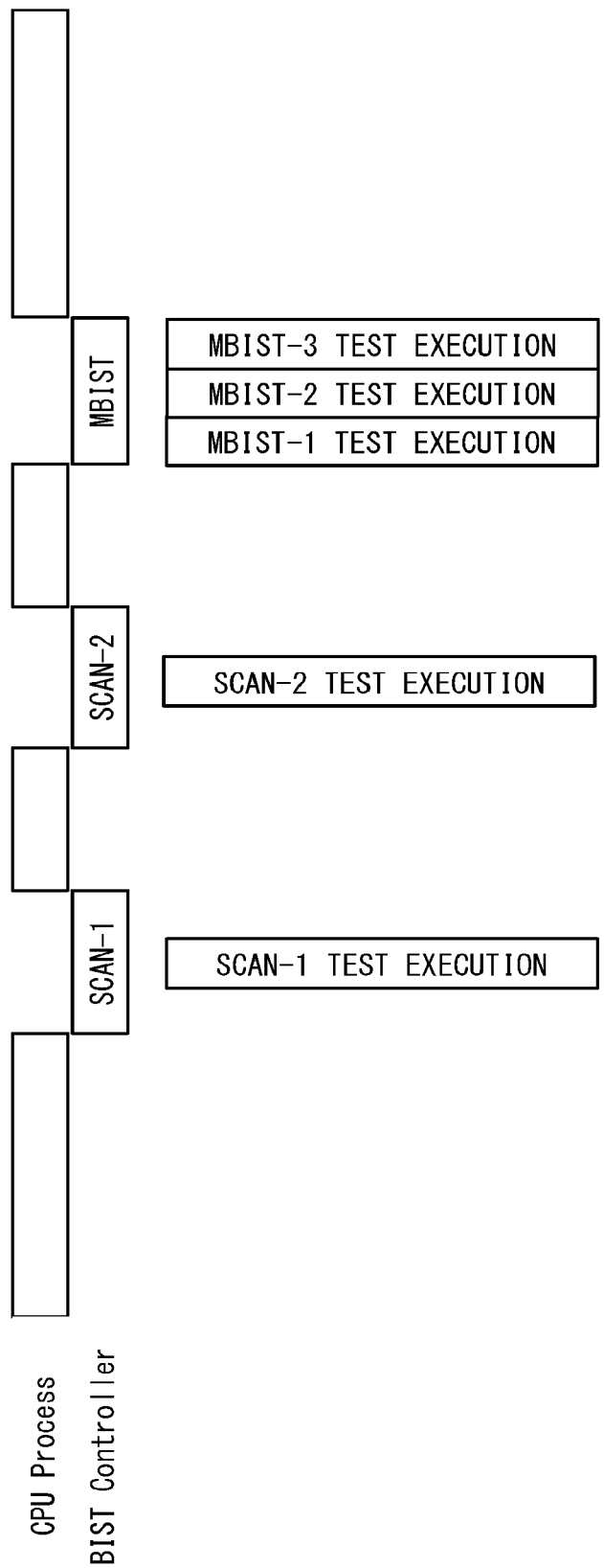
FIG. 15 is a view showing an example of split of a runtime test according to the fourth embodiment.

Note that the number of logic circuits on which a scan test is executed in one split test and the number of storage circuits on which MBIST is executed in one split test are not limited to the example shown in FIG. 15. Further, the number of logic circuits on which a scan test is executed in a certain split test and the number of storage circuits on which a scan test is executed in another split test may be different. Likewise, the number of storage circuits on which MBIST is executed in a certain split test and the number of storage circuits on which MBIST is executed in another split test may be different.

Alternatively, a group of test patterns that are used for performing a scan test of all the logic circuits included in a circuit as a target of a runtime test may be split into a plurality of units, and each of the split units may be used for a scan test in one split test. Further, a group of test patterns that are used for performing MBIST of the storage circuits included in a circuit as a target of a runtime test may be split into a plurality of units, and each of the split units may be used for MBIST in one split test.

The number of test patterns to be used in each split test may be set by each of the CPUs 100 to 103 to the control register included in the BIST controller 11 through the system bus so that the BIST controller 11 can recognize it.

For example, it is assumed that, for the CPU 100, three split tests are performed for each of two logic circuits and one storage circuit as shown in FIG. 15. In this case, before the start of the first split test, the CPU 100 sets the number of test patterns to be used for a runtime test of the first logic circuit in Step S1 in FIG. 5 to the control register of the BIST controller 11 through the system bus. Further, before the start of the second split test, the CPU 100 sets the number of test patterns to be used for a runtime test of the second logic circuit in Step S1 in FIG. 5 to the control register of the BIST controller 11 through the system bus. Before the start of the third split test, the CPU 100 sets the number of test patterns to be used for a runtime test of the storage circuit in Step S1 in FIG. 5 to the control register of the BIST controller 11 through the system bus. Then, the BIST controller 110 creates test patterns corresponding to the number of test patterns set to the control register of the BIST controller 11 and executes a runtime test.

Figure 16:
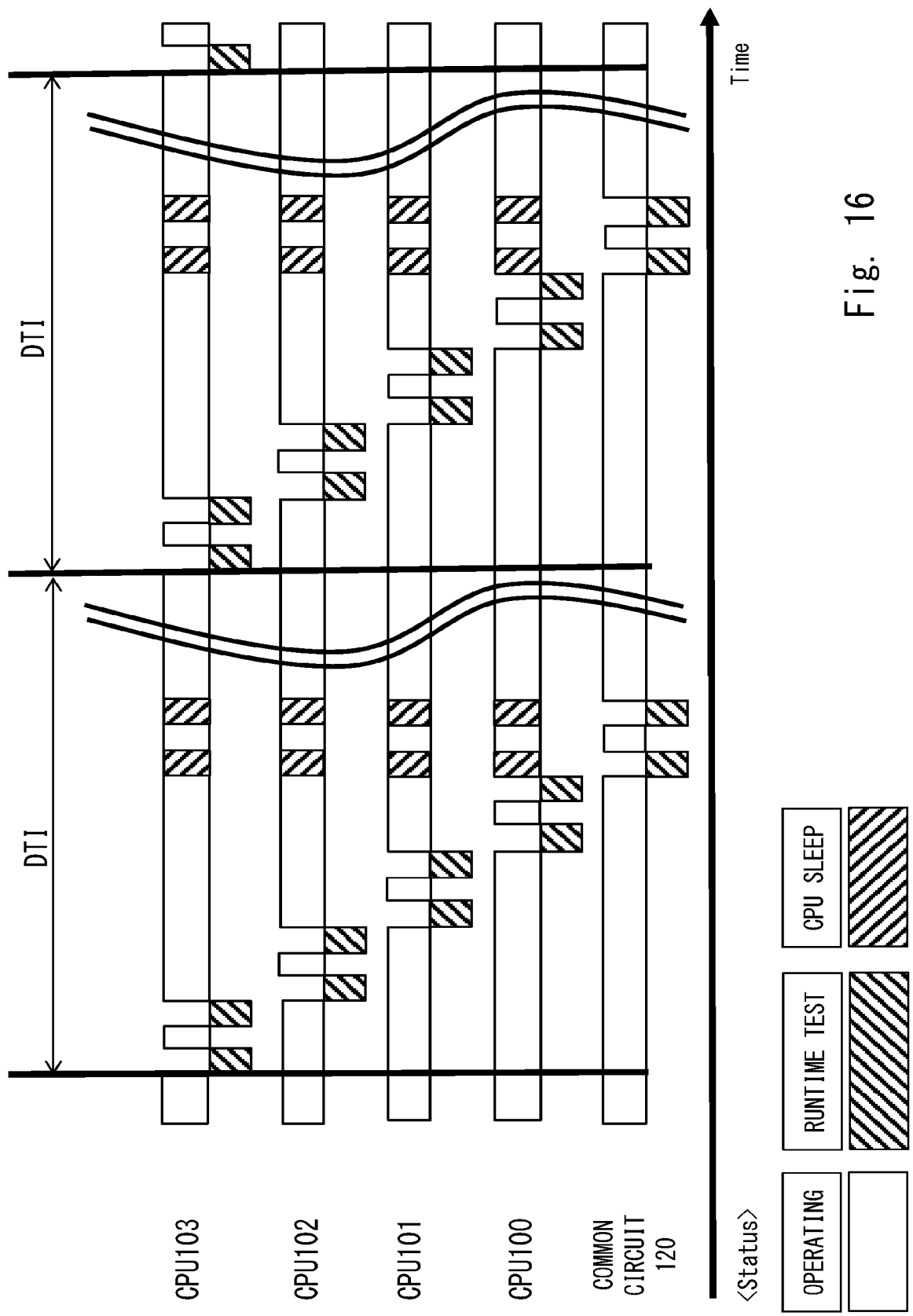
FIG. 16 is a timing chart showing an operation of a CPU cluster according to the fourth embodiment during execution of a runtime test.

The operation of the CPU cluster 10 according to the fourth embodiment during execution of a runtime test is described hereinafter with reference to FIG. 16. The example of FIG. 16 shows the case where a runtime test is split into two split tests and performed.

In a system where a real-time response is required, a test time should not exceed an interrupt response time limit. The interrupt response time limit indicates a time that the CPUs 100 to 103 should detect an interrupt and start processing in accordance with the interrupt at least before exceeding that time after the occurrence of the interrupt. Thus, in the fourth embodiment, each of runtime tests of the CPUs 100 to 103 and the common circuit 120 is split into split tests that can be carried out within the interrupt response time limit and executed as show in FIG. 16.

In response to the interrupt from the timer 15, the CPU 103 suspends its processing and executes the first split test of itself in accordance with the procedure shown in FIG. 5. At this time, each of the other CPUs 100 to 102 continues to perform their processing. After the end of execution of the first split test, the CPU 103 resumes its processing and sets the timer 25 to start the measurement of a time (set the timer) through the system bus. The timer 25 starts the measurement of a time based on this setting.

In response to the interrupt from the timer 25, the CPU 103 suspends its processing and executes the second split test of itself in accordance with the procedure shown in FIG. 5. At this time, each of the other CPUs 100 to 102 continues to perform their processing. After the end of execution of the second split test, the CPU 103 resumes its processing and notifies a CPU interrupt to the CPU 102.

In response to the CPU interrupt from the CPU 103, the CPU 102 suspends its processing and executes the first split test of itself in accordance with the procedure shown in FIG. 5. At this time, each of the other CPUs 100 to 101 and 103 continues to perform their processing. After the end of execution of the first split test, the CPU 102 resumes its processing and sets the timer 25 to start the measurement of a time (set the timer) through the system bus. The timer 25 starts the measurement of a time based on this setting.

In response to the interrupt from the timer 25, the CPU 102 suspends its processing and executes the second split test of itself in accordance with the procedure shown in FIG. 5. At this time, each of the other CPUs 100 to 101 and 103 continues to perform their processing. After the end of execution of the second split test, the CPU 102 resumes its processing and notifies a CPU interrupt to the CPU 101.

In response to the CPU interrupt from the CPU 102, the CPU 101 suspends its processing and executes the first split test of itself in accordance with the procedure shown in FIG. 5. At this time, each of the other CPUs 100 and 102 to 103 continues to perform their processing. After the end of execution of the first split test, the CPU 101 resumes its processing and sets the timer 25 to start the measurement of a time (set the timer) through the system bus. The timer 25 starts the measurement of a time based on this setting.

In response to the interrupt from the timer 25, the CPU 101 suspends its processing and executes the second split test of itself in accordance with the procedure shown in FIG. 5. At this time, each of the other CPUs 100 and 102 to 103 continues to perform their processing. After the end of execution of the second split test, the CPU 101 resumes its processing and notifies a CPU interrupt to the CPU 100.

In response to the CPU interrupt from the CPU 101, the CPU 100 suspends its processing and executes the first split test of itself in accordance with the procedure shown in FIG. 5. At this time, each of the other CPUs 101 to 103 continues to perform their processing. After the end of execution of the first split test, the CPU 100 resumes its processing and sets the timer 25 to start the measurement of a time (set the timer) through the system bus. The timer 25 starts the measurement of a time based on this setting.

In response to the interrupt from the timer 25, the CPU 100 suspends its processing and executes the second split test of itself in accordance with the procedure shown in FIG. 5. At this time, each of the other CPUs 101 to 103 continues to perform their processing.

After the end of execution of the second split test, the CPU 100 executes the first split test of the common circuit 120 in accordance with the procedure shown in FIG. 6. At this time, each of all the CPUs 100 to 103 that share the common circuit 120 enters the sleep mode and suspends their processing as described above. After the end of execution of the first split test, the CPU 100 resumes its processing and sets the timer 25 to start the measurement of a time (set the timer) through the system bus. The timer 25 starts the measurement of a time based on this setting.

In response to the interrupt from the timer 25, the CPU 100 executes the second split test of the common circuit 120 in accordance with the procedure shown in FIG. 6. At this time, each of all the CPUs 100 to 103 that share the common circuit 120 enters the sleep mode and suspends their processing as described above. After the end of execution of the second split test, the CPU 100 resumes its processing.

As described above, in the case where a runtime test is split into N number of split tests (N is a positive integer of 2 or above), the CPU 103 executes the first split test in response to an interrupt from the timer 15 and executes the second to Nth split tests in response to an interrupt from the timer 25. Further, the CPU 103 sets the timer 25 after execution of the first to (N−1)th split test, and notifies a CPU interrupt to the CPU 102, which is the next test target, after execution of the Nth split test.

Each of the 102 and 101 executes the first split test in response to a CPU interrupt from the CPU having executed a runtime test last time, and executes the second to Nth split tests in response to an interrupt from the timer 25. Further, each of the 102 and 101 sets the timer 25 after execution of the first to (N−1)th split test, and notifies a CPU interrupt to the CPU 101 or 100, which is the next runtime test target, after execution of the Nth split test.

The CPU 100 executes the first split test in response to a CPU interrupt from the CPU 101 having executed a runtime test last time, and executes the second to Nth split tests in response to an interrupt from the timer 25. Further, the CPU 100 sets the timer 25 after execution of the first to (N−1)th split test, and performs control to execute a runtime test of the common circuit 120, which is the next runtime test target, after execution of the Nth split test.

The CPU 100 executes the first split test of the common circuit 120 after the runtime test of itself, and executes the second to Nth split test of the common circuit 120 in response to an interrupt from the timer 25. Further, the CPU 100 sets the timer 25 after execution of the first to (N−1)th split test.

Note that each of the CPUs 100 to 103 may determine whether it is after execution of the first to (N−1)th split test or after execution of the Nth split test by counting the number of times the split test is executed. The number of times the split test is executed may be stored in the DDR memory 20, the memory 21 or the internal memory 50, for example.

Figure 17:
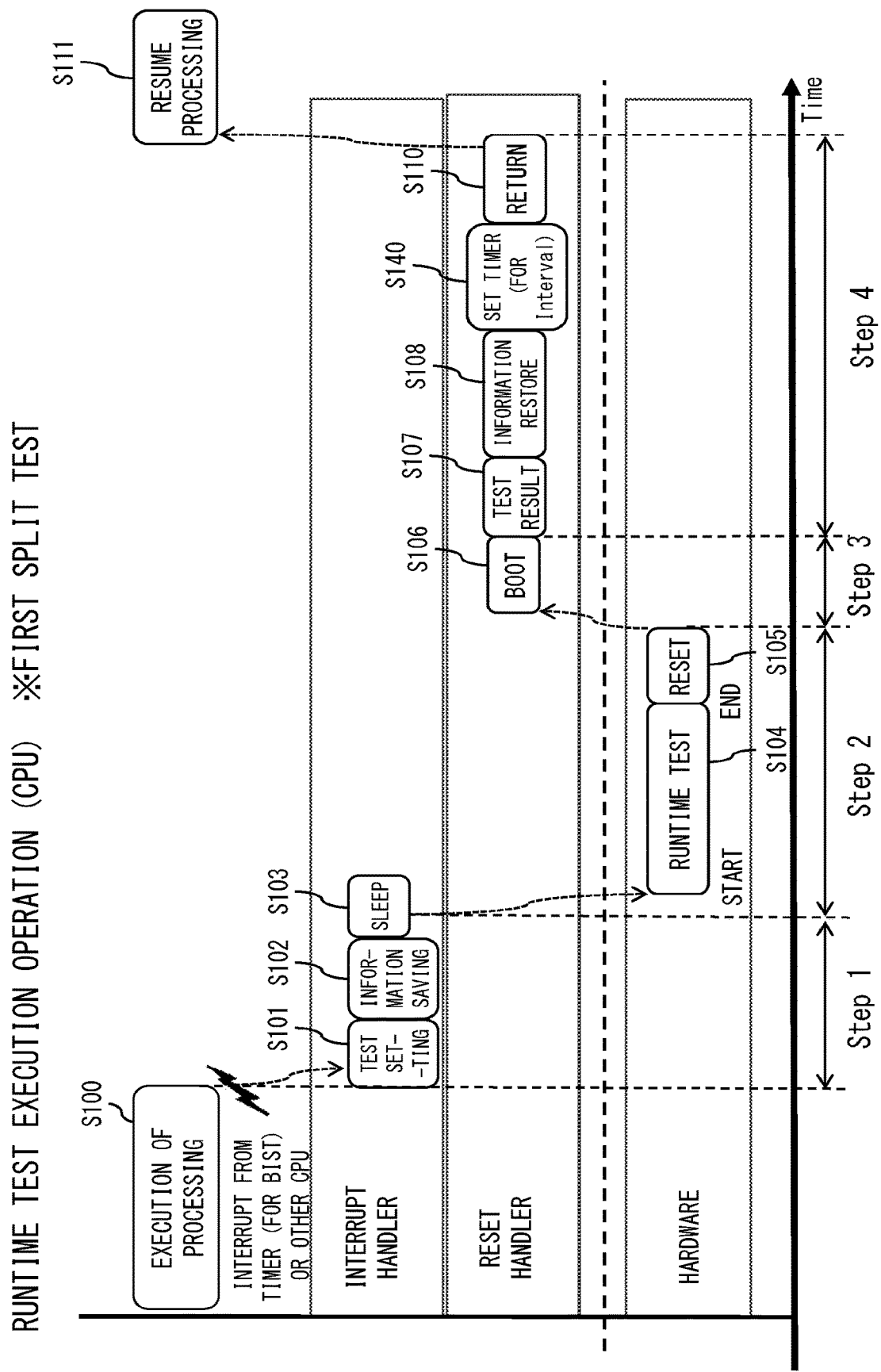
FIG. 17 is a timing chart showing an operation of a CPU according to the fourth embodiment during execution of a first split test.

The operation of the CPUs 100 to 103 according to the fourth embodiment during execution of the first split test is described hereinafter with reference to FIG. 17. In FIG. 17, the same processing as in the processing of FIGS. 8 to 10 is denoted by the same reference numeral, and the description thereof is omitted as appropriate.

When an interrupt notified during its processing (S100), each of the CPUs 100 to 103 executes an interrupt handler in accordance with the interrupt. In the interrupt handler in accordance with the interrupt, each of the CPUs 100 to 103 performs the processing of Steps S101 to S103, which is the same as in FIGS. 8 to 10. This interrupt is an interrupt from the timer 15 for the CPU 103, and it is a CPU interrupt from the CPU 103 to 101 having executed a runtime test last time for the CPUs 102 to 100.

On the other hand, each of the CPUs 100 to 103 performs Steps S110 and S111 after setting the timer 25 (S140) after execution of Steps S106 to S108 in the reset handler, which is different from FIGS. 8 to 10.

Figure 18:
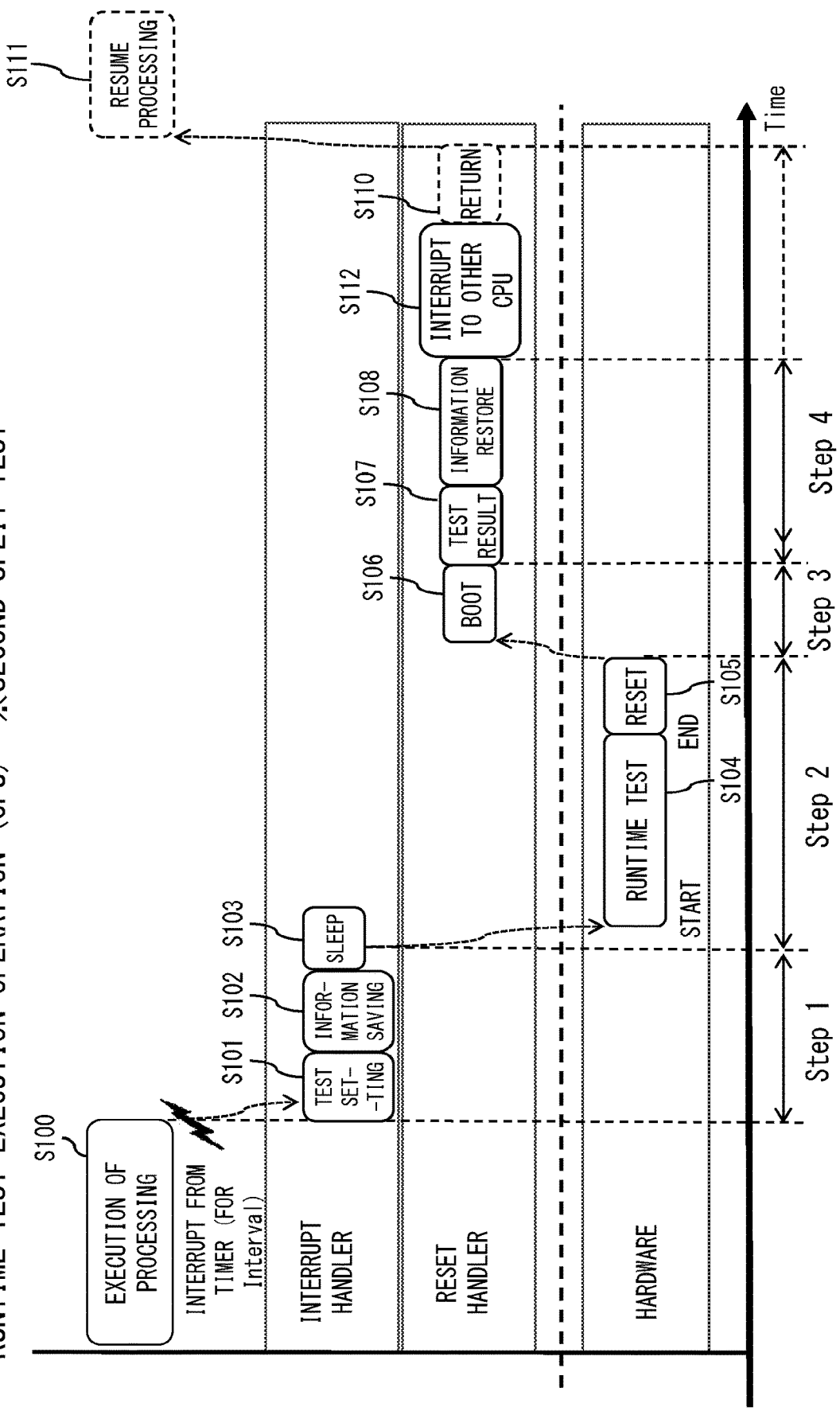
FIG. 18 is a timing chart showing an operation of the CPU according to the fourth embodiment during execution of a second split test.

The operation of the CPUs 100 to 103 according to the fourth embodiment during execution of the second to Nth split test is described hereinafter with reference to FIG. 18. In FIG. 18, the same processing as in the processing of FIGS. 8 to 10 and 17 is denoted by the same reference numeral, and the description thereof is omitted as appropriate.

When an interrupt is notified from the timer 25 during its processing (S100), each of the CPUs 100 to 103 executes an interrupt handler in accordance with the interrupt. In the interrupt handler in accordance with the interrupt, each of the CPUs 100 to 103 performs the processing of Steps S101 to S103, which is the same as in FIGS. 8 to 10 and 17.

Each of the CPUs 100 to 103 notifies an interrupt to the other CPU after execution of Steps S106 to S108 in the reset handler (S141). This interrupt is a CPU interrupt to the CPU which is the next runtime test target (S109) in the same manner as in FIGS. 8 and 9 for the CPUs 101 to 103, and it is a CPU interrupt to the other CPUs 101 to 103 (S112) in the same manner as in FIG. 10 for the CPU 100. Further, for the CPUs 101 to 103, Steps S110 and S111 are performed after Step S141 in the same manner as in FIGS. 8 and 9, whereas, for the CPU 10, Steps S110 and S111 are not performed after Step S141 in the same manner as in FIG. 10 and control that executes a runtime test of the common circuit 120 is performed.

Note that, in the case of splitting a runtime test into three or more split tests, it is obvious that the operation during execution of the second to (N−1)th split test is the operation that performs Step S140 in place of Step S141 in FIG. 18, and the detailed description thereof is omitted.

Figure 19:
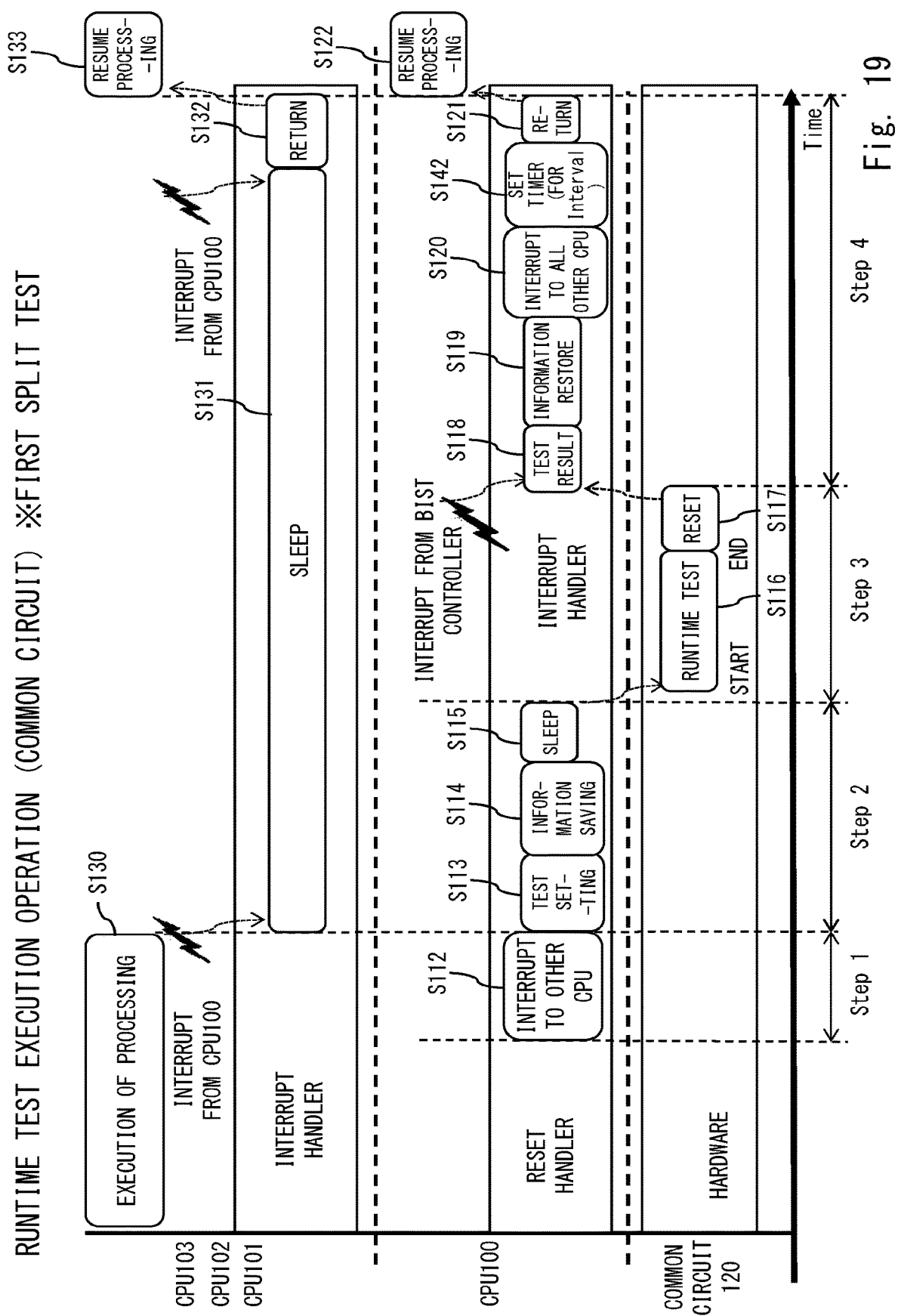
FIG. 19 is a timing chart showing an operation of a common circuit according to the fourth embodiment during execution of a first split test.

The operation of the common circuit 120 according to the fourth embodiment during execution of the first split test is described hereinafter with reference to FIG. 19. In FIG. 19, the same processing as in the processing of FIG. 11 is denoted by the same reference numeral, and the description thereof is omitted as appropriate.

The CPU 100 performs Steps S112 to S115 in the reset handler as in FIG. 11. On the other hand, the CPU 100 performs Steps S121 and S122 after setting the timer 25 (S142) after execution of Steps S118 to S120 in the interrupt handler, which is different from FIG. 11.

The operation of the common circuit 120 according to the fourth embodiment during execution of the second split test is described hereinafter with reference to FIG. 20 In FIG. 20, the same processing as in the processing of FIGS. 11 and 19 is denoted by the same reference numeral, and the description thereof is omitted as appropriate.

When an interrupt from the timer 25 is notified during its processing (S143), the CPU 100 executes an interrupt handler in accordance with the interrupt. The CPU 100 performs the processing of Steps S112 to S115 in the interrupt handler in the same manner as in FIGS. 11 and 19. Note that the processing is performed not in the reset handler but in the interrupt handler, which is different from FIGS. 11 and 19. After that, Steps S116 to S122 are performed in the same manner as in FIG. 11.

Figure 20:
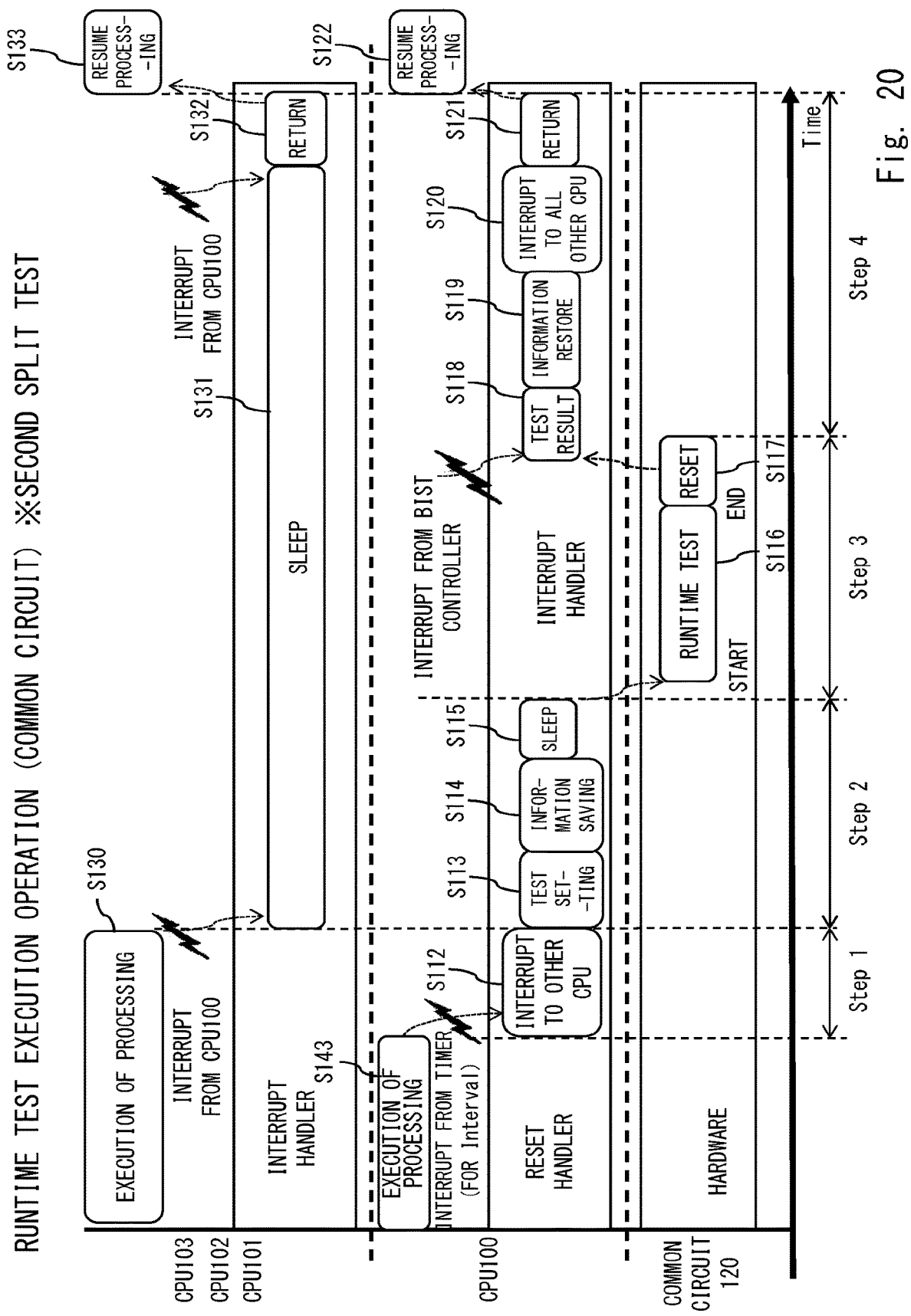
FIG. 20 is a timing chart showing an operation of the common circuit according to the fourth embodiment during execution of a second split test.

Note that, in the case of splitting a runtime test into three or more split tests, it is obvious that the operation during execution of the second to (N−1)th split test is the operation that performs Step S142 after Step S120 in FIG. 20, and the detailed description thereof is omitted.

Note that, although the embodiment in which the timer 25 is added and a split test is performed in the structure of the third embodiment is described as the fourth embodiment, the present invention is not limited thereto. For example, this structure may be applied to the first or second embodiment.

As described above, in the fourth embodiment, each time a scan test on each of a plurality of units obtained by splitting a plurality of test patterns used for a scan test of the whole arithmetic circuit (which corresponds to each of the CPUs 100 to 103) is performed as a split test, execution of the scan test on the arithmetic circuit is ended. Further, in the fourth embodiment, each time a scan test on each of a plurality of units obtained by splitting a plurality of test patterns used for a scan test of the whole common circuit 120 is performed as a split test, execution of the scan test on the common circuit 120 is ended. The semiconductor apparatus 4 includes the timer 25 that measures the time from the end of a split test of each of the arithmetic circuits and the common circuit 120, and notifies the timing to start the next split test of each of the arithmetic circuits and the common circuit 120 to the arithmetic circuit. In response to the notification from the timer 25, the arithmetic circuit instructs the start of a split test to the scan test circuit (which corresponds to the BIST controllers 11, 110 to 113 and 121).

According to the above, an arithmetic circuit can perform processing in accordance with an interrupt at the timing of ending execution of a split test that splits a scan test into a plurality of units, and it is thereby possible to improve the capability to respond to an interrupt by the arithmetic circuit. Therefore, it is possible to execute an application program (for example, a voice recognition processing program etc.) that is required to have an interrupt response capability can be executed in the CPUs 100 to 103, for example, by satisfying the request. Specifically, it is possible to execute a runtime test in a system that requires real time capabilities.

Fifth Embodiment

Figure 21:
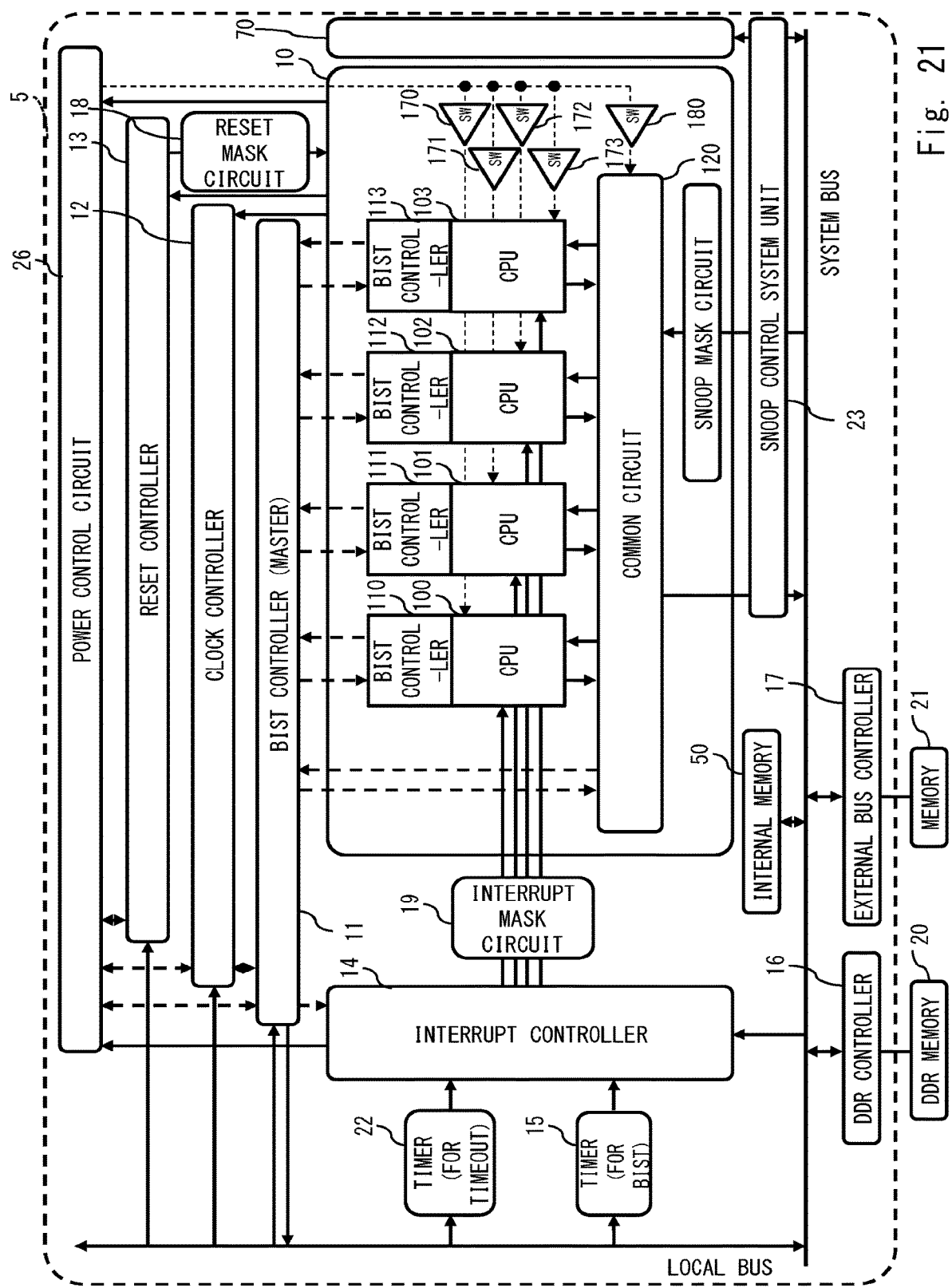
FIG. 21 is a block diagram showing a structure of a semiconductor apparatus according to a fifth embodiment.

A fifth embodiment is described hereinafter. In the description of the fifth embodiment below, the same matter as in the first to fourth embodiments described above is denoted by the same reference symbol or the like, and the description thereof is omitted as appropriate. As shown in FIG. 21, a semiconductor apparatus 5 according to the fifth embodiment further includes a power control circuit 26 and power switches 170 to 173 and 180 in comparison with the semiconductor apparatus 3 according to the third embodiment.

The power control circuit 26 is a circuit that controls the power of each of the CPUs 100 to 103 and the common circuit 120. The power control circuit 26 monitors a status signal that is output from the CPUs 100 to 103 and, when each of the CPUs 100 to 103 transitions to the sleep mode, turns off the power of each of the CPUs 100 to 103. Further, when all of the CPUs 100 to 103 transition to the sleep mode, the power control circuit 26 turns off the power of the CPUs 100 to 103 and the common circuit 120. This achieves power saving. Note that, when turning off the power of the common circuit 120, the power control circuit 26 leaves the power of the L2 cache memory 124 and the SCU tag RAM 126 in the common circuit 120 on, thereby maintaining the data.

The power switch 170 is connected with the CPU 100, the power switch 171 is connected with the CPU 101, the power switch 172 is connected with the CPU 102, the power switch 173 is connected with the CPU 103, and the power switch 180 is connected with the common circuit 120. The power control circuit 26 turns on and off the power of each of the CPUs 100 to 103 and the common circuit 120 by operating each of the power switches 170 to 173 and 180.

Further, in response to the input of an interrupt signal from the interrupt controller 14, the power control circuit 26 turns on the power of the circuit that has been powered off among the CPUs 100 to 103 and the common circuit 120, and requests the reset controller 13 to reset the circuit that is powered on.

The operation of the power control circuit 26 that causes the CPUs 100 to 103 and the common circuit 120 to transition to the power saving mode and return from the power saving mode is similar to the operation of the CPUs 100 to 103 and the common circuit 120 that transition to the mode of executing a runtime test and return from the mode after execution of a runtime test. Thus, in the fifth embodiment, the operation of the CPUs 100 to 103 and the common circuit 120 that transition to the mode of executing a runtime test and return from the mode after execution of a runtime test is implemented by using the function of the power control circuit 26.

To implement this operation, the power control circuit 26 according to the fifth embodiment is configured so that the setting to inhibit the operation of turning off the power of the CPUs 100 to 103 and the common circuit 120 when detecting the sleep mode of the CPUs 100 to 103 can be implemented from each of the CPUs 100 to 103.

When executing a runtime test of each of the CPUs 100 to 103, each of the CPUs 100 to 103 sets the power control circuit 26 to inhibit the operation of turning off the power at the timing of Step S101 or S102 in FIGS. 8 to 10, and sets the power control circuit 26 to cancel the inhibition of the operation of turning off the power at the timing of any of Steps S106 to S108 in FIGS. 8 to 10.

Further, when executing a runtime test of the common circuit 120, the CPU 100 sets the power control circuit 26 to inhibit the processing of turning off the power at the timing of any of Steps S112 to S114 in FIG. 11, and sets the power control circuit 26 to cancel the inhibition of the processing of turning off the power at the timing of any of Steps S118 to S120 in FIG. 11.

Thus, because the power of the CPUs 100 to 103 and the common circuit 120 is not turned off even after the CPUs 100 to 103 transition to the sleep mode, it is possible to execute a runtime test.

After execution of runtime tests of the CPUs 100 to 103 and the common circuit 120, the BIST controller 11 outputs an interrupt signal to the interrupt controller 14, rather than requesting reset to the reset controller 13. In response to the interrupt signal, the interrupt controller 14 outputs the interrupt signal to the power control circuit 26.

Because only the operation of turning off the power is inhibited for the power control circuit 26, when a scan test is executed after causing any of the CPUs 100 to 103 to transition to the sleep mode while the actual power state is on, the power control circuit 26 recognizes that the power state of the CPU is off. Therefore, in this case, the power control circuit 26 requests the reset controller 13 to reset the CPU on which the scan test is performed in response to the interrupt signal.

Because only the operation of turning off the power is inhibited for the power control circuit 26, when all of the CPUs 100 to 103 transition to the sleep mode while the actual power state is on, the power control circuit 26 recognizes that the power state of all of the CPUs 100 to 103 and the common circuit 120 is off. Therefore, in this case, the power control circuit 26 requests the reset controller 13 to reset all of the CPUs 100 to 103 and the common circuit 120 in response to the interrupt signal. Note that the reset of the CPUs 100 to 103 is inhibited by the reset mask circuit 18 as described earlier.

Thus, according to the fifth embodiment, it is possible to easily achieve the reset of a test target circuit, which has been handled by the BIST controller 11 in the first to fourth embodiments, by using the function of the power control circuit 26.

Note that, although the embodiment in which the power control circuit 26 is added in the structure of the third embodiment is described as the fifth embodiment, the present invention is not limited thereto. For example, this structure may be applied to any of the first, second and fourth embodiment.

As described above, in the fifth embodiment, the semiconductor apparatus 5 includes the power control circuit 26 that turns off the power of arithmetic circuits (CPUs 100 to 103) when the arithmetic circuits transition to the sleep mode, and turns on the power of the arithmetic circuits and resets the arithmetic circuits by the reset controller 13 when an interrupt is notified. When executing a scan test on the arithmetic circuit, the arithmetic circuit sets the power control circuit 26 so as to inhibit the power-off of the arithmetic circuit and then transitions to the sleep mode. The arithmetic circuit then notifies an interrupt to the power control circuit 26 after performing a scan test on the arithmetic circuit. It is thereby possible to achieve the transition to the mode of executing a scan test and the return from that mode in the arithmetic circuits by using the function of the power control circuit. It is thereby possible to reduce logic resign costs for implementing a runtime test.

Sixth Embodiment

Figure 22:
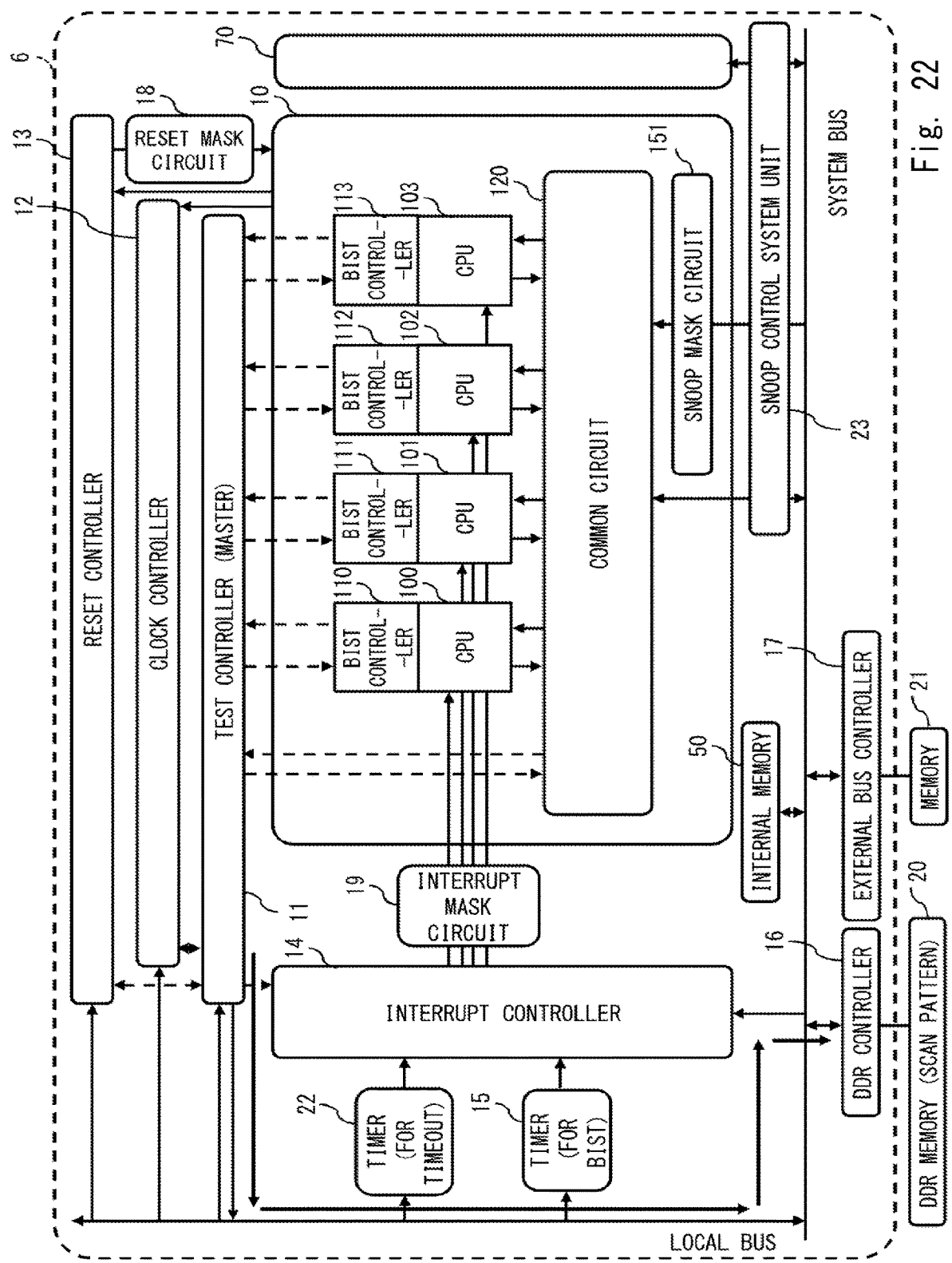
FIG. 22 is a block diagram showing a structure of a semiconductor apparatus according to a sixth embodiment.

A sixth embodiment is described hereinafter. In the description of the sixth embodiment below, the same matter as in the first to fifth embodiments described above is denoted by the same reference symbol or the like, and the description thereof is omitted as appropriate. As shown in FIG. 22, a semiconductor apparatus 6 according to the sixth embodiment is different from the semiconductor apparatus 3 according to the third embodiment in that it includes test controllers 60 and 160 to 163 in place of the BIST controllers 11 and 110 to 113.

The test controller 60 is different from the BIST controller 11 in that it acquires test patterns and expected values from the DDR memory 20 and supplies them to each of the test controllers 160 to 163. Further, each of the test controllers 160 to 163 is different from each of the BIST controllers 110 to 113 in that it does not generate test patterns and expected values and use the test patterns and expected values supplied from the test controller 60.

Specifically, in the sixth embodiment, test patterns and expected values are prestored in the DDR memory 20. The test controller 60 reads the test patterns and the expected values from the DDR memory 20 through the local bus and the system bus. Each of the test controllers 160 to 163 executes a scan test by using the test patterns and the expected values read by the test controller 60. Note that, at the startup of the semiconductor apparatus 6, any of the test controller 60 and the CPUs 100 to 103 may transfer test patterns and expected values in advance from the memory 21 connected to the external bus controller 17 to the DDR memory 20 or the internal memory 50, and the test controller 60 may acquire the test patterns and the expected values from the DDR memory 20 or the internal memory 50 at the execution of a runtime test. A nonvolatile memory such as a flash memory may be used instead of the memory 21.

In the case of executing a runtime test of each of the CPUs 100 to 103, each of the CPUs 100 to 103 sets, to the control register in the test controller 60, the addresses where the test patterns for the CPUs 100 to 103 are stored in the DDR memory 20. The test controller 60 acquires, in the DDR memory 20, the test patterns for the CPUs 100 to 103 from the addresses set in the control register.

Further, in the case of executing a runtime test of the common circuit 120, the CPU 100 sets, to the control register in the test controller 60, the address where the test pattern for the common circuit 120 is stored in the DDR memory 20. The test controller 60 acquires, in the DDR memory 20, the test pattern for the common circuit 120 from the address set in the control register.

Note that, although the embodiment in which the test controllers 60 and 160 to 163 are included in place of the BIST controllers 11 and 110 to 113, and test patterns and expected values are stored in the DDR memory 20 in the structure of the third embodiment is described as the sixth embodiment, the present invention is not limited thereto. For example, this structure may be applied to the first, second, fourth and fifth embodiments.

In the case where the above structure is applied to the fourth embodiment, each of the CPUs 100 to 103 may set, to the control register in the test controller 60, the amount of test patterns that scanned in by the split test (for example, the start address and the end address in the DDR memory 20) instead of the number of test patterns. Specifically, a runtime test for each of a plurality of units obtained by splitting a group of test patterns for each of the CPUs 100 to 103 stored in the DDR memory 20 is performed as a split test on each of the CPUs 100 to 103. Further, a runtime test for each of a plurality of units obtained by splitting a group of test patterns for each of the common circuit 120 stored in the DDR memory 20 is performed as a split test on the common circuit 120.

As described above, in the sixth embodiment, the scan test circuit (which corresponds to the test controllers 60 and 160 to 163) acquires test patterns that are stored in an external storage circuit (which corresponds to the DDR memory 20) placed outside the semiconductor apparatus 6 and scans the acquired test patterns into the processing circuit to thereby execute a scan test.

Because BIST uses randomly created test patterns, there is a problem that it is difficult to increase a failure detection rate. On the other hand, in the sixth embodiment, test patterns with a high failure detection rate can be created in advance and scanned into a test target processing circuit, and it is thereby possible to reduce a test time.

Seventh Embodiment

A seventh embodiment is described hereinafter. In the description of the seventh embodiment below, the same matter as in the first to sixth embodiments described above is denoted by the same reference symbol or the like, and the description thereof is omitted as appropriate.

Figure 23:
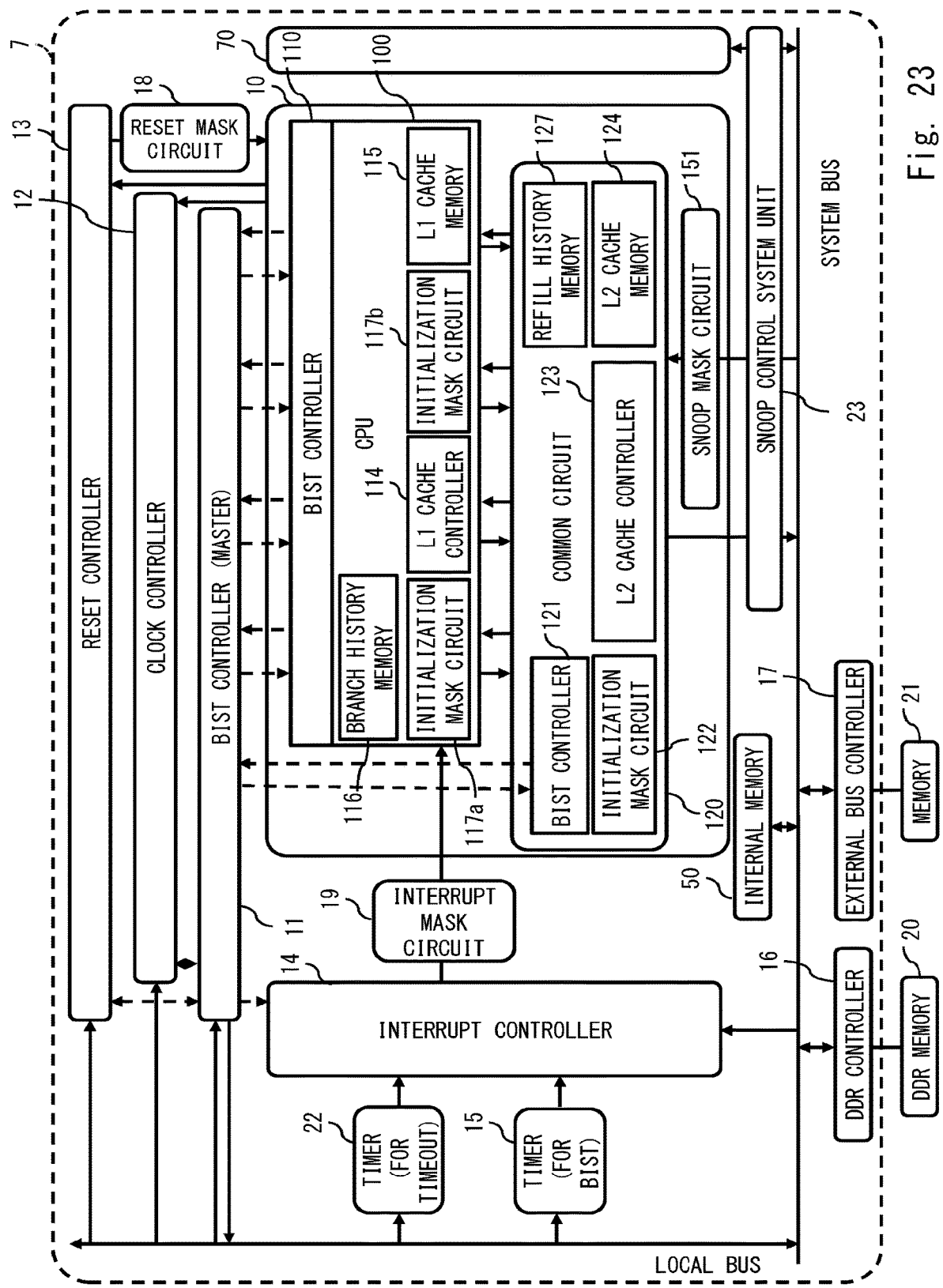
FIG. 23 is a block diagram showing a structure of a semiconductor apparatus according to a seventh embodiment.

As shown in FIG. 23, a semiconductor apparatus 7 according to the seventh embodiment is different from the semiconductor apparatus 3 according to the third embodiment in that the CPU cluster 10 includes only one CPU 100. Further, the CPU 100 according to the seventh embodiment is different from the CPU 100 according to the third embodiment in that it includes initialization mask circuits 117a and 117b. Further, the common circuit 120 according to the seventh embodiment is different from the common circuit 120 according to the third embodiment in that it does not include the snoop control unit 125 and the SCU tag RAM 126. This is because the CPU cluster 10 does not include a plurality of CPUs, and therefore the control for ensuring cache coherency of the L1 cache memory 115 between the CPUs is not needed.

The initialization mask circuit 117a is a circuit that inhibits the L1 cache controller 114 from writing an initial value to the L1 cache memory 115 to initialize the L1 cache memory 115. To be more specific, the initialization mask circuit 117a outputs an instruction signal that instructs the inhibition of the initialization to the L1 cache controller 114. When the instruction signal is input at the reset of the CPU 100, the L1 cache controller 114 changes its operation so as not to perform writing of data for initialization to the L1 cache memory 115, which is performed when cancelling the reset of the CPU 100. The initialization mask circuit 117a enables its operation so as to inhibit the initialization of the L1 cache memory 115 at the reset after execution of a runtime test of the CPU 100.

The initialization mask circuit 117b is a circuit that inhibits the L1 cache controller 114 from writing data to the L1 cache memory 115. To be more specific, the initialization mask circuit 117b masks (blocks off) a signal that is output for writing of data from the L1 cache controller 114 to the L1 cache memory 115. The initialization mask circuit 117b enables its operation so as to inhibit the writing of data to the L1 cache memory 115 at the time of execution of a runtime test of the CPU 100.

Referring back to FIG. 5, at the timing of Step S4, the CPU 100 sets each of the initialization mask circuits 117a and 117b so as to inhibit the initialization and writing to the L1 cache memory 115, respectively. Further, at the timing of Step S14, the CPU 100 sets each of the initialization mask circuits 117a and 117b or the clock controller 12 so as to cancel the inhibition of the initialization and writing to the L1 cache memory 115, respectively. This setting is made by setting a value indicating whether or not to inhibit the initialization or writing to a control register (not shown) included in the each of the initialization mask circuits 117a and 117b.

Because the content of the L1 cache memory 115 is thereby maintained, it is possible to prevent cache miss of the L1 cache memory 115 when the CPU 100 resumes the processing and thereby prevent the degradation of performance. In this manner, in the case of a single core, differently from a multi-core, even when the content of the L1 cache memory 115 is maintained without being flashed, the problem that the other CPU cannot access the data by control of the snoop control unit 125 does not occur.

Note that, although the embodiment in which only one CPU 100 is included, and the CPU 100 further includes the initialization mask circuits 117a and 117b, and the common circuit 120 does not include the snoop control unit 125 and the SCU tag RAM 126 in the structure of the third embodiment is described as the seventh embodiment, the present invention is not limited thereto. For example, this structure may be applied to the any of the first, second, and fourth to sixth embodiments.

As described above, in the seventh embodiment, the CPU 100 includes the L1 cache memory 115 and the L1 cache controller 114. Then, during execution of a scan test on the CPU 100, the writing of data from the L1 cache controller 114 to the L1 cache memory 115 is inhibited. It is thereby possible to prevent cache miss of the L1 cache memory 115 when the CPU 100 resumes processing and thereby prevent the degradation of performance.

Eighth Embodiment

Figure 24:
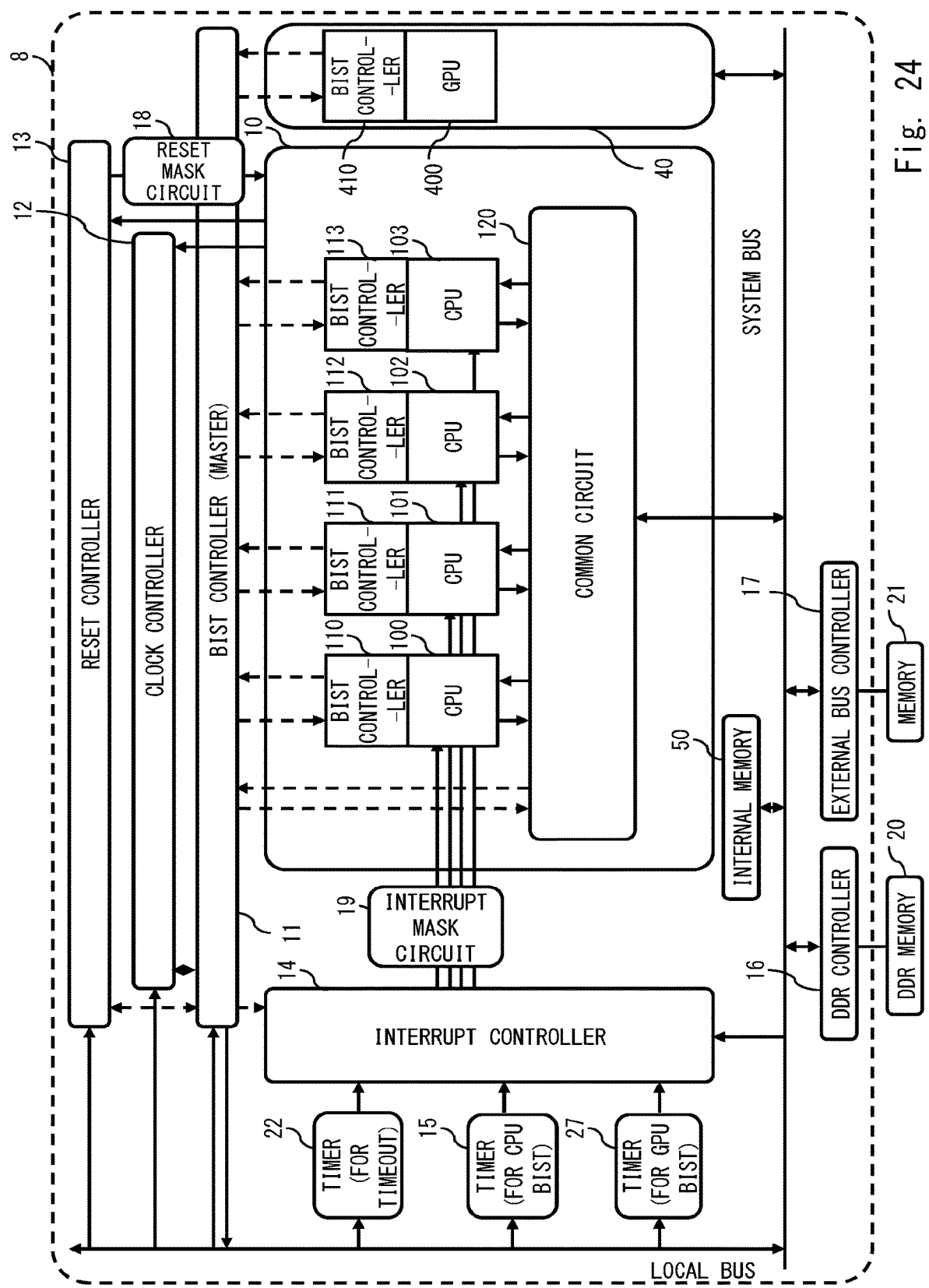
FIG. 24 is a block diagram showing a structure of a semiconductor apparatus according to an eighth embodiment.

An eighth embodiment is described hereinafter. In the description of the eighth embodiment below, the same matter as in the first to seventh embodiments described above is denoted by the same reference symbol or the like, and the description thereof is omitted as appropriate. As shown in FIG. 24, a semiconductor apparatus 8 according to the eighth embodiment further has a timer 27 and a GPU (Graphics Processing Unit) cluster 40 in comparison with the semiconductor apparatus 2 according to the second embodiment. The GPU cluster 40 includes a GPU 400 and a BIST controller 410.

The timer 27 is a circuit that measures the elapsed time and notifies, by an interrupt, the CPU cluster 10 of the timing to execute a runtime test of the GPU cluster 40. To be more specific, the timer 27 outputs an interrupt signal to the interrupt controller 14 each time the timing to execute a runtime test is reached. In response to the interrupt signal, the interrupt controller 14 outputs the interrupt signal to the CPU that is set in advance as the circuit to which an interrupt from the timer 27 is to be notified.

Note that the CPU cluster 10 sets the timer 27 so as to notify the execution timing of a runtime test at each DTI after the startup of the semiconductor apparatus 8. The CPU that sets the timer 27 may be arbitrarily determined in advance, for example.

The GPU 400 is a circuit that performs a part of the processing performed by the CPUs 100 to 103 of the CPU cluster 10 in an auxiliary manner. Specifically, the GPU 400 is a circuit that is managed by any of the CPUs 100 to 103 and does not operate unless controlled by any of the CPUs 100 to 103.

The BIST controller 410 is a circuit that executes a runtime test of the GPU 400 in accordance with control by the BIST controller 11. The BIST controller 410 serves as a slave, just like the BIST controllers 110 to 113.

Figure 25:
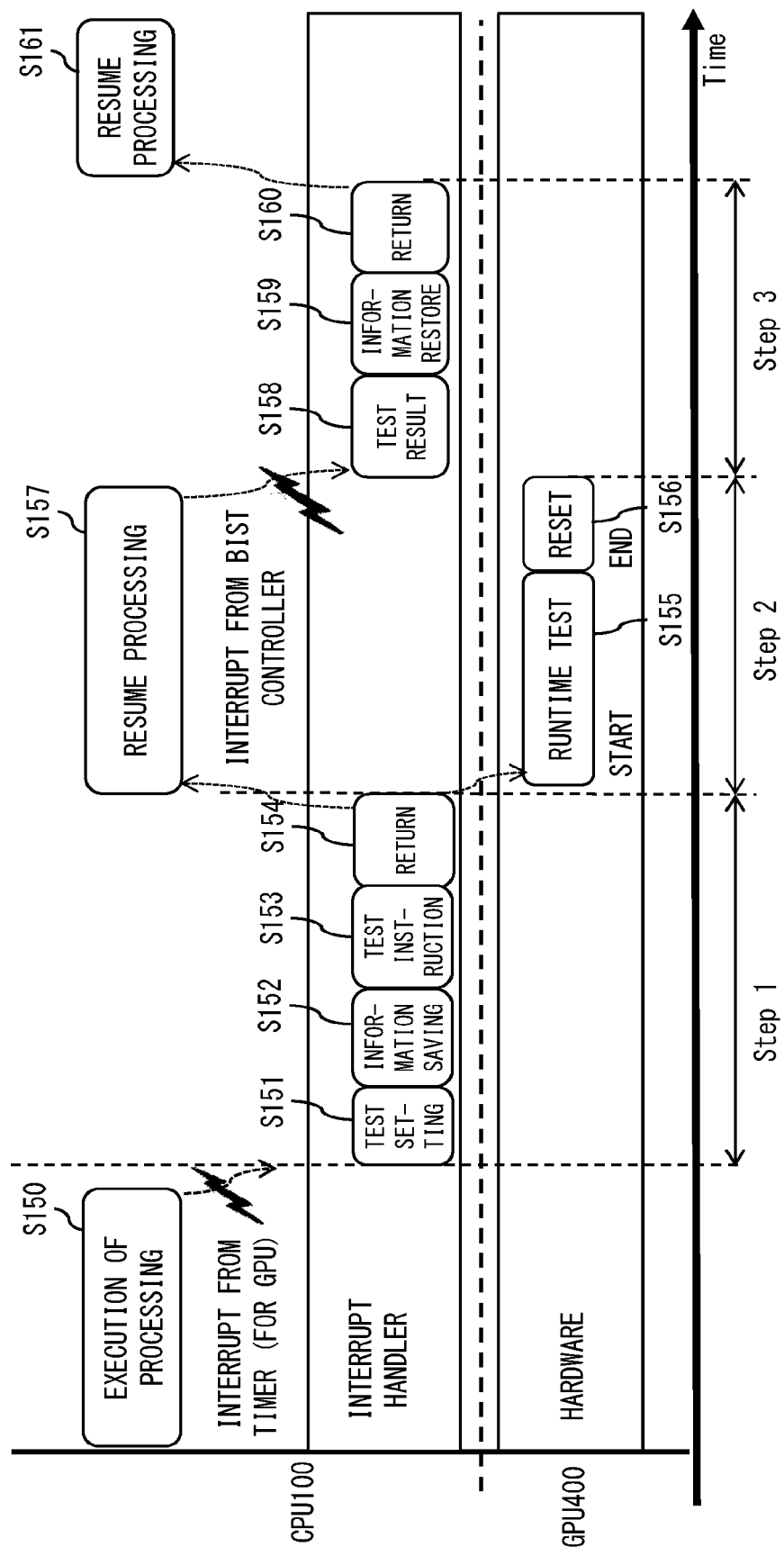
FIG. 25 is a timing chart showing an operation of a GPU according to the eighth embodiment during execution of a runtime test.

The operation of the GPU 400 according to the eighth embodiment during execution of a runtime test is described hereinafter with reference to FIG. 25. Although the procedure where the CPU 100 controls the execution of a runtime test of the GPU 400 is described in the eighth embodiment, any of the CPUs 100 to 103, instead of the CPU 100, may control the execution of a runtime test of the GPU 400.

The timer 27 notifies an interrupt to the CPU 100 through the interrupt controller 14 at the time when DTI has elapsed from the last time when the interrupt signal has been output. Specifically, in this example, the CPU 100 is set in advance as the circuit to which an interrupt from the timer 27 is to be notified.

When an interrupt caused by the timer 27 is notified during execution of its processing (S150), the CPU 100 executes an interrupt handler in accordance with the interrupt of the timer 27. In the interrupt handler, the CPU 100 performs setting for executing a runtime test (S151). To be more specific, the CPU 100 sets, to the control register in the BIST controller 11, the GPU 400 as a test target. Further, the CPU 100 saves the information of the GPU 400 in the interrupt handler (S152). To be more specific, the CPU 100 stops the operation of the GPU 400 and saves the data stored in the register of the GPU 400 into the DDR memory 20, the memory 21 and the internal memory 50. Then, the CPU 100 instructs the start of a runtime test to the BIST controller (S153) and ends the interrupt handler (S154). Because the GPU 400 cannot transition to the sleep mode, the start of a runtime test is explicitly instructed by the CPU 100 in this manner.

In response to the instruction from the CPU 100, the BIST controller 11 instructs the BIST controller 410 to start a runtime test of the CPU 400. In response to the instruction from the BIST controller 11, the BIST controller 410 executes the runtime test of the CPU 400 (S155).

The BIST controller 410 notifies the BIST controller 11 of the end of execution of the runtime test of the GPU 400. In response to the notification from the BIST controller 410, the BIST controller 11 resets the GPU 400 through the reset controller 13 (S156). Further, the BIST controller 11 notifies an interrupt to the CPU 100 through the interrupt controller 14. When an interrupt caused by the BIST controller 11 is notified during execution of its processing (S157), the CPU 100 executes an interrupt handler in accordance with the interrupt from the BIST controller 11. In the interrupt handler, the CPU 100 performs the checking of a runtime test result (S158) and the restoration of information of the GPU 400 (S159). To be more specific, the CPU 100 restores the data that have been saved into the DDR memory 20, the memory 21 and the internal memory 50 to the register of the GPU 400. Note that the checking of a runtime result is the same as in the case of execution of a runtime test on the CPUs 100 to 103 and the common circuit 120 and thus not redundantly described. The CPU 100 then ends the interrupt handler (S160) and resumes the execution of the program (S161).

Note that, although the embodiment in which the timer 27 and the GPU cluster 40 (the GPU 400 and the BIST controller 410) are added to the structure of the second embodiment is described as the eighth embodiment, the present invention is not limited thereto. For example, this structure may be applied to the any of the first and third to seventh embodiments. The GPU cluster 40 may be a hardware accelerator such as a cryptographic circuit or an image recognition circuit.

As described above, in the eighth embodiment, the semiconductor apparatus 8 includes the timer 27 that notifies the CPU 100 of the timing to execute a scan test on the GPU 400. In response to the notification from the timer 27, the CPU 100 instructs the execution of the scan test on the GPU 400. In response to the instruction from the CPU 100, the scan test circuit (which corresponds to the BIST controllers 11 and 410) executes the scan test on the GPU 400. It is difficult for a large-scale module like the GPU 400 to check the operation by dual lock-step due to the constraints on the area. On the other hand, according to the eighth embodiment, it is possible to check the normal operation of the large-scale GPU 400 at regular intervals by a runtime test under control of the CPU 100.

Ninth Embodiment

Figure 26:
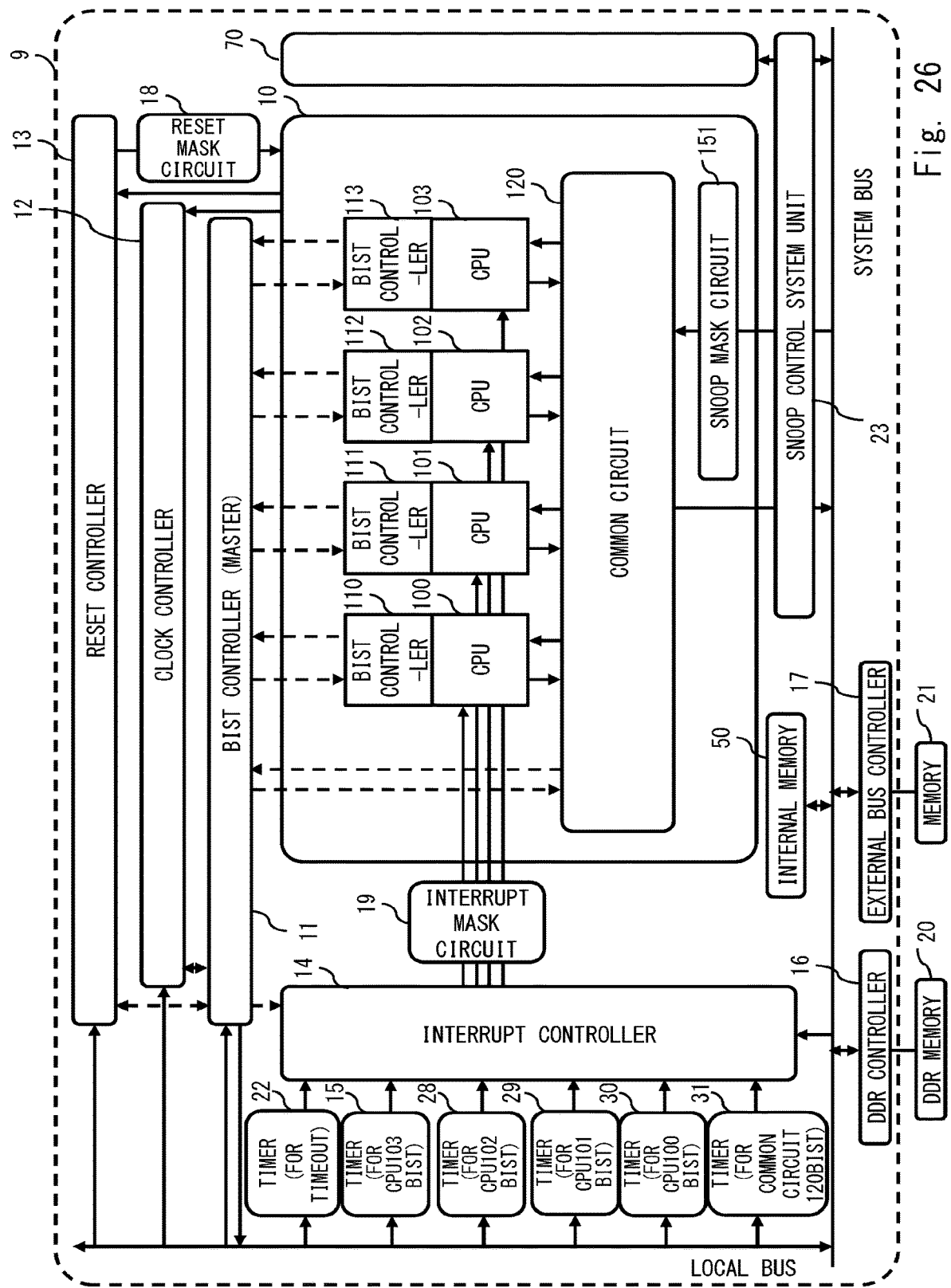
FIG. 26 is a block diagram showing a structure of a semiconductor apparatus according to a ninth embodiment.

A ninth embodiment is described hereinafter. In the description of the ninth embodiment below, the same matter as in the first to seventh embodiments described above is denoted by the same reference symbol or the like, and the description thereof is omitted as appropriate. As shown in FIG. 26, a semiconductor apparatus 9 according to the ninth embodiment further has timers 28 to 31 in comparison with the semiconductor apparatus 3 according to the third embodiment.

The above-described timer 15 is a circuit that measures the elapsed time and notifies the timing to execute a runtime test to the CPU 103 by an interrupt. On the other hand, each of the timers 28 to 31 is a circuit that measures the elapsed time and notifies the timing to execute a runtime test to each of the CPUs 102 to 100 and the common circuit 120 by an interrupt in the same manner as the timer 15. Note that, the CPU cluster 10 sets the timers 28 to 31 so as to notify the execution timing of a runtime test at each DTI after the startup of the semiconductor apparatus 9, just like the timer 15. The CPU that sets the timers 15 and 28 to 21 may be arbitrarily determined in advance, for example.

Specifically, at the interrupt controller 14, the CPU 102 is preset as a circuit to which an interrupt signal corresponding to the interrupt from the timer 28 is to be notified, the CPU 101 is preset as a circuit to which an interrupt signal corresponding to the interrupt from the timer 29 is to be notified, the CPU 100 is preset as a circuit to which an interrupt signal corresponding to the interrupt from the timer 30 is to be notified, and the CPU 100 is preset as a circuit to which an interrupt signal corresponding to the interrupt from the timer 31 is to be notified.

The CPU 103 performs control to execute a runtime test of the CPU 103 in response to an interrupt from the timer 15, which is the same in the first to eighth embodiments described above. The CPU 102 performs control to execute a runtime test of the CPU 102 in response not to a CPU interrupt from the CPU 103 but to an interrupt from the timer 28, which is different from in the first to eighth embodiments. The CPU 101 performs control to execute a runtime test of the CPU 101 in response not to a CPU interrupt from the CPU 102 but to an interrupt from the timer 29, which is different from in the first to eighth embodiments. The CPU 100 performs control to execute a runtime test of the CPU 100 in response not to a CPU interrupt from the CPU 101 but to an interrupt from the timer 30, which is different from in the first to eighth embodiments. Further, the CPU 100 performs control to execute a runtime test of the common circuit 120 not after execution of a runtime test of the CPU 100 but in response to an interrupt from the timer 31, which is different from in the first to eighth embodiments. Thus, in the ninth embodiment, each of the CPUs 103 to 101 does not notify a CPU interrupt to each of the CPUs 102 to 100.

As described above, a runtime test may be executed by preparing dedicated timers 15 and 28 to 31 for each of the CPUs 100 to 103 and the common circuit 120.

Other Embodiment (Substitute Runtime Test for Power on Self Test)

In the CPUs 100 to 103, a power-on self-test (POST) is generally performed in order to detect a latent fault just after power-on; however, the above-described runtime test may be performed in place of the POST.

A time limit is generally imposed also on a self-test time just after power-on due to the constraints of a start-up time. Thus, when making a diagnosis on a large-scale circuit with BIST, there is a possibility that it does not end within the time limit. However, in a circuit that is not needed to be used just after power-on, POST just after power-on may be substituted by the above-described runtime test.

Thus, for at least one CPU among the CPUs 100 to 103 that is determined in advance as a circuit for which the restriction on a start-up time is not needed, the above-described runtime test, in place of POST, may be executed. For example, a set value indicating whether it is a CPU where POST is to be performed may be prestored for each of the CPUs 100 to 103 in the control register in the BIST controller 11. Then, based on the set value of the control register, for the CPU where POST is not performed, the BIST controller 11 may execute a runtime test after that CPU is booted.

For example, the BIST controller 11 may notify an interrupt to a CPU where the BIST controller 11 does not perform POST through the interrupt controller 14, and the CPU may start the control to execute a runtime test of itself in response to the interrupt. Note that, the BIST controller 11 may recognize whether or not a CPU has been booted as a result that the CPU transmits a status signal indicating booting to the BIST controller 11, for example. Although the CPUs 100 to 103 are taken as an example in the above description, the same idea is applicable to the GPU 400 as a matter of course.

(Notification of Timing to Start/Resume Runtime Test without Timer)

Further, although the timers 15 and 27 to 31 notify the timing to start a runtime test, and the timer 25 notifies the timing to resume a runtime test in the above-described embodiments, the present invention is not limited thereto. For example, the BIST controller 11 may notify the timing to start or resume a runtime test. For example, a register that sets the timing to start or resume a runtime test is placed in the BIST controller 11. The BIST controller 11 notifies the timing to start or resume a runtime test to each of the CPUs 100 to 103, the common circuit 120 and the GPU 400 at the start or resume timing which is set to the register.

Note that, the technique that the BIST controller 11 recognizes the start or resume timing may use a technique to recognize the timing by countdown on the basis of a clock signal like a timer, or use a technique to recognize the timing by referring to an output value (value indicating time) of a timer (wall clock) placed outside the semiconductor apparatus.

(Dualization of System Bus and Bus Controller)

Figure 27:
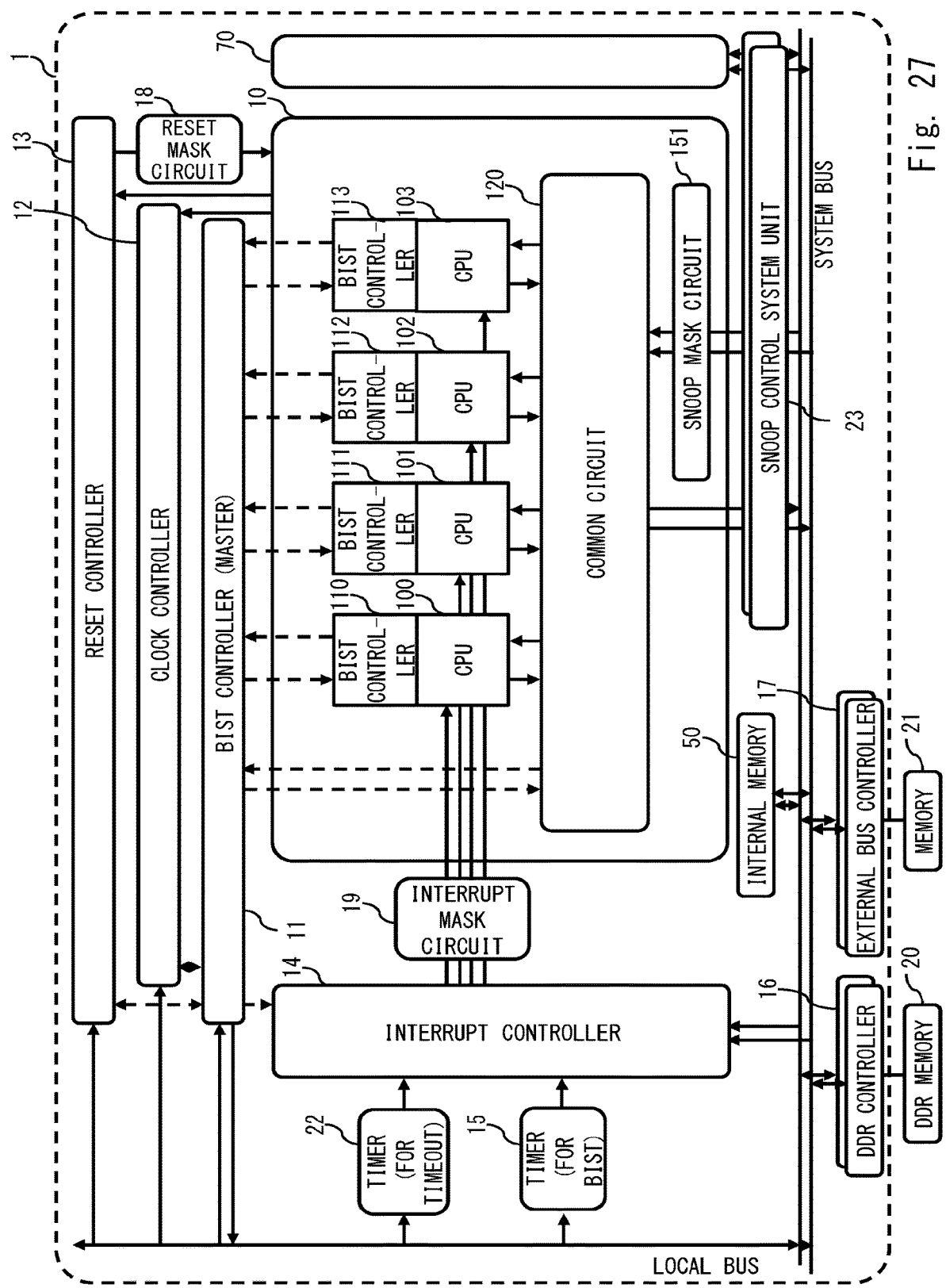
FIG. 27 is a block diagram showing a structure of a semiconductor apparatus according to another embodiment.

A test target of a runtime test is not limited to the above examples, and the target may be a circuit that includes an L3 cache memory and its cache controller, or the system bus, the snoop control system unit 23, and the bus controller (the DDR controller 16 and the external bus controller 17). Note that, however, when the system bus, the snoop control system unit 23, and the bus controller serve as a test target, they can hinder the transaction in the system, causing the degradation of system performance. Thus, in this case, the system bus, the snoop control system unit 23 and the bus controller may be dualized as shown in FIG. 27, and the system bus, the snoop control system unit 23 and the bus controller that are not executing a runtime test may be used to thereby reduce the degradation of system performance.

Although the case where all of the system bus, the snoop control system unit 23 and the bus controller are dualized is described as an example, the present invention is not limited thereto. Any one or two of the system bus, the snoop control system unit 23 and the bus controller may be dualized. Further, for the bus controller also, any one of the DDR controller 16 and the external bus controller 17 may be dualized. Furthermore, in the case where any circuit is dualized, if the dual circuits are made to operate at all times, and a comparison circuit that constantly checks the matching of the corresponding output signals are placed separately, there is no need to set the circuit as a test target of a runtime test.

Although embodiments of the present invention are described specifically in the foregoing, the present invention is not restricted to the above-described embodiments, and various changes and modifications may be made without departing from the scope of the invention.

Although the case where an arithmetic element unit (arithmetic circuit) where a runtime test is executed is a CPU is described in the above embodiments, the present invention is not limited thereto. For example, a core in a multi-threaded processor or a many-core processor may be used as an arithmetic element unit (arithmetic circuit) where a runtime test is executed.

Places where the reset mask circuit 18 and the interrupt mask circuit 19 are mounted are not limited to the example described in the above embodiments. For example, the reset mask circuit 18 may be included in the reset controller 13 or the CPU cluster 10. Further, for example, the interrupt mask circuit 19 may be placed in the clock controller 12, the interrupt controller 14, or the CPU cluster 10.

Although the data in a register of a test target circuit is saved before a runtime test and restored after the runtime test in the above-described embodiments, the present invention is not limited thereto. For example, the register may be dualized and the values of the dual registers may be compared to detect a fault of the register, and the register is not used as a scan test target, so that the data of the register can be maintained before and after the runtime test. Further, the register may be dualized, and one of the dual registers may be used as a register for saving, not as a scan test target. This is effective when it takes a long time to save the data of the register into the memory 21.

In the above-described embodiments, each of the CPUs 100 to 103 checks whether it is booted by the reset after execution of a runtime test by referring to the control register in the BIST controller 11 and changes the operation in the reset handler; however, the present invention is not limited thereto. For example, each of the CPUs 100 to 103 may rewrite a reset vector with a dedicated reset vector for a runtime test before execution of a runtime test and thereby execute a reset handler for a runtime test that performs processing such as comparison between the above-described runtime test execution result with an expected value. Then, processing to setting the reset vector back to its original state is performed finally in the reset handler for a runtime test, so that a normal reset handler is performed after the normal reset.

Although the initialization of the L2 cache memory 124 and the SCU tag RAM 126 at the reset of the common circuit 120 is performed by the initialization mask circuit 122*a* in the above-described embodiments, the present invention is not limited thereto. For example, the initialization of the L2 cache memory 124 and the SCU tag RAM 126 may be inhibited by eliminating the initialization mask circuit 122*a* from the common circuit 120 and enabling the masking by the initialization mask circuit 122*b* and 122*c* at the reset of the common circuit 120 as well.

In the above-described embodiments, before executing a runtime test of each of the CPUs 100 to 103, each of the CPUs 100 to 103 transitions to the sleep mode. However, the present invention is not limited thereto as long as each of the CPUs 100 to 103 transitions to the mode where the normal operation is stopped. For example, each of the CPUs 100 to 103 may transition to the mode where an infinite loop is performed.

In the case where any of the CPUs 100 to 103 is not in the sloop mode for executing a runtime test as described above but in the sleep mode in accordance with normal processing, the runtime test on that CPU may be skipped. For example, when a CPU which is the next runtime test target is in the sleep mode, each of the CPUs 100 to 103 may skip that CPU and notify a CPU interrupt to a CPU which is the second next runtime test target. Further, when the CPU 103 transitions to the sleep mode, the interrupt controller 14 may be set to change a circuit to which an interrupt from the timer 15 is to be notified to the CPU 102 which is the second next runtime test target.

Further, although the data of a register in a runtime test target circuit is saved in the DDR memory 20, the memory 21 and the internal memory 50 in the above-described embodiments, it is not necessary to use all of them. For example, data of the register may be saved into any one or two of the DDR memory 20, the memory 21 and the internal memory 50.

The first to ninth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor apparatus comprising:
   an arithmetic circuit;
   a common circuit comprising a storage circuit configured to hold data used for performing processing by the arithmetic circuit, a controller configured to control access to the storage circuit, and an inhibit circuit;
   a reset controller configured to reset the common circuit; and
   a scan test circuit configured to execute a scan test on the common circuit when the arithmetic circuit does not perform the processing;
   wherein the inhibit circuit inhibits the controller from writing of data to the storage circuit for initialization of data held in the storage circuit when the reset controller resets the common circuit after execution of the scan test on the common circuit.

2. The semiconductor apparatus according to claim 1, wherein the arithmetic circuit continues to perform the processing after the end of the scan test on the common circuit by using the data held in the storage circuit.

3. The semiconductor apparatus according to claim 2, inhibit circuit further masks a reset signal to the arithmetic circuit when the reset controller resets the common circuit after execution of the scan test on the common circuit.

4. The semiconductor apparatus according to claim 3, further comprising a BIST (Built In Self Test) controller including the scan test circuit, wherein the BIST controller is configured to execute a runtime test on the common circuit, the runtime test including the scan test on a logic of the common circuit and an MBIST (Memory BIST) on the storage circuit.

5. The semiconductor apparatus according to claim 4, wherein the storage circuit comprises a first storage circuit and a second storage circuit,
   wherein the first storage circuit has an ECC circuit, and
   wherein the GIST controller is configured to execute MBIST on the second storage circuit.

6. The semiconductor apparatus according to claim 5, wherein the arithmetic circuit includes a first cache memory,
   wherein the first storage circuit includes a second cache memory that is requested to be read by the arithmetic circuit when data which the arithmetic circuit is to read is not stored in the first cache memory,
   wherein the arithmetic circuit saves the data stored in the second storage circuit to a memory before the runtime test on the common circuit,
   wherein the arithmetic circuit restores the data saved in the memory to the second storage circuit after the scan test on the common circuit.

7. The semiconductor apparatus according to claim 4, wherein the arithmetic circuit suspends the processing by transitioning to sleep mode that wakes up in response to a first interrupt,
   wherein the semiconductor apparatus further includes:
      an interrupt controller that receives a second interrupt from a circuit and a third interrupt from the BIST controller, and notifies the first interrupt to the arithmetic circuit based on the second interrupt and the third interrupt; and
      an interrupt mask circuit that blocks off the first interrupt from the interrupt controller to the arithmetic circuit when the interrupt controller receives the second interrupt, and
   wherein the arithmetic circuit notifies the interrupt mask circuit to block off the first interrupt before transitioning to the sleep mode for executing the runtime test on the common circuit.

8. The semiconductor apparatus according to claim 1, further comprising a plurality of arithmetic circuits that includes the arithmetic circuit,
   wherein the common circuit is used in common by the plurality of arithmetic circuits,
   wherein the inhibit circuit masks reset signals to the plurality of arithmetic circuits when the reset controller resets the common circuit after execution of the scan test on the common circuit.

9. The semiconductor apparatus according to claim 8, further including:
   a plurality of first wrapper circuits that correspond to each of the plurality of arithmetic circuits and, when the scan test on the arithmetic circuit is executed, block off signals input to the arithmetic circuits and signals output from the arithmetic circuits; and
   a second wrapper circuit that, when the scan test on the common circuit is executed, blocks off a signal input to the common circuit and a signal output from the common circuit.

10. A semiconductor apparatus comprising:
    a storage circuit;
    a processing circuit that performs processing using data stored in the storage circuit and writes data into the storage circuit as the processing is performed;
    a scan test circuit that executes a scan test on the processing circuit;
    an inhibit circuit; and
    a reset controller that resets the processing circuit after execution of the scan test on the processing circuit,
    wherein the processing circuit performs initialization of data in the storage circuit when the processing circuit is reset,
    wherein the inhibit circuit is configured to inhibit the processing circuit from performing initialization of data in the storage circuit when the processing circuit is reset after execution of the scan test.

11. The semiconductor apparatus according to claim 10, wherein the processing circuit is configured to continue its processing after the end of the scan test by using the data in the storage circuit.

12. The semiconductor apparatus according to claim 10, wherein the inhibit circuit further inhibits writing of data from the processing circuit to the storage circuit during execution of the scan test on the processing circuit.

13. The semiconductor apparatus according to claim 10, wherein the scan test circuit executes the scan test on the processing circuit when the processing circuit does not perform processing.

14. The semiconductor apparatus according to claim 12, wherein the inhibit circuit is further configured to block off a signal for data writing that is output from the processing circuit to the storage circuit for initialization of data in the storage circuit or output an instruction signal to the processing circuit to inhibit writing of data from the processing circuit to the storage circuit for initialization of data in the storage circuit when the processing circuit is reset after execution of the scan test, thereby maintaining content of the storage circuit after the end of the scan test.

15. The semiconductor apparatus according to claim 14, wherein the storage circuit includes a cache memory, wherein the processing circuit includes:
   an arithmetic circuit that performs the processing; and
   a common circuit including a cache controller that controls reading of data to be used by the arithmetic circuit from the cache memory and writing of data to the cache memory in accordance with processing of the processing circuit, and
wherein the inhibit circuit inhibits the cache controller from writing data to the cache memory when a scan test on the common circuit is executed.

16. The semiconductor apparatus according to claim 10, wherein the processing circuit includes:
   a plurality of arithmetic circuits that perform the processing; and
   a common circuit that is shared by the plurality of arithmetic circuits,
each of the plurality of arithmetic circuits suspends the processing by transitioning to sleep mode, and
wherein the semiconductor apparatus further includes:
   the reset controller that outputs a reset signal for resetting a circuit to each of the plurality of arithmetic circuits and the common circuit after execution of the scan test on the common circuit; and
   a reset mask circuit that blocks off a reset signal output to the plurality of arithmetic circuits among reset signals respectively output to the plurality of arithmetic circuits and the common circuit after execution of the scan test on the common circuit.

17. The semiconductor apparatus according to claim 10, wherein the processing circuit includes a plurality of arithmetic circuits that perform the processing,
wherein the scan test circuit executes, in response to an instruction from one of the plurality of arithmetic circuits, a scan test on the arithmetic circuit, and
wherein one of the plurality of arithmetic circuits instructs execution of a scan test to the scan test circuit in response to an interrupt from another arithmetic circuit, and notifies an interrupt to another arithmetic circuit after execution of the scan test in response to the instruction.

18. The semiconductor apparatus according to claim 10, wherein the processing circuit includes:
   a plurality of arithmetic circuits that perform the processing; and
   a common circuit that is shared by the plurality of arithmetic circuits,
wherein the scan test circuit executes a scan test of the common circuit in response to an instruction for a scan test from the arithmetic circuit,
wherein one of the plurality of arithmetic circuits notifies an interrupt to each of the other arithmetic circuits, instructs execution of a scan test to the scan test circuit, and then suspends the processing by transitioning to the sleep mode, and
wherein each of the other arithmetic circuits suspends the processing by transitioning to the sleep mode in response to an interrupt from one of the plurality of arithmetic circuits.

19. The semiconductor apparatus according to claim 10, wherein the processing circuit includes a CPU that performs the processing,
wherein the semiconductor apparatus includes:
   a hardware accelerator that executes processing of the CPU in an auxiliary manner; and
   a timer that measures an elapsed time and notifies the CPU of timing to execute a scan test on the hardware accelerator,
the CPU instructs execution of the scan test on the hardware accelerator in response to the notification from the timer, and
the scan test circuit executes the scan test on the hardware accelerator in response to the instruction from the CPU.

20. A diagnostic test method comprising:
performing processing using data stored in a storage circuit and, when a processing circuit that writes data into the storage circuit as the processing is performed does rot perform processing, executing a scan test on the processing circuit;
resetting the processing circuit after execution of the scan test on the processing circuit; and
inhibiting the processing circuit from performing initialization of data in the storage circuit when the processing circuit is reset after execution of the scan test,
wherein the performing step comprises initialization of data in the storage circuit when the processing circuit is reset,
the method further comprising, when the processing circuit is reset after execution of the scan test, inhibiting the processing circuit from performing initialization of data in the storage circuit, thereby maintaining content of the storage circuit after the end of the scan test.

* * * * *